(12) United States Patent
Bodkhe et al.

(10) Patent No.: US 11,466,169 B2
(45) Date of Patent: Oct. 11, 2022

(54) PIEZOELECTRIC COMPOSITE, INK AND INK CARTRIDGE FOR 3D PRINTING, BIFUNCTIONAL MATERIAL COMPRISING THE PIEZOELECTRIC COMPOSITE, MANUFACTURE AND USES THEREOF

(71) Applicant: POLYVALOR, LIMITED PARTNERSHIP, Montreal (CA)

(72) Inventors: Sampada Bodkhe, Montreal (CA); Daniel Therriault, St-Laurent (CA); Frédérick Gosselin, St-Lambert (CA); Tao Rui, Montreal (CA)

(73) Assignee: POLYVALOR, LIMITED PARTNERSHIP

( * ) Notice: Subject to any disclaimer, the term of this patent is extended or adjusted under 35 U.S.C. 154(b) by 566 days.

(21) Appl. No.: 16/346,608

(22) PCT Filed: Nov. 10, 2017

(86) PCT No.: PCT/CA2017/051343
§ 371 (c)(1),
(2) Date: May 1, 2019

(87) PCT Pub. No.: WO2018/085936
PCT Pub. Date: May 17, 2018

(65) Prior Publication Data
US 2019/0284423 A1    Sep. 19, 2019

Related U.S. Application Data

(60) Provisional application No. 62/420,176, filed on Nov. 10, 2016.

(51) Int. Cl.
*C09D 11/52* (2014.01)
*B33Y 10/00* (2015.01)
(Continued)

(52) U.S. Cl.
CPC ............ *C09D 11/52* (2013.01); *B29C 64/106* (2017.08); *B29C 64/118* (2017.08); *B33Y 10/00* (2014.12);
(Continued)

(58) Field of Classification Search
CPC ..... C09D 11/52; C09D 11/033; C09D 11/037; C09D 11/106; B29C 64/118; B33Y 10/00;
(Continued)

(56) References Cited

U.S. PATENT DOCUMENTS 5,997,795 A * 12/1999 Danforth ................. C04B 38/00
                                                            419/36
2016/0016369 A1    1/2016 Tarbutton et al.
(Continued)

OTHER PUBLICATIONS

Bodkhe, S. et al., "One-Step Solvent Evaporation-Assisted 3D Printing of Piezoelectric PVDF Nanocomposite Structures" ACS Applied Materials and Interfaces, May 29, 2017, 9, 20833-20842.
(Continued)

*Primary Examiner* — Michael M. Robinson
(74) *Attorney, Agent, or Firm* — Lavery, De Billy, LLP; Isabelle Pelletier

(57) ABSTRACT

There is provided a piezoelectric composite comprising a piezoelectric polymer and particles of a filler dispersed in the polymer, wherein the filler is in micro or nanoparticle form and is present in a filler:polymer weight ratio between about 1:99 and about 95:5. There is also provided an ink and ink cartridge for 3D printing of the piezoelectric composite. There is also provided a piezoelectric 3D printed material comprising the piezoelectric composite and a bifunctional material comprising the piezoelectric composite with one or more conductive electrodes adjacent to the piezoelectric composite. Methods of manufacture and uses thereof are also provided, including methods for 3D printing of a
(Continued)

piezoelectric 3D printed material via solvent-cast or FDM 3D printing starting from the piezoelectric composite and/or the ink.

20 Claims, 30 Drawing Sheets

(51) Int. Cl.

| | |
|---|---|
| B33Y 70/00 | (2020.01) |
| B29C 64/118 | (2017.01) |
| C09D 11/033 | (2014.01) |
| C09D 11/037 | (2014.01) |
| C09D 11/106 | (2014.01) |
| H01L 41/18 | (2006.01) |
| H01L 41/193 | (2006.01) |
| C08K 7/00 | (2006.01) |
| H01L 41/333 | (2013.01) |
| C09D 111/00 | (2006.01) |
| B29C 64/106 | (2017.01) |
| C08K 3/01 | (2018.01) |
| H01L 41/37 | (2013.01) |
| C08J 3/20 | (2006.01) |
| C09D 11/10 | (2014.01) |
| C08K 3/24 | (2006.01) |
| H01L 41/314 | (2013.01) |
| H01L 41/113 | (2006.01) |
| C08L 101/12 | (2006.01) |
| B82Y 30/00 | (2011.01) |
| C08K 3/00 | (2018.01) |
| B29K 105/16 | (2006.01) |
| C08K 9/04 | (2006.01) |
| C08K 3/04 | (2006.01) |

(52) U.S. Cl.
CPC .............. *B33Y 70/00* (2014.12); *B82Y 30/00* (2013.01); *C08J 3/20* (2013.01); *C08K 3/00* (2013.01); *C08K 3/01* (2018.01); *C08K 3/24* (2013.01); *C08K 7/00* (2013.01); *C08L 101/12* (2013.01); *C09D 11/033* (2013.01); *C09D 11/037* (2013.01); *C09D 11/10* (2013.01); *C09D 11/106* (2013.01); *C09D 111/00* (2013.01); *H01L 41/1132* (2013.01); *H01L 41/183* (2013.01); *H01L 41/193* (2013.01); *H01L 41/314* (2013.01); *H01L 41/333* (2013.01); *H01L 41/37* (2013.01); *B29K 2105/162* (2013.01); *B29K 2995/0003* (2013.01); *B29K 2995/0005* (2013.01); *C08J 2327/16* (2013.01); *C08K 3/041* (2017.05); *C08K 9/04* (2013.01)

(58) Field of Classification Search
CPC ..... B33Y 70/00; H01L 41/183; H01L 41/193; B29K 2105/162; B29K 2995/0003; B29K 2995/0005
See application file for complete search history.

(56) References Cited

U.S. PATENT DOCUMENTS

2017/0209622 A1* 7/2017 Shah ................. C09D 11/104
2018/0159037 A1* 6/2018 McAlpine ............ B29C 64/112

OTHER PUBLICATIONS

Gupta, S. et al., "Multifunctional Flexible PVDF-TrFE/BaTiO3 Based Tactile Sensor for Touch and Temperature Monitoring" IEEE Sensors, Oct. 1, 2017.

Kim, K. et al., "3D Optical Printing of Piezoelectric Nanoparticle-Polymer Composite Materials", ACS Nano, 2014, 8(10) 9799-9806.
Jia, N. et al., "Enhanched B-crystalline phase in poly(vinylidene fluoride) films by dopamine-coated BaTiO3 nanoparticles" Materials Letters, 2015, 139, 212-215.
Im, J. Y. et al., "Effect of Elongational Deformation on the phase Formation of Poly(vinylidene Fluoride)/Multiwalled Carbon Nanotube Composites and Their Piezoelectric Properties" Macromolecular Symposium, 2014, 346, 7-13.
Mandal, A. et al., "Ionic Liquid Integrated Multiwalled Carbon Nanotube in a Poly(vinylidene fluoride) Matrix: Formation of a Piezoelectric B-Polymorph with Significant Reinforcement and Conductivity Improvement" ACS Applied Materials and Interfaces, 2013, 5, 747-760.
Suaste-Gomez, E. et al. Developing an Ear Prosthesis Fabricated in Polyvinylidene Fluoride by a 3D Printer with Sensory Intrinsic Properties of Pressure and Temperature Sensors, 2016, 16(3), 1-11.
Ting, Y. and al., A New Approach of Polyvinylidene Fluoride (PVDF) Poling Method for Higher Electric Response. Ferroelectrics, 2013, 446, 28-38.
Tymrak, B.M. and al., Mechanical Properties of Components Fabricated with Open-source 3-D Printers under Realistic Environmental Conditions. Materials and Design, 2014, 58, 242-246.
Xing, C. Y. and al., Impact of Ionic Liquid-Modified Multiwalled Carbon Nanotubes on the Crystallization Behavior of Poly(vinylidene fluoride). The Journal of Physical Chemistry B, 2012, 116, 8312-8320.
Yu, W., et al., Structural characteristics of poly(vinylidene fluoride)/clay nanocomposites. Materials Letters, 2008. 62(4-5): p. 747-750.
Zein, I. and al., Fused Deposition Modeling of Novel Scaffold Architectures for Tissue Engineering Applications. Biomaterials, 2002, 23, 1169-1185.
Zhang, Y. Y. and al., Phase Transformation Mechanisms and Piezoelectric Properties of Poly(Vinylidene Fluoride)/Montmorillonite Composite. J. Appl. Polym. Sci., 2012, 123(5), 2595-2600.
Andrew and al., Enhanced Ferroelectric Phase Content of Polyvinylidene Difluoride Fibers with the Addition of Magnetic Nanoparticles. Langmuir, 2008, 24(16), 8435-8438.
Benz, M. and al., The Role of Solution Phase Water on the Deposition of Thin Films of Polyvinylidene fluoride). Macromolecules, 2002, 35(7), 2682-2688.
Bodkhe, Sampada and al., Therriault. Three-dimensional printing of polyvinylidene fluoride nanocomposites, in 20th International Conference on Composite Materials. 2015. Copenhagen, Denmark: International committee on composite materials.
Correia D.M., et al., Strategies for the development of three dimensional scaffolds from piezoelectric poly(vinylidene fluoride). Materials & Design, 2016. 92, p. 674-681.
Dillon, Douglas R. and al, On the structure and morphology of poly(vinylidene fluoride-nanoclay nanocomposites, Polymer, 2006. 47(5), p. 1678-1688.
Dudek, P. and al, FDM 3D Printing Technology in Manufacturing Composite Elements, Archives of Metallurgy and Materials, 2013, vol. 58, Issue 4, 1415-1418.
Ferreira A. and al,, Extrusion of Poly(vinylidene fluoride) Filaments: Effect of the Processing Conditions and Conductive Inner Core on the Electroactive Phase Content and Mechanical Properties. J Polym Res, 2011, 18, 1653-1658.
Frenot A. and I.S. Chranakis., Polymer nanofibers assembled by electrospinning. Current Opinion in Colloid & Interface Science, 2003. 8(1): p. 64-75.
Guo, S.Z. and Al,, 3D printing of a multifunctional nanocomposite helical liquid sensor. Nanoscale, 2015. 7(15): p. 6451-6456.
Guo, S.Z., and al., Solvent-cast three-dimensional printing of multifunctional microsystems. Small, 2013. 9(24), p. 4118-22.
Guo,, S.-Z., and al., Properties of Polylactide Inks for Solvent-Cast Printing of Three-Dimensional Freeform Microstructures. Langmuir, 2014. 30(4): p. 1142-1150.
Hartono, A. and al., Electric Field Poling 2GV/m to Improve Piezoelectricity of PVDF Thin Film. The 4th International Conference on Theoretical and Applied Physics (ICTAP), 2014, 1719, 030021-1-030021-4.

(56) References Cited

OTHER PUBLICATIONS

Huang, F. and al., Effect of temperature on structure, morphology and crystallinity of PVDF nanofibers via electrospinning, in e-Polymers. 2008, No. 152, p. 1758.

Huang, W. W. and al., Nanocomposites of Poly(vinylidene fluoride) with Multiwalled Carbon Nanotubes. Journal of Applied Polymer Science, 2010, 115, 3238-3248.

Huang, X. Y. and al., Influence of Aspect Ratio of Carbon Nanotubes on Crystalline Phases and Dielectric Properties of Poly(vinylidene fluoride). European Polymer Journal, 2009, 45, 377-386.

Hutmacher, D. W. and al., Mechanical Properties and Cell Cultural Response of Polycaprolactone Scaffolds Designed and Fabricated via Fused Deposition Modeling, J Biomed Mater Res., 2001, 55(2), 203-16.

Issa, A. A. and al., Investigation of the Physico-mechanical Properties of Electrospun PVDF/Cellulose (Nano)fibers. J. Appl. Polym. Sci., 2016, 43594.

Janiczek, T., Analysis of PVDF transducer signals stimulated by mechanical tension. Journal of Electrostatics, 2001. 51-52: p. 167-172.

Jing, X. and al. Magnetic and Dielectric Properties of Barium Ferrite Fibers/Poly(Vinylidene Fluoride) Composite Films. J. Polym. Res., 2011, 18(6), 2017-2021.

Johansson, F. Optimizing Fused Filament Fabrication 3D printing for Durability. 2016 Master's Degree Thesis from the Blekinge Institue of Technology.

JR_Rinaldo_Gregorio, Determination of the $\alpha$, $\beta$, and $\gamma$ Crystalline Phases of Poly(vinylidene fluoride) Films Prepared at Different Conditions. Journal of Applied Polymer Science, 2006, 100(4), 3272-3279.

Kang, S. J. and al., Spin Cast Ferroelectric Beta Poly (vinylidene fluoride) Thin Films via Rapid Thermal Annealing. Applied Physics Letters, 2008, 92(1), 012921(1-3).

Kannan, S. et al., Development of Composite Materials by Rapid Prototyping Technology using FDM Method. International Conference on Current Trends in Engineering and Technology, ICCTET'13, 2013, 281-283.

Koga, K. et al. Piezoelectricity and Related Properties of Vinylidene Fluoride and Trifluoroethylene Copolymers. Journal of Applied Physics, 1998, 59(6), 2142-2150.

Lee, C. and al., Electric field poling-assisted Additive Manufacturing Process for PVDF Polymerbased Piezoelectric Device Applications. Smart Materials and Structures, 2014, 23, 1-7.

Liu, Z.H., and al., A flexible sensing device based on a PVDF/MWCNT composite nanofiber array with an interdigital electrode. Sensors and Actuators A: Physical, 2014. 211: p. 78-88.

Lund, A., et al., Piezoelectric polymeric bicomponent fibers produced by melt spinning. Journal of Applied Polymer Science, 2012. 126(2): p. 490-500.

Luo, G., and al., Direct-Write, Self-Aligned Electrospinning on Paper for Controllable Fabrication of Three-Dimensional Structures. ACS Applied Materials & Interfaces, 2015. 7(50): p. 27765-27770.

Ma, C. C. and al., Polyvinylidene Fluoride Film Sensors in Collocated Feedback Structural Control: Application for Suppressing Impact-Induced Disturbances. IEEE Transactions on UltrasonIcs, Ferroelectrics and Frequency Control, 2011, 58(12), 2539-2554.

Magalhães, R., and al., The Role of Solvent Evaporation in the Microstructure of Electroactive $\beta$-Poly(Vinylidene Fluoride) Membranes Obtained by Isothermal Crystallization. Soft Materials, 2010. 9(1): p. 1-14.

Martins, P. and al., Electroactive Phases of Poly(Vinylidene Fluoride): Determination, Processing and Applications. Progress in Polymer Science, 2014, 39(4), 683-706.

Martins, R.S., and al., Piezoelectric coaxial filaments produced by coextrusion of poly(vinylidene fluoride) and electrically conductive inner and outer layers. Journal of Applied Polymer Science, 2014. 131(17): App.40710.

Mohammadi, B. and al., Effect of Tensile Strain Rate and Elongation on Crystalline Structure and Piezoelectric Properties of PVDF Thin Films. Polymer Testing, 2007, 26, 42-50.

Nilsson, E. and al., Poling and Characterization of Piezoelectric Polymer Fibers for Use in Textile Sensors. Sens. Actuators A, 2013, 201, 477-486.

Nishiyama, T. and al., Crystalline Structure Control of Poly(vinylidene fluoride) Films with the Anti solvent Addition Method. Polymer Journal, 2016, 48, 1035-1038.

Niu, Y., and al., Enhanced dielectric performance of BaTiO3/PVDF composites prepared by modified process for energy storage applications. Ultrasonics, Ferroelectrics, and Frequency Control, IEEE Transactions on, 2015. 62(1): p. 108-115.

Nunes-Pereira, J., and al., Energy harvesting performance of BaTiO3/poly(vinylidene fluoride-trifluoroethylene) spin coated nanocomposites. Composites Part B: Engineering, 2015. 72: p. 130-136.

Omar, A. M. and al., Optimization of Fused Deposition Modeling Process Parameters: A Review of Current Research and Future Prospects. Adv. Manuf., 2015, 3, 42-53.

Omar, A., Processing, morphology and product parameters of PVDF filaments for biomedical applications in Fakultät für Maschinenwesen. 2008, Master Thesis from Rheinisch—Westfälische Technische Hochschule Aachen.

Passieux, R., and al., Instability-Assisted Direct Writing of Microstructured Fibers Featuring Sacrificial Bonds. Advanced Materials, 2015. 27(24): p. S3676-3680.

Peng, Q. Y. and al., The Preparation of PVDF/clay Nanocomposites and the Investigation of Their Tribological Properties. Wear, 2009, 266, 713-720.

Pu, J., and al., Piezoelectric actuation of direct-write electrospun fibers. Sensors and Actuators A: Physical, 2010. 164(1-2): p. 131-136.

Rajesh, P. S. M. et al. Enhancing Beta-Phase in PVDF through Physicochemical Modification of Cellulose. Electron. Mater. Lett., 2014, 10(1), 315-319.

Sajkiewicz, P. and al., Phase Transitions During Stretching of Poly(Vinylidene Fluoride). Eur. Polym. J., 1999, 35(3), 423-429.

Salimi, A. and al., Analysis method: FTIR Studies of $\beta$-phase Crystal Formation in Stretched PVDF Films. Polymer Testing, 2003, 22(6), 699-704.

Sencadas, V. et al. A to B Phase Transformation and Microstructural Changes of Pvdf Films Induced by Uniaxial Stretch. Journal of Macromolecular Science, Part B, 2009, 48(3), 514-525.

Seok Ju, K. and al., Spin Cast Ferroelectric Beta Poly(vinylidene fluoride) Thin Films via Rapid Thermal Annealing. Applied Physics Letters, 2008, 92(1), 012921-012921-3.

Seoul, C. and al., Electrospinning of Poly(vinylidene fluoride)/dimethylformamide Solutions with Carbon Nanotubes. Journal of Polymer Science Part B: Polymer Physics, 2003, 41(13), 1572-1577.

Serra, T. et al. High-Resolution PLA-Based Composite Scaffolds via 3-D Printing Technology. Acta Biomaterialia, 2013, 8, 5521-5530.

Soames, R.W., Foot pressure patterns during gait. Medical Engineering and Physics. 7(2): p. 120-126.

\* cited by examiner (a)

(b)

(a)  (b)

surgical syringe (1 mL) filled with commercial silver paint

Silver being extruded on an edge of the extrusion syringe (3 mL)

piezo ink poured in after drawing silver lines on two edges of the syringe (a)

(b)

(a)

(b)

a)

b)

a)

b)

PIEZOELECTRIC COMPOSITE, INK AND INK CARTRIDGE FOR 3D PRINTING, BIFUNCTIONAL MATERIAL COMPRISING THE PIEZOELECTRIC COMPOSITE, MANUFACTURE AND USES THEREOF

CROSS REFERENCE TO RELATED APPLICATIONS

This application is a National Entry Application of PCT application no PCT/CA2017/051343 filed on Nov. 10, 2017 and published in English under PCT Article 21(2), which itself claims benefit of U.S. provisional application Ser. No. 62/420,176, filed on Nov. 10, 2016. All documents above are incorporated herein in their entirety by reference.

FIELD OF THE INVENTION

The present invention relates to a piezoelectric composite, in particular for use in a piezoelectric ink for 3D printing. In addition, the present invention is concerned with 3D printed piezoelectric material as well as bifunctional material comprising the piezoelectric composite and adjacent electrode(s). Further, the present invention is concerned with their use as feedstock for fused deposition modeling 3D printing and in sensors, including touch sensors.

BACKGROUND OF THE INVENTION

As a semi-crystalline fluoropolymer, PVDF can adopt five crystalline phases. Among them, the electroactive β-phase has the highest spontaneous polarization resulting in higher piezoelectricity in PVDF. The attainment of the β-phase in PVDF typically requires methods like high electric field poling, mechanical stretching and annealing, which are cumbersome and costly. The most conventional techniques to fabricate PVDF structures like solution casting, spin coating, electrospinning have been well studied and developed over the years. However, solution casting and spin coating methods needs further poling process to improve the β-phase content. Electrospinning also consists of in situ poling between the disposable nozzle and the collector.

3D printing is a well-known additive manufacturing process.

In solvent-cast 3D printing, a polymer is first dissolved into a highly volatile solvent. Subsequently, the solution is extruded through a small nozzle under applied pressure. The motion of a robotic arm is used to print the desired geometry at the required location through a computer-controlled program. As the solution comes out of the nozzle, the rapid evaporation of the solvent results in retaining the desired shape: layer-by-layer, self-supporting, or freestanding structures.

FDM 3D printing, a rapid prototyping technology, is widely used in scientific and industrial fields. It is an alternative approach that uses a heated extrusion head to create 3D objects by melt-depositing a thermoplastic filament on a build platform, layer-by-layer. At the end of each finished layer, the build platform is lowered and the next layer is deposited. The process is repeated until the desired shape is obtained. Various filament types are commercially available for FDM 3D printing, such as polylactic acid (PLA), polycaprolactone (PCL) and polyvinylidene fluoride (PVDF). PVDF, however, requires further high electric filed poling to improve its piezoelectric property.

On another topic, fabrication of piezoelectric sensors typically involves a minimum of two-steps: fabrication of the sensor structure followed by electrode deposition. However, with complex structures, conventional electrode deposition techniques cannot reach the interior surfaces. In fact, the complex shapes of certain 3D electroactive scaffolds can render the deposition of electrodes impossible in certain regions.

SUMMARY OF THE INVENTION

In accordance with the present invention, there is provided:
1. A piezoelectric composite comprising:
   a piezoelectric polymer; and
   particles of a filler dispersed in the polymer,
   wherein the filler is in micro or nanoparticle form, and
   wherein the filler is present in a filler:polymer weight ratio between about 1:99 and about 95:5.
2. The piezoelectric composite of item 1, wherein the filler is present in a filler:polymer weight ratio of:
   about 1:99, about 1.5:98.5, about 2:98, about 2.5:97.5, about 3.0:97, about 3.5:96.5, about 4.0:96, about 4.5:95.5, about 5:95, about 10:90, or about 15:85 or more and/or
   about 95:5, about 90:10, about 85:15, about 80:20, about 75:25, about 70:30, about 65:35, about 60:40, about 55:45, about 50:50, about 45:55, about 40:60, about 35:65, about 30:70, about 25:75, about 20:80, about 15:85, or about 10:90 or less.
3. The piezoelectric composite of item 2, wherein the filler:polymer weight ratio is between about 5:95 and about 15:85.
4. The piezoelectric composite of item 3, wherein the filler:polymer weight ratio is about 10:90.
5. The piezoelectric composite of any one of items 1 to 4, wherein the filler is barium titanate ($BaTiO_3$), carbon nanotubes (single-walled, double-walled, multi-walled), carbon nanotubes modified with ionic liquid, boron nitride nanotubes, cellulose, clay (intercalated, exfoliated), $CoFe_2O_4$, graphene, graphene oxide, $CuCl_2$, iron oxide, ferrite, lead zirconium titanate, magnetic ferrite, $MnCl_2$, $NiFe_2O_4$, polyethyleneimine, $PbMg_{1/3}Nb_{2/3}O_3$(PMN)—$PbTiO_3$(PT), quantum dots, silver, $TiO_2$, vanadium pentoxide, zinc oxide, or combinations thereof.
6. The piezoelectric composite of any one of items 1 to 5, wherein the filler is pure, treated, surface modified, or coated.
7. The piezoelectric composite of any one of items 1 to 6, wherein the filler is $BaTiO_3$.
8. The piezoelectric composite of any one of items 1 to 7, wherein the filler is $BaTiO_3$ nanoparticles.
9. The piezoelectric composite of any one of items 1 to 6, wherein the filler is carbon nanotubes modified with ionic liquid.
10. The piezolelectric composite of any one of items 5, 6, and 9, wherein the carbon nanotubes are multi-walled carbon nanotubes.
11. The piezolelectric composite of any one of items 5, 6, and 9 to 10, wherein the ionic liquid is 1-butyl-3-methylimidazolium hexafluorophosphate.
12. The piezoelectric composite of any one of items 1 to 11, wherein the polymer is polyvinylidene fluoride (PVDF), polylactide (PLA), acrylonitrile butadiene styrene (ABS), epoxy, PDMS (polydimethylsiloxane), diacrylate photocurable resin, polyethylene glycol diacrylate, Flex™ (acrylic based commercial resin), Ormocomp™ (commercial resin), PMMA (polymethyl methacrylate), PVDF-HFP (poly(vinylidene fluoride-co-hexafluoropropylene)), P(VDF-TrFE-CFE) (vinylidene fluoride-trifluoroethylene-chlorofluoroethylene terpolymer), or P(VDF-TrFE) (poly[(vinylidenefluoride-co-trifluoroethylene]).

13. The piezoelectric composite of any one of items 1 to 12, wherein the polymer is polyvinylidene fluoride (PVDF).

14. The piezoelectric composite of any one of items 1 to 13, wherein the composite further comprises one or more additives.

15. The piezoelectric composite of item 14, wherein the additives are:
   pigments,
      short carbon fibers, fiberglass, and/or boron nitride, and/or
      carbon black spheres, graphene, silver nanotubes, copper, and/or nickel nanotubes.

16. The piezoelectric composite of any one of items 1 to 15, being in the shape of a wire.

17. A piezoelectric ink for 3D printing, wherein the piezoelectric 3D printing ink comprises:
   a volatile solvent, and
      a piezoelectric composite as defined in any one of items 1 to 16 mixed with said solvent, such that the polymer is dissolved in the solvent thus forming a polymer solution and the particles of the filler are dispersed in the polymer solution,
   wherein the piezoelectric ink comprises between about 0.1 and about 0.4 g of the piezoelectric composite per mL of piezoelectric ink.

18. The piezoelectric ink of item 17, wherein the solvent is DMF (dimethyl formamide), DMSO (dimethyl sulfoxide), NMP (N-methyl-2-pyrrolidone), DMAc (dimethyl acetamide), acetone, butanone, tetrahydrofuran, cyclohexanone, methyl ethyl ketone, or mixtures thereof.

19. The piezoelectric ink of item 18, wherein the solvent is a mixture of DMF, acetone, and DMSO.

20. The piezoelectric ink of item 19, wherein the volume % of DMF is between about 10 and about 60, the volume % of acetone is between about 30 and about 80, and the volume % of DMSO is between about 0 (non-inclusive) and about 10.

21. The piezoelectric ink of item 20, wherein the volume % of DMF is between about 30 and about 50, the volume % of acetone is between about 50 and about 70, and the volume % of DMSO is between about 2 and about 8.

22. The piezoelectric ink of item 21, wherein the volume % of DMF is about 38, the volume % of acetone is about 57%, and the volume % of DMSO is about 5.

23. The piezoelectric ink of any one of items 17 to 22, comprising:
   about 0.1 g/mL, about 0.2 g/mL, about 0.25 g/mL, or about 0.3 g/mL or more and/or
   about 0.4 g/mL, about 0.35 g/mL, about 0.3 g/mL, or about 0.25 g/mL or less,
of piezoelectric composite, in grams of piezoelectric composite per mL of piezoelectric ink.

24. An ink cartridge, the cartridge comprising a container having an ink outlet, the container containing the piezoelectric ink as defined in any one of items 17 to 23.

25. The ink cartridge of item 24, wherein the cartridge is adapted to be installed on a 3D printer.

26. The ink cartridge of item 24 or 25, wherein the cartridge is adapted to be fitted to a nozzle for delivering the ink, so that, for ink dispensing, the ink is extruded through the ink outlet and through the nozzle.

27. The ink cartridge of any one of items 24 to 26, wherein the cartridge is designed so that when a pressure is applied by a 3D printer, the ink is extruded through the ink outlet.

28. A piezoelectric 3D printed material comprising the piezoelectric composite of any one of items 1 to 16 shaped into a 3D shape.

29. The 3D printed material of item 28, wherein said piezoelectric 3D printed material has been manufactured by 3D printing of the piezoelectric ink of any one of items 18 to 23.

30. The 3D printed material of item 28 or 29, wherein the 3D printed material is in the form of a wire.

31. A bifunctional material comprising the piezoelectric composite of any one of items 1 to 16 with one or more, preferably at least two, conductive electrodes adjacent to the piezoelectric composite.

32. The bifunctional material of item 31, wherein the ratio of piezoelectric composite to conductive electrode by weight is between about 80:20 and about 99:1.

33. The bifunctional material of item 31 or 32, wherein the material is in the form of a wire, wherein the piezoelectric composite and the electrode(s) are in the form of elongated thin cylinders that extend along the wire length and each occupy part of the cross-section of the wire.

34. The bifunctional material of item 33, wherein the piezoelectric composite is laterally sandwiched between two conductive electrodes.

35. The bifunctional material of any one of items 31 to 34, wherein the conductive electrode is made of a conductive composite.

36. The bifunctional material of item 35, wherein the conductive composite is a carbon nanotube based composite (dispersion); a graphene based composite (dispersion); a carbon fiber based composite (dispersion); a silver based composite; a silver nanoparticle based composite (dispersion); a PEDOT:PSS(poly (3,4-ethylenedioxythiophene) and poly (styrene sulfonate)) based composite (dispersion); a copper/copper oxide nanoparticle based composite (dispersion); a gold based composite (dispersion), a polyaniline based composite (dispersion); a conductive hydrogel, or an ITO dispersion.

37. The bifunctional material of item 35 or 36, wherein the conductive composite comprises:
   a polymer or a binder, and
   particles of a conductive material dispersed in the polymer or binder,
wherein the conductive material is present in a conductive material:polymer/binder weight ratio between about 1:99 and about 95:5.

38. The bifunctional material of item 37, wherein the conductive material is present in a conductive material:polymer/binder weight ratio of:
about 1:99, about 15:85, about 30:70, or about 40:60 or more and/or
about 95:5, about 75:25, about 50:50, about 40:60, or about 30:70, or less.

39. The bifunctional material of item 38, wherein the conductive material:polymer/binder weight ratio is between about 15:85 and about 40:60, 40. The bifunctional material of item 39, wherein the conductive material:polymer/binder weight ratio is about 30:70.
41. The bifunctional material of any one of items 37 to 40, wherein the conductive material is silver.
42. The bifunctional material of any one of items 37 to 40, wherein the conductive material is multi-walled carbon nanotubes (CNTs).
43. The bifunctional material of any one of items 37 to 43, wherein the polymer or binder is PVDF.
44. The bifunctional material of any one of items 37 to 41, wherein the conductive electrode is made of Silver Print™, MG Chemicals, CAT #842.
45. The bifunctional material of any one of items 31 to 44, wherein the piezoelectric composite has a filler:polymer weight ratio of about 50:50, wherein the filler is $BaTiO_3$ nanoparticles and the polymer is PVDF.
46. Use of the piezoelectric composite of any one of items 1 to 16, of the piezoelectric 3D printed material of any one of items 28 to 30, or of the bifunctional material of any one of items 31 to 45, in sensors for temperature, strain, touch, pressure, motion, flow, and/or infra-red; scaffolds (in tissue engineering); capacitors; antenna; energy harvesting from vibrations, flow, rain, wind, and/or bodily motions; ultrasonic sensors/transducers; force measurements for bio applications; hearing aids; robotic hands with embedded sensors; structural health monitoring, such as combined sensing and actuation; coatings that are chemically inert and/or UV resistant; or smart textiles, woven or non-woven.
47. The use of item 46, wherein the piezoelectric composite, the piezoelectric 3D printed material, or the bifunctional material is used in a touch sensor.
48. Use of the piezoelectric composite of any one of items 1 to 16, of the piezoelectric 3D printed material of any one of items 28 to 30, or of the bifunctional material of any one of items 31 to 45, as a feedstock to produce a 3D printed material via fused deposition modeling (FDM) 3D printing.
49. The use of item 48, wherein the piezoelectric composite, the piezoelectric 3D printed material, or the bifunctional material is in the form of a wire.
50. A method of manufacture of a piezoelectric composite as defined in any one of items 1 to 16, the method comprising the steps of:
    a. providing a piezoelectric polymer as defined in any one of items 1-16 and particles of a filler as defined in any one of items 1-16,
    b. sonicating said filler and polymer together in the presence of a solvent, followed by mixing by ball milling, thereby forming a suspension of the filler particles in a solution of the polymer, and
    c. drying the suspension until the solvent is removed.
51. The method according to item 50, wherein the solvent is DMF (dimethyl formamide), DMSO (dimethyl sulfoxide), NMP (N-methyl-2-pyrrolidone), DMAc (dimethyl acetamide), acetone, butanone, tetrahydrofuran, cyclohexanone, methyl ethyl ketone, or mixtures thereof.
52. The method according to item 51, wherein the solvent is DMF.
53. The method according to any one of items 50 to 51, wherein the mixing in step b) is performed in a high energy shaker ball-mill (SPEX SamplePrep™ 8000 Series Mixer/Mill™) at a rate of 1080 cycles per minute.
54. The method according to any one of items 50 to 53, wherein the mixing in step b) is performed for about 20 minutes.
55. The method according to any one of items 50 to 54, wherein the drying step c) comprises drying the solution in a vacuum oven at 60° C. for 12 h.
56. The method according to any one of items 50 to 55, wherein the drying step c) occurs during and/or following extrusion of the suspension.
57. The method according to item 56, wherein during said extrusion, the piezoelectric composite is extruded in the form of a wire.
58. A method of manufacture of a piezoelectric composite as defined in any one of items 1 to 16, the method comprising the steps of:
    a. providing a mixture of particles of a filler and a piezoelectric polymer,
    b. melt compounding the mixture; and
    c. optionally, allowing the mixture to cool.
59. The method according to item 58, wherein the melt compounding in step b) is carried out in an extruder.
60. The method according to item 58 or 59, wherein the piezoelectric composite is compounded in step b) into filaments.
61. The method according to any one of items 58 to 60, further comprising the step of compounding the piezoelectric composite into a wire.
62. A method of manufacture of a piezoelectric ink for 3D printing as defined in any one of item 17 to 23, the method comprising the steps of:
    a. providing a piezoelectric composite as defined in any one of items 1-16 and a solvent as defined in any one of items 17 to 23, and
    b. sonicating said piezoelectric composite with said solvent to form a suspension of the filler in a solution of the polymer.
63. The method according to item 62, wherein the providing of the piezoelectric composite in step a) includes the method of manufacture of a piezoelectric composite as defined in any one of items 50 to 57.
64. A method of manufacture of a piezoelectric ink for 3D printing as defined in any one of items 17 to 23, the method comprising the steps of:
    a. providing a piezoelectric polymer as defined in any one of items 1-16, particles of a filler as defined in any one of items 1-16, and a solvent as defined in any one of items 17 to 23, and
    b. sonicating said filler and polymer together in the presence of said solvent, followed by mixing by ball milling, thereby forming a suspension of the filler particles in a solution of the polymer.
65. A method of manufacturing a piezoelectric solvent-cast 3D printed material, the method comprising the steps of:
    a. feeding a piezoelectric ink as defined in any one of items 17 to 23 to a nozzle of a 3D printer,
    b. extruding the ink through the nozzle into a pattern; and
    c. allowing evaporation of the solvent, thereby providing the piezoelectric 3D printed material.
66. The method according to item 65, wherein the piezoelectric ink is fabricated using the method of manufacture of a piezoelectric ink for 3D printing as defined in any one of items 62 to 64.
67. The method according to item 65 or 66, wherein the ink is extruded using an applied pressure of between about 100 and about 4000 kPa.

68. The method according to any one of items 65 to 67, wherein, during extrusion, a displacement speed of the nozzle ranges from about 0.1 to about 30 mm/sec.
69. The method according to any one of items 65 to 68, wherein an inner diameter of the nozzle is between about 10 and about 3000 µm.
70. The method according to any one of items 65 to 69, wherein, in step b), the ink is extruded onto a printing bed and an electric field is applied between the nozzle and the printing bed.
71. A method of manufacturing a fused deposition modeled 3D printed material, the method comprising the steps of:
   a) feeding a piezoelectric composite as defined in any one of items 1 to 16 to a nozzle of a 3D printer,
   b) extruding through the nozzle into a pattern, wherein the piezoelectric composite fed to the nozzle is softened or molten and/or the nozzle is heated so as to melt or soften the piezoelectric composite; and
   c) allowing cooling and hardening of the piezoelectric composite into the pattern, thereby providing the 3D printed material.
72. The method according to item 71, wherein the filer is barium titanate ($BaTiO_3$), carbon nanotubes (single-walled, double-walled, multi-walled), boron nitride nanotubes, cellulose, clay (intercalated, exfoliated), $CoFe_2O_4$, graphene, graphene oxide, $CuCl_2$, iron oxide, ferrite, lead zirconium titanate, magnetic ferrite, $MnCl_2$, $NiFe_2O_4$, polyethyleneimine, $PbMg_{1/3}Nb_{2/3}O_3$ (PMN)—$PbTiO_3$(PT), quantum dots, silver, $TiO_2$, vanadium pentoxide, zinc oxide, or combinations thereof.
73. The method according to item 71 or 72, wherein the 3D printing is assisted by electric field poling in which the composite is extruded onto a printing bed and an electric field is applied between the nozzle and the printing bed.
74. The method according to any one of items 71 to 73, further comprising one or more post-printing process that increases the piezoelectric performances of the 3D printed material.
75. The method of item 74, wherein said post-printing process is mechanical stretching or annealing.
76. The method according to item 71, wherein the filer is carbon nanotubes modified with ionic liquid.
77. The method according to item 76, wherein the carbon nanotubes are multiwalled carbon nanotubes.
78. The method according to item 76 or 77, wherein ionic liquid is 1-butyl-3-methylimidazolium hexafluorophosphate.
79. The method according to item 71 and 76 to 78, wherein the 3D printing is not assisted by electric field poling.
80. The method according to any one of items 71 and 76 to 79, wherein the method does not further comprise a post-printing process that increases the piezoelectric performances of the 3D printed material.
81. A method of manufacturing the bifunctional material of any one of items 31 to 45, the method comprising the steps of:
   a. feeding a piezoelectric ink as defined in any one of items 17 to 23 and a conductive ink to at least one nozzle of a 3D printer,
   b. extruding the piezoelectric ink and the conductive ink through the at least one nozzle; and
   c. allowing evaporation of the solvent, thereby providing the bifunctional material.
82. The method according to item 81, wherein the piezoelectric ink is fabricated using the method of manufacture of a piezoelectric ink for 3D printing as defined in any one of items 62 to 64.
83. The method according to item 81 or 82, wherein the piezoelectric ink and the conductive ink are extruded using an applied pressure of between about 100 and about 4000 kPa.
84. The method according to any one of items 81 to 83, wherein, during extrusion, a displacement speed of the nozzle ranges from about 0.1 to about 30 mm/sec.
85. The method according to any one of items 81 to 84, wherein an inner diameter of the nozzle is between about 10 and about 3000 µm.
86. The method according to any one of items 81 to 85, wherein the conductive ink comprises:
   a volatile solvent, and
      a conductive composite as defined in any one of items 1 to 16, mixed with the solvent such that the particles of the conductive material are dispersed in a solution of the polymer/binder,
wherein the conductive material is present in a conductive material:polymer/binder weight ratio between about 1:99 and about 95:5.
87. The method according to any one of items 81 to 86, wherein the total concentration of polymer/binder and conductive material in the conductive ink is between about 0.05 and about 0.5 g/mL.
88. The method according to item 87, wherein the total concentration of polymer/binder and conductive material in the conductive ink is between about 0.1 and about 0.40 g/mL.
89. The method according to item 88, wherein the total concentration of polymer/binder and conductive material in the conductive ink is about 0.35 g/mL.
90. The method according to any one of items 81 to 89, wherein the solvent of the conductive ink is the solvent defined in any one of items 17-23.
91. The method according to any one of items 81 to 90, wherein the solvent of the conductive ink is a mixture of DMF, acetone, and DMSO.
92. The method according to item 91, wherein the volume % of DMF is between about 10 and about 60, the volume % of acetone is between about 30 and about 80, and the volume % of DMSO is between about 0 (non-inclusive) and about 10.
93. The method according to item 92, wherein the volume % of DMF is between about 30 and about 50, the volume % of acetone is between about 50 and about 70, and the volume % of DMSO is between about 2 and about 8.
94. The method according to item 93, wherein the volume % of DMF is about 38, the volume % of acetone is about 57%, and the volume % of DMSO is about 5.
95. The method according to any one of items 81 to 94, wherein the conductive ink and the piezoelectric ink contain the same solvent.
96. The method according to item 81 or 95, wherein, if the conductive ink contains a polymer, the conductive ink and the piezoelectric ink contain the same polymer.
97. The method according to any one of items 81 to 96, wherein the conductive ink and the piezoelectric ink are each extruded from a different nozzle.

98. The method according to any one of items 81 to 97, wherein the conductive ink and the piezoelectric ink are extruded from an array of nozzles.
99. The method according to any one of items 81 to 96, wherein the conductive ink and the piezoelectric ink have similar viscosities.
100. The method according to item 99, wherein the piezoelectric ink and the conductive ink are extruded simultaneously from a same nozzle.
101. The method according to item 100, wherein the feeding step a) comprises feeding one side of the nozzle with one of the inks and the other side with the other ink.
102. The method according to item 100, wherein the feeding step a) comprises feeding opposing sides of the nozzle with one of the inks and the middle of the nozzle with the other ink.

BRIEF DESCRIPTION OF THE DRAWINGS

In the appended drawings:

FIG. 2(a) shows a SEM image of a cross-sectional view of a 1D fiber (scale bar=25 µm); FIG. 2(b) shows an optical microscopic image of a 2D structure reading 'LM2' (the abbreviation of the laboratory of multiscale mechanics; scale bar=2.5 mm; contrast increased); FIG. 2(c) shows a photograph of an inclined side-view of a 2.5D 70 layered circular cylinder (scale bar=20 mm); FIG. 2(d) shows a SEM image of an inclined top-view of a 3D spanning 9-layer scaffold (scale bar=1 mm).

FIG. 12(a) shows the syringe before printing; FIG. 12(b) shows the sensor after printing with a 410 µm nozzle.

In FIG. 15(A), the electrode (20) is concentric with the piezoelectric composite (10). In FIG. 15(B) to (E), these are eccentric, with part of the electrode(s) (20) being at the surface of the wire in 15(C) to (E). In FIG. 15(E), two electrodes (20) laterally sandwich the piezoelectric composite or printed material (10). In FIG. 15(F), two electrodes (20) radially sandwich the piezoelectric composite or printed material (10).

FIG. 16(a) shows an extrusion nozzle printing a piezoelectric sensor along with the electrodes; FIG. 16(b) shows a co-extruded free-standing vertical piezoelectric pillar sensor with the following ink combination: 6B/0.1C; FIG. 16(c) shows an inclined view of a co-extruded free-standing vertical piezoelectric pillar sensor with the following ink combination: Piezo ink with 10:90 filler:polymer weight ratio and 0.35 g/mL of nanocomposite in the solvents and conductive silver ink; FIG. 16(d) shows a front view of the pillar in FIG. 16(c); FIG. 16(e) shows the pillar in FIG. 16(c) and FIG. 16(d) held between tweezers to demonstrate its flexibility; FIG. 16(f) shows a co-extruded filament, with the following ink combination: Piezo ink with 10:90 filler:polymer weight ratio and 0.35 g/mL of nanocomposite in the solvents and conductive silver ink, to form a piezoelectric thread; FIG. 16(g) shows a co-extruded filament woven into a fabric to form a smart textile.

DETAILED DESCRIPTION OF THE INVENTION

Figure 1:
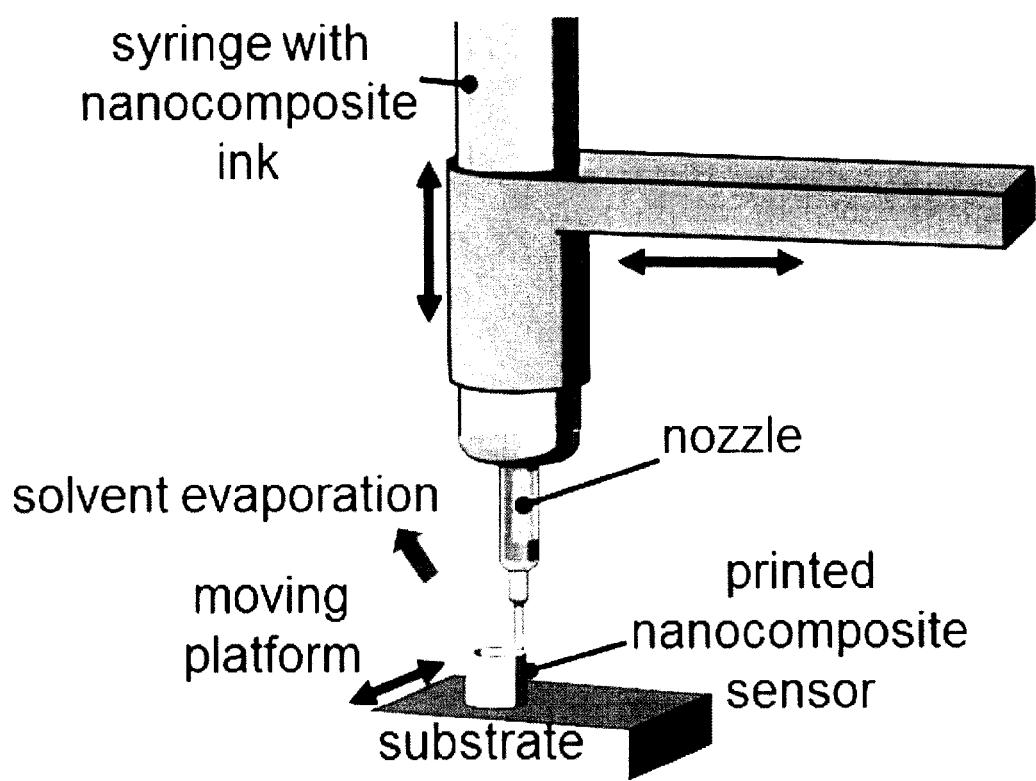
FIG. 1 shows a solvent cast 3D printing process for nanocomposite based 3D structures.

The present invention relates to a piezoelectric composite and a piezoelectric ink, in particular for 3D printing as well as a bifunctional material comprising the piezoelectric composite with adjacent electrode(s) together with their methods of manufacture and use, and the produced 3D printed materials.

Piezoelectric Composite

Turning now to the invention in more details, there is provided a piezoelectric composite comprising:
  a piezoelectric polymer; and
  particles of a filler dispersed in the polymer;
wherein the filler is in micro or nanoparticle form, and wherein the filler is present in a filler:polymer weight ratio between about 1:99 and about 95:5.

Herein, a greater filler:polymer weight ratio, indicating a greater presence of the filler, increases the brittleness and tends to reduce the flexibility of the 3D printed material.

For certainty, this weight ratio is expressed as follows: weight ratio=weight of filler:weight of polymer weight ratio=weight of carbon nanotubes:weight of polymer. A ratio of 20:80 thus means that the composite comprises 20 wt. % of filler and 80 wt. % of polymer, both percentages being based of the total weight of the polymer and filler (i.e. excluding the weight of any potential additives).

In embodiments, the filler is present in a filler:polymer weight ratio of:
  about 1:99, about 1.5:98.5, about 2:98, about 2.5:97.5, about 3.0:97, about 3.5:96.5, about 4.0:96, about 4.5: 95.5, about 5:95, about 10:90 or about 15:85 or more and/or
  about 95:5, about 90:10, about 85:15, about 80:20, about 75:25, about 70:30, about 65:35, about 60:40, about 55:45, about 50:50, about 45:55, about 40:60, about 35:65, about 30:70, about 25:75, about 20:80, about 15:85, or about 10:90 or less,
based on the total weight of the polymer and filler as explained above. Preferably, the filler:polymer weight ratio is between about 5:95 and about 15:85, more preferably it is about 10:90. In other embodiments, the filler:polymer weight ratio is higher so that it produces a more viscous ink (see details below). In such embodiments, the filler:polymer weight ratio is for example:
  about 35:65, about 40:60, about 45:55, about 50:50 or more and/or
  about 65:35, about 60:40, about 55:45, about 50:50 or less,
based on the total weight of the polymer and filler as explained above. Preferably, the filler:polymer weight ratio of about 50:50.

In embodiments, the filler is in microparticle form. In a preferred embodiment, the filler is in nanoparticle form and the composite can be referred to as a "nanocomposite".

In embodiments, the filler is barium titanate (BaTiO$_3$), carbon nanotubes (single-walled, double-walled, multi-walled), carbon nanotubes modified with ionic liquid, boron nitride nanotubes, cellulose, clay (intercalated, exfoliated), CoFe$_2$O$_4$, graphene, graphene oxide, CuCl$_2$, iron oxide, ferrite, lead zirconium titanate, magnetic ferrite, MnCl$_2$, NiFe$_2$O$_4$, polyethyleneimine, PbMg$_{1/3}$Nb$_{2/3}$O$_3$(PMN)—Pb- TiO$_3$(PT), quantum dots, silver, TiO$_2$, vanadium pentoxide, zinc oxide, or combinations thereof.

In preferred embodiments, the filler is BaTiO$_3$, preferably in the form of nanoparticles.

The filler can be pure, treated, surface modified, coated, or modified in any other way know in the art. Such is the case carbon nanotubes modified with ionic liquid, which can be prepared by mechanically grinding together the carbon nanotubes and the ionic liquid.

Thus, in other preferred embodiments, the filler is carbon nanotubes (preferably multi-walled carbon nanotubes) modified with ionic liquid, preferably 1-butyl-3-methylimidazolium hexafluorophosphate.

The piezoelectric polymer is a polymer that has piezoelectric properties. The molecular weight of the polymer is not particularly limited. In embodiments, the polymer is polyvinylidene fluoride (PVDF), polylactide (PLA), acrylonitrile butadiene styrene (ABS), epoxy, PDMS (polydimethylsiloxane), diacrylate photocurable resin, polyethylene glycol diacrylate, Flex™ (acrylic based commercial resin), Ormocomp™ (commercial resin), PMMA (polymethyl methacrylate), PVDF-HFP (poly(vinylidene fluoride-co-hexafluoropropylene)), P(VDF-TrFE-CFE) (vinylidene fluoride-trifluoroethylene-chlorofluoroethylene terpolymer), or P(VDF-TrFE) (poly[(vinylidenefluoride-co-trifluoroethylene]).

In preferred embodiments, the polymer is polyvinylidene fluoride (PVDF).

Without being bound by theory, the filler is believed to help form desired piezoelectric phase in the polymer (for example β-phase in PVDF), which phase is at least in part responsible for the composite piezoelectric properties. In embodiments, depending on the exact nature of the filler, the filler itself may also contribute to the piezoelectric properties of the composite. This is the case for barium titanate, as it itself is piezoelectric in nature.

The piezoelectric composite is preferably in dry form (i.e. it does not comprise a significant amount of a solvent or other liquid). In preferred embodiments, the piezoelectric composite is in the form of:
  a powder; or
  a solid, preferably a wire (or any other such elongated thin cylindrical shape), which can be spun into a spool.

As will be discussed below, this last form is convenient to feed a 3D printer nozzle, where the composite is to be 3D printed for example by fused deposition modeling (FDM).

In embodiments, the piezoelectric composite is used in the manufacture of a 3D printing ink.

Method of Manufacture of the Piezoelectric Composite

In another aspect, the present invention provides a method of manufacture of the above piezoelectric composite, the method comprising the steps of:
  a) providing particles of a filler and a piezoelectric polymer,
  b) sonicating said filler and polymer together in the presence of a solvent, followed by mixing by ball milling, thereby forming a suspension of the filler particles in a solution of the polymer, and
  c) drying the suspension until the solvent is removed.

In this method, the filler, the polymer, and the piezoelectric composite, their concentrations, their preferred embodiments, etc. are as described in the section "Piezoelectric Composite" above. This method is preferably used when the filler is barium titanate (BaTiO$_3$).

The solvent may be any solvent capable of dissolving the polymer (but not the particles) and then being removed by evaporation. In preferred embodiments, the solvent is DMF (dimethyl formamide), DMSO (dimethyl sulfoxide), NMP (N-methyl-2-pyrrolidone), DMAc (dimethyl acetamide), acetone, butanone, tetrahydrofuran, cyclohexanone, methyl ethyl ketone, or mixtures thereof. In a most preferred embodiment, the solvent is DMF.

In embodiments, there are no restrictions on the amount of solvent used, as long as it is sufficient to completely dissolve the polymer, and as long as it can be completely removed.

The mixing in step b) is carried out by ball milling. Ball milling should be carried out with sufficient energy and for sufficient time to form a suspension of the filler particles in a solution of the polymer. In preferable embodiments, the solution is mixed in a high energy shaker ball-mill (SPEX SamplePrep™ 8000 Series Mixer/Mill™) at a rate of 1080 cycles per minute, for example, for about 20 minutes.

The drying in step c) is carried out under sufficient conditions and for sufficient time so that the solvent is removed. In embodiments, the solution is dried in a vacuum oven at 60° C. for 12 h, which provides the composite as a powder. In alternative embodiments, the solvent can be evaporated during/following extrusion of the suspension (which would be concentrated enough to form a paste). In this way, the piezoelectric composite can be provided as a wire (or another such thin elongated shape), which can be spun into spools An alternative method of manufacture of the above piezoelectric composite comprises the steps of:
  a) providing a mixture of particles of a filler and a piezoelectric polymer,
  b) melt compounding the mixture; and
  c) optionally, allowing the mixture to cool.

In this method, the filler, the polymer, and the piezoelectric composite, their concentrations, their preferred embodiments, etc. are as described in the section "Piezoelectric Composite" above. This method is preferably used when the filler is carbon nanotubes modified with ionic liquid.

In embodiments, the melt compounding in step b) can be carried out, for example, in an extruder. A preferred extruder is a twin-screw extruder.

Preferably, in step b), the piezoelectric composite is compounded into filaments.

In embodiments, the method further comprises the step of compounding the piezoelectric composite into a wire (or another such thin elongated shape), which can be spun into spools. This step can preferably be carried out in an extruder.

Piezoelectric Ink

In another aspect, the present invention provides a piezoelectric ink, in particular for solvent-cast 3D printing, wherein the piezoelectric ink comprises:
  a volatile solvent, and
    the above piezoelectric composite mixed with said solvent, such that the polymer is dissolved in the solvent thus forming a polymer solution and the particles of the filler are dispersed in the polymer solution,
wherein the piezoelectric ink comprises between about 0.1 and about 0.4 g of piezoelectric composite per mL of piezoelectric ink.

Herein, a "piezoelectric ink for solvent-cast 3D printing" is an ink that is useful for manufacturing a piezoelectric 3D printed material. The ink in itself is not necessarily piezoelectric.

The solvent may be any highly volatile solvent capable of dissolving the polymer (but not the particles) and that can then be removed. In preferred embodiments, the solvent is DMF (dimethyl formamide), DMSO (dimethyl sulfoxide), NMP (N-methyl-2-pyrrolidone), DMAc (dimethyl acetamide), acetone, butanone, tetrahydrofuran, cyclohexanone, methyl ethyl ketone, or mixtures thereof. In a most preferred embodiment, the solvent is a mixture of DMF, acetone, and DMSO, preferably wherein the volume % of DMF is between about 10 and about 60, the volume % of acetone is between about 30 and about 80, and the volume % of DMSO is between about 0 (non-inclusive) and about 10. In more preferred embodiments, the volume % of DMF is between about 30 and about 50, the volume % of acetone is between about 50 and about 70, and the volume % of DMSO is between about 2 and about 8. In a most preferred embodiment, the volume % of DMF is about 38, the volume % of acetone is about 57%, and the volume % of DMSO is about 5.

In embodiments, the piezoelectric composite concentration in the ink is:
  about 0.1 g/mL, about 0.2 g/mL, about 0.25 g/mL, or about 0.3 g/mL or more and/or
  about 0.4 g/mL, about 0.35 g/mL, about 0.3, or about 0.25 g/mL or less,
wherein g/mL represents the weight of piezoelectric composite per mL of piezoelectric ink. It should be noted that high concentration inks may have an increased tendency to clog the nozzle of the 3D printer during printing, while low concentration inks may tend to be runny when used.

In embodiments, the above composite and ink further comprise one or more additives. Non-limiting examples of such additives include:
  pigments to change their color,
  short carbon fibers, fiberglass, and/or boron nitride to change their mechanical properties, and/or
  carbon black spheres, graphene, silver nanotubes, copper, and/or nickel nanotubes to change their electrical properties.

3D Printer Ink Cartridge

In another aspect, the present invention provides a 3D printer ink cartridge, the cartridge comprising a container having an ink outlet, the container containing the piezoelectric ink as described in the previous section.

In embodiments, the cartridge is adapted to be installed on a 3D printer.

In embodiments, the cartridge is adapted to be fitted to a nozzle for delivering the ink, so that, for ink dispensing, the ink is extruded through the ink outlet and through the nozzle.

In embodiments, the cartridge is designed so that when a pressure is applied by a 3D printer, the ink is extruded through the ink outlet.

Methods of Manufacture of the Piezoelectric Ink

In another aspect, the present invention provides a method of manufacture of the above piezoelectric ink, the method comprising the steps of:
  a) providing a piezoelectric composite as defined above, and
  b) sonicating said piezoelectric composite with a solvent to form a suspension of the filler in a solution of the polymer.

In embodiments of this method, providing step a) includes the method of manufacture of a piezoelectric composite described in the previous section.

The step of sonicating the mixture in step b) is carried out until complete dissolution of the polymer in the piezoelectric composite.

Alternatively, the ink can be prepared using the method of manufacture of the piezoelectric composite described in the previous section with the proviso that the drying step is omitted.

In both these methods, the filler, polymer, piezoelectric composite and solvent, their concentrations, their preferred embodiments, etc. are as described in the section "Piezoelectric Ink".

Method of Manufacturing a Piezoelectric Solvent-Cast 3D Printed Material

The above ink can be used to produce a 3D printed material via solvent cast 3D printing.

In solvent cast 3D printing (also called solvent-evaporation assisted 3D printing), an ink containing the solution of a polymer or its composite in a volatile solvent is deposited in a controlled pattern using a 3D printer. To make a solvent-cast 3D printed structure, an ink is extruded through a moving nozzle, thereby depositing the ink in the desired pattern. Usually but not necessarily, this pattern is multilayered. After extrusion, the solvent from the ink quickly evaporates (generally at room temperature), thus producing a solid 3D printed structure.

The resulting material obtained by such 3D printing is the piezoelectric composite, but shaped into a different shape by the 3D printer.

In another aspect, the present invention therefore provides a method of manufacturing a piezoelectric 3D printed material, the method comprising the steps of:
  a) feeding a piezoelectric ink as defined above to a nozzle of a 3D printer,
  b) extruding the ink through the nozzle into a pattern; and
  c) allowing evaporation of the solvent, thereby providing the piezoelectric 3D printed material.

In embodiments of both the above methods, the piezoelectric composite and ink may be fabricated using the methods of manufacture described in the previous sections.

In embodiments of this method, the piezoelectric ink is fed to the nozzle from an ink cartridge, a syringe barrel, or a reservoir.

It is to be understood that solvent evaporation (in step c) typically begins as soon as the ink is extruded in step b).

The speed of the extrusion depends on many interrelated ink- and printer-related factors. These factors include the inner dimensions of the nozzle (or its diameter, if the nozzle is circular), the applied pressure, the displacement speed of the nozzle, the volatility of the solvent, the piezoelectric composite's filler:polymer weight ratio, concentration of piezoelectric composite, and the viscosity of the ink. For any given ink/composite and desired nozzle diameter, the remaining printer-related factors are adjusted to allow successful deposition into the desired pattern.

Exemplary printing conditions include:
  an applied pressure between about 100 and about 4000 kPa,
  a displacement speed of the nozzle ranging from about 0.1 to about 30 mm/sec; and/or
  an inner diameter of nozzle between about 10 and 3000 µm, for example of about 30, about 100, about 150, about 200, about 250, about 330, about 410, about 640, about 840, about 1600 or about 2540 µm.

In the above method, the solvent-cast 3D printing can be assisted by electric field poling. Electric field poling-assisted 3D printing involved 3D printing under an electric field to increase the piezoelectric properties of the 3D printed material. In this process, the ink is simultaneously mechanically stressed in-situ by the leading nozzle and electrically poled by applying an electric field between nozzle tip and printing bed. Therefore, in embodiments of step b) of the above method, the ink is extruded onto a printing bed and an electric field is applied between the nozzle and the printing bed. In alternative embodiments, the solvent-cast 3D printing is not assisted by electric field poling.

Method of Manufacturing a Piezoelectric Fused Deposition Modeling (FDM) 3D Printed Material The above piezoelectric composite can be used as feedstock to produce a 3D printed material via fused deposition modeling (FDM) 3D printing. In preferred embodiments, the 3D printed material is a piezoelectric 3D printed material.

In fused deposition modeling 3D printing, a material is softened or molten and deposited in a controlled pattern using a 3D printer. A 3D printer is a computer-controlled robot that is able to create a 3D object, usually from a model designed by a computer aided design (CAD), by depositing successive layers of a material. To make a fused deposition modeling 3D printed structure, the softened or molten material is extruded through a moving nozzle, thereby depositing the material in the desired pattern. Usually but not necessarily, this pattern is multilayered. After extrusion, the material cools and hardens thus producing a solid 3D printed structure.

The resulting material obtained by such 3D printing is the piezoelectric composite, but shaped into a different shape by the 3D printer.

In another aspect, the present invention therefore provides a method of manufacturing a 3D printed material, the method comprising the steps of:
  a) feeding a piezoelectric composite as defined above to a nozzle of a 3D printer,
  b) extruding through the nozzle into a pattern,
    wherein the piezoelectric composite fed to the nozzle is softened or molten and/or the nozzle is heated so as to melt or soften the piezoelectric composite; and
  c) allowing cooling and hardening of the piezoelectric composite into the pattern, thereby providing the 3D printed material.

In embodiments of the above method, the FDM 3D printing can be assisted by electric field poling to increase the piezoelectric performances of the material. Therefore, in embodiments of step b) of the above method, the composite is extruded onto a printing bed and an electric field is applied between the nozzle and the printing bed. In alternative preferred embodiments, however, the FDM 3D printing is not assisted by electric field poling.

In embodiments, the above method may further comprise one or more post-printing process destined to increase the piezoelectric performances of the material, such as mechanical stretching and/or annealing. In alternative preferred embodiments, however, the method does not comprise such post-printing process.

As shown in the Examples below, the use of ionic liquid-modified multiwalled carbon nanotubes, especially in PVDF, allow to fabricate a piezoelectric 3D printed material by FDM 3D printing technology without requiring additional processes, such electric field poling, mechanical stretching and/or annealing. For example, as shown below, using 1-butyl-3-methylimidazolium hexafluorophosphate-modified multiwalled carbon nanotubes into polyvinylidene fluoride, a piezoelectric filament with a diameter of approximately 1.75 mm with a high polar β-phase (71.29%, calculated from FTIR) was fabricated by FDM 3D printing.

Without being bound by theory, it is believed that in the carbon nanotubes modified with ionic liquid, the ionic liquid serves as a binder, linking the carbon nanotubes (for example MWCNTs) and the piezoelectric polymer (for example PVDF) chains together. It has indeed been observed by the inventors that in the absence of ionic liquid, the piezoelectric property of PVDF/MWCNTs nanocomposites are compromised during FDM because of the high temperature required for softening or melting. It is believed that this is due to the poor compatibility between the carbon nanotubes and the polymer.

Similarly, it was observed by the inventors that PVDF/BaTiO$_3$ nanocomposites which, as demonstrated below, show high piezoelectric property at room temperature (for example when used for solvent-cast 3D printing) do not conserve their piezoelectric property when exposed to the high temperature involved in the FDM 3D printing process. Hence, when using such nanocomposites as a FDM feedstock, one of the abovementioned processes to increase the piezoelectric performances of the material should be used, for example electric field poling.

In preferred embodiments, the filler is carbon nanotubes (preferably multi-walled carbon nanotubes) modified with ionic liquid, preferably the ionic liquid is 1-butyl-3-methylimidazolium hexafluorophosphate. In such embodiments, the FDM 3D printing is preferably not assisted by electric field poling and/or the method does not comprise the above post-printing processes as these are then not required to obtain a piezoelectric 3D printed material, and/or any other process to increase the piezoelectric performances of the material (as the material as printed is piezoelectric).

In other embodiments, the filler is barium titanate (BaTiO$_3$), carbon nanotubes (single-walled, double-walled, multi-walled), boron nitride nanotubes, cellulose, clay (intercalated, exfoliated), CoFe$_2$O$_4$, graphene, graphene oxide, CuCl$_2$, iron oxide, ferrite, lead zirconium titanate, magnetic ferrite, MnCl$_2$, NiFe$_2$O$_4$, polyethyleneimine, PbMg$_{1/3}$Nb$_{2/3}$O$_3$(PMN)—PbTiO$_3$(PT), quantum dots, silver, TiO$_2$, vanadium pentoxide, zinc oxide, or combinations thereof. In such embodiments, the FDM 3D printing may if desired be assisted by electric field poling and/or the method preferably comprises the above post-printing processes so as t to increase the piezoelectric performances of the 3D printed material.

As noted above, the piezoelectric composite can be conveniently formed into a wire (preferably spun into a spool), which can be fed to the 3D printer as needed. In embodiments, the piezoelectric composite is thus fed to the nozzle as a wire unspun, as needed, from a spool.

It is to be understood that cooling and hardening (in step c) typically begins as soon as the composite is extruded in step b).

In embodiments of the above method, the piezoelectric composite may have been fabricated using the methods of manufacture described in the previous sections.

The piezoelectric composite fed to the nozzle in step a) may be the piezoelectric composite as defined in the previous section. It may also be fed to the nozzle as part of a bifunctional material described below. In other words, both the above piezoelectric composite and the bifunctional material described below can be used as a feedstock to produce a 3D printed material via fused deposition modeling (FDM) 3D printing according to the present method.

The speed of the extrusion depends on many interrelated composite- and printer-related factors. These factors include the inner dimensions of the nozzle (or its diameter, if the nozzle is circular), the applied pressure, the displacement speed of the nozzle, the piezoelectric composite's filler: polymer weight ratio, and the viscosity of the softened/molten composite. For any given composite and desired nozzle diameter, the remaining printer-related factors are adjusted to allow successful deposition into the desired pattern.

Exemplary printing conditions include:
- a printing bed temperature between 20 and 120, preferably 80° C.,
- an extrusion temperature between 180 and 270, preferably 230° C.,
- an infill percentage between 10 and 100%, preferably 100%,
- an infill angle between 0 and 90 deg., preferably (±)45°,
- a number of shell between 1 and 10, preferably 2,
- an applied pressure between about 100 kPa and about 4 MPa, preferably 1 MPa,
- a displacement speed of the nozzle ranging from about 0.1 to about 50 mm/sec, preferably about 43 mm/sec (i.e. 2600 mm/min); and/or
- an inner diameter of nozzle between about 10 and about 3000 µm, for example of about 30, about 100, about 150, about 200, about 250, about 330, about 410, about 640, about 840, about 1600 or about 2540 µm.

Piezoelectric 3D Printed Material

In another aspect, the present invention provides a piezoelectric 3D printed material comprising the above piezoelectric composite.

This material can be manufactured by 3D printing, preferably according to any of the methods described in the previous sections (solvent-cast and FDM 3D printing), from the piezoelectric ink/composite described above. Thus, the nature of the piezoelectric composite, piezoelectric ink, preferred concentrations, preferred weight ratios, optional additives, etc. are as described above.

In fact, the piezoelectric 3D printed material is roughly equivalent to the above piezoelectric composite, but shaped into a given 3D shape via 3D printing.

The 3D printed material is piezoelectric. This makes the material useful for many applications.

The 3D printed material can be of any 3D shape. In embodiments, the 3D printed material is in the form of a wire (or any other elongated thin cylindrical shape), which may be spun into a spool. As will be discussed below, this last form is convenient to feed a 3D printer nozzle, when the 3D printed material is used for 3D printing by fused deposition modeling (FDM).

Bifunctional Material

In another aspect, the present invention provides a bifunctional material comprising the above piezoelectric composite with one or more, preferably at least two, conductive electrodes adjacent to the piezoelectric composite.

This material comprises the piezoelectric composite described above. Thus, the nature of the piezoelectric composite for 3D printing, its preferred embodiments, optional additives, etc. are as described above.

The material is bifunctional because it is in part piezoelectric and in part conductive. In fact, in this material, the piezoelectric part of the material generates an electric charge in response to applied mechanical stress and the integrated electrode(s) carry the charge and allows connection to an external circuit.

The ratio of piezoelectric material to conductive material can be varied. The presence of more piezoelectric material means a greater charge is generated. However, the electrode(s) should be a) located close enough to collect that charge and b) connected through the material so as to form a connection and be able to transport that charge. In preferred embodiments, the ratio of piezoelectric material to conductive material by weight varies between about 80:20 and about 99:1. As noted above, the amount and position of the conductive material should be sufficient to allow connection of the piezoelectric material to the circuitry. The amount of charge that can be created or collected will also depend on the amount and location of said conductive material.

The bifunctional material, piezoelectric material and the conductive material may also be arranged in any manner, as long as there is sufficient conductive electrode, and it is placed in such a manner, that the piezoelectric material can be connected to circuitry, and that a charge can be collected. For example, if the piezoelectric material is in the form of a cube (or other 3D shape), conductive material could be placed at various points on the top and the bottom of the cube and inside the cube (3D shape). If the piezoelectric material is in the form of a film or a tube, conductive material can be placed on the top and bottom, along the inner and outer edges, and/or inside the film or tube.

Figure 15:
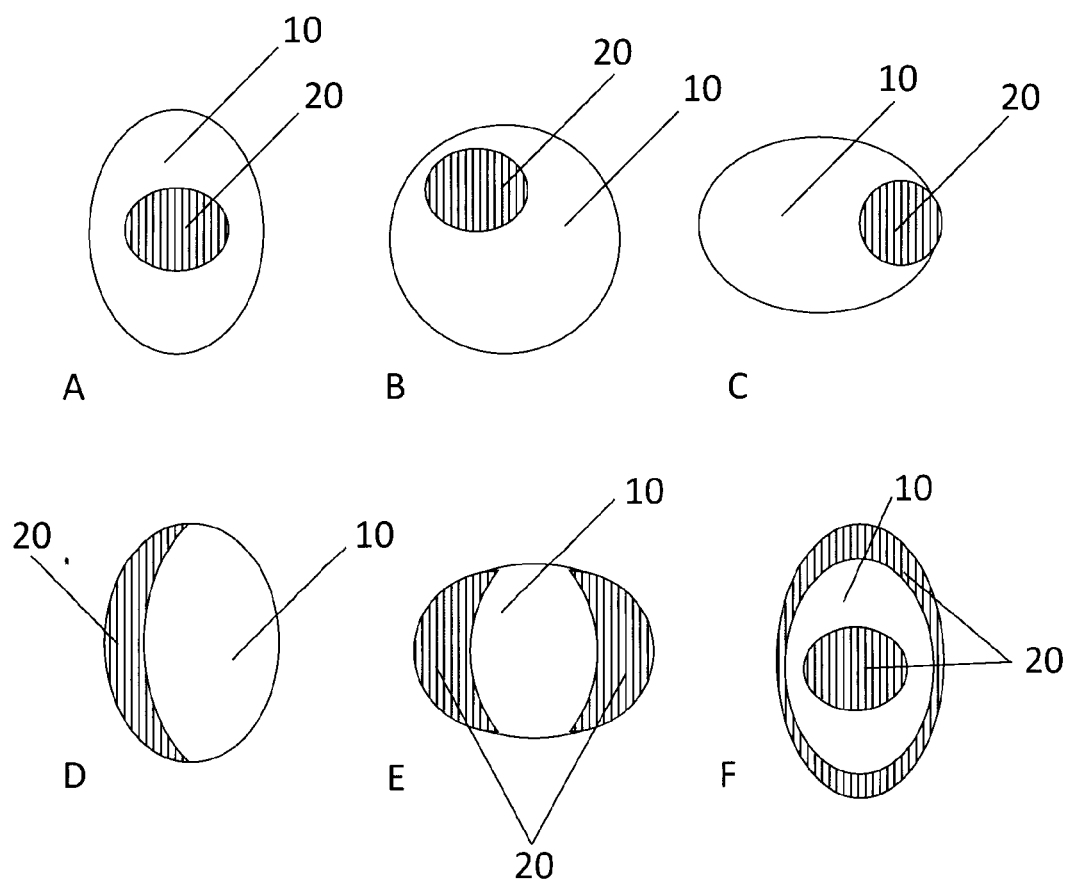
FIG. 15 shows a few possible configurations of how a piezoelectric composite and electrode(s) each occupy part of the cross-section of a wire.
Figure 16:
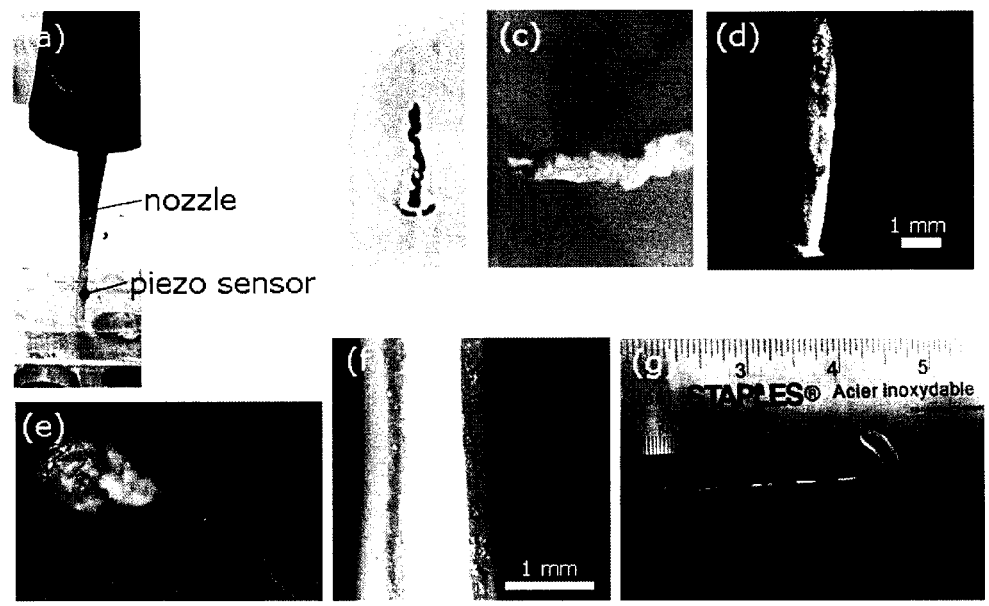
FIG. 16 shows examples of extruded bifunctional materials.

In embodiments, bifunctional material is in the form of a wire (or any other elongated thin cylindrical shape). In such embodiments, both the piezoelectric composite and the electrode(s) are in the form of elongated thin cylinders that extend along the wire length and each occupy part of the cross-section of the wire (or other cylindrical shape). For example, FIG. 15 shows a few possible configurations. In FIG. 15(A), the electrode (20) is concentric with the piezoelectric composite (10). In FIG. 15(B) to (E), these are eccentric, with part of the electrode(s) (20) being at the surface of the wire in 15(C) to (E). In FIG. 15(E), two electrodes (20) laterally sandwich the piezoelectric composite or printed material (10). In FIG. 15(F), two electrodes (20) radially sandwich the piezoelectric composite or printed material (10).

Figure 11:
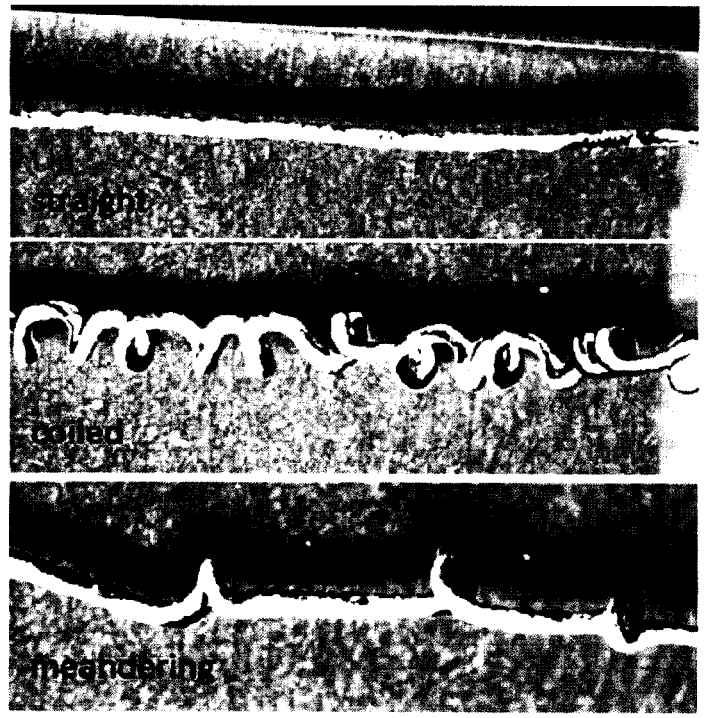
FIG. 11(a) shows straight, coiled and meandering fibers printed using the co-extrusion process.
FIG. 11(b) shows enlarged images of FIG. 11(a) to visualize the separation between the two inks.
Figure 11:
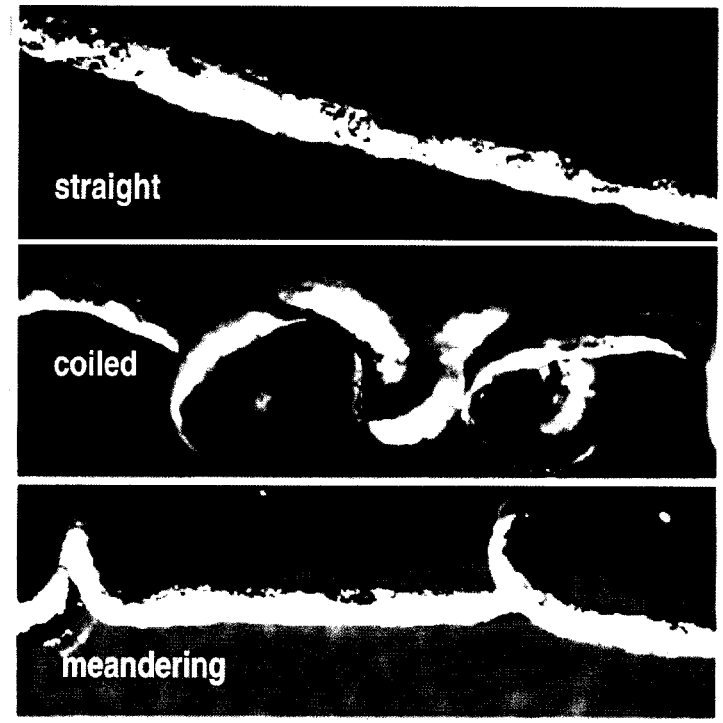
Figure 14:
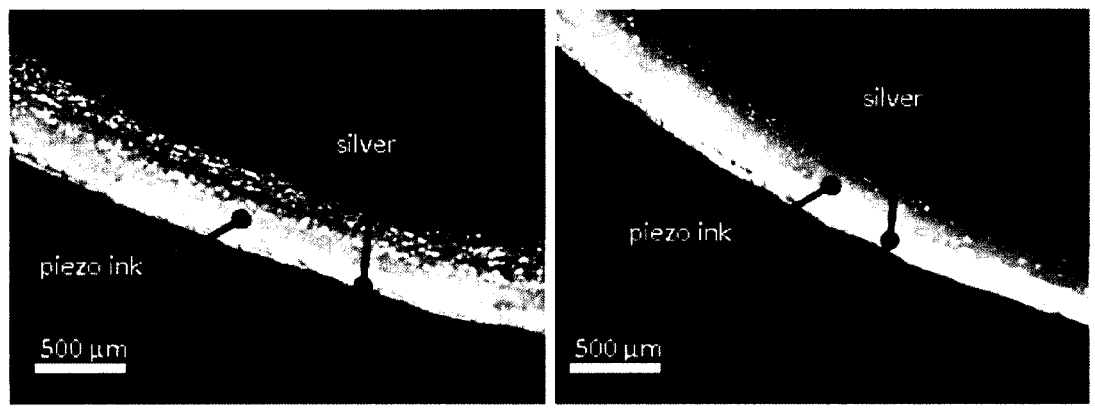
FIG. 14 shows microscopic images of a co-extruded filament sensor from different angles (Image corrections: +40% contrast).

In a more preferred embodiment, the bifunctional material is in the form of a wire, wherein the piezoelectric material is laterally sandwiched by two electrodes, as shown in FIGS. 11 and 14.

In all embodiments where the bifunctional material is in the form of a wire (or any other elongated thin cylindrical shape), it may be spun into a spool. As will be discussed below, this last form is convenient to feed a 3D printer nozzle, when the 3D printed material is used for 3D printing by fused deposition modeling (FDM).

The electrodes are made of a conductive composite. Any conductive composite can be used.

In embodiments, the conductive composite is a carbon nanotube based composite (dispersion); a graphene based composite (dispersion); a carbon fiber based composite (dispersion); a silver based composite; a silver nanoparticle based composite (dispersion); a PEDOT:PSS(poly (3,4-ethylenedioxythiophene) and poly (styrene sulfonate)) based composite (dispersion); a copper/copper oxide nanoparticle based composite (dispersion); a gold based composite (dispersion), a polyaniline based composite (dispersion); a conductive hydrogel, or an ITO dispersion.

In embodiments, the conductive composite comprises:
a polymer or a binder, and
particles of a conductive material dispersed in the polymer or binder,
wherein the conductive material is present in a conductive material:polymer/binder weight ratio between about 1:99 and about 95:5, preferably between about 15:85 and about 40:60, and most preferably is about 30:70.

In embodiments, the conductive material is multi-walled carbon nanotubes (CNTs) or silver.

In embodiments, the polymer is PVDF.

In embodiments, the conductive material is present in a conductive material:polymer/binder weight ratio of:
about 1:99, about 15:85, about 30:70, or about 40:60 or more and/or about 95:5, about 75:25, about 50:50, about 40:60, or about 30:70, or less.

In a preferred embodiment, the conductive composite is obtained from Silver Print™ ink (MG Chemicals) (CAT #842), while preferably, the piezoelectric composite has a filler:polymer weight ratio between about 35:65 and about 65:35, for example of about 50:50, wherein the filler is preferably $BaTiO_3$ nanoparticles and the polymer is preferably PVDF.

Applications of the Piezoelectric Composite, Piezoelectric 3D Printed Material, and Bifunctional Material In embodiments, the piezoelectric composite, the piezoelectric 3D printed material and the bifunctional material are used in sensors for temperature, strain, touch, pressure, motion, flow, and/or infra-red radiation; scaffolds (in tissue engineering); capacitors; antenna; energy harvesting from vibrations, flow, rain, wind, and/or bodily motions; ultrasonic sensors/transducers; force measurements for biological applications; hearing aids; robotic hands with embedded sensors; structural health monitoring, such as combined sensing and actuation; coatings that are chemically inert and/or UV resistant; and smart textiles, woven and non-woven.

Figure 7:
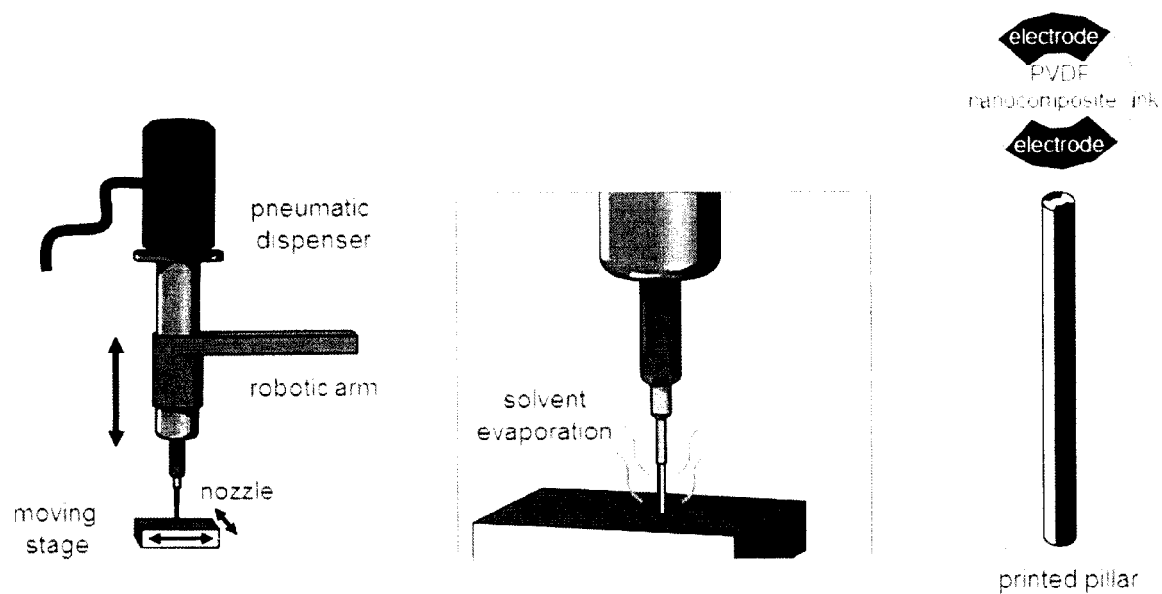
FIG. 7 shows a robotic arm printing a (co-extruded) whisker sensor in the form of a vertical pillar.

In preferred embodiments, the piezoelectric composite, the piezoelectric 3D printed material and the bifunctional material are used in a touch or flow sensor, preferably a touch sensor. In a more preferred embodiment, the bifunctional material is used as a touch or flow sensor, preferably a touch sensor. FIG. 7 shows the printing of such a sensor.

Methods of Manufacturing the Bifunctional Material

In another aspect, the present invention provides a method of manufacturing the above bifunctional material.

This method relies on the above "Methods of Manufacturing a Piezoelectric Solvent-Cast 3D Printed Material". It differs from it in the fact that two different inks, the piezoelectric ink as defined above and a conductive ink, are printed together to form the bifunctional material.

In embodiments, the conductive ink comprises:
a volatile solvent, and
the conductive composite described above mixed with the solvent(s) such that the particles of the conductive material are dispersed in a solution of the polymer/binder,
wherein the conductive material is present in a conductive material:polymer/binder weight ratio between about 1:99 and about 95:5, preferably between about 15:85 and about 40:60, and most preferably is about 30:70.

This conductive ink comprises the conductive composite described above. Thus, the nature of the conductive composite, its preferred embodiments, etc. are as described above.

In embodiments, the total concentration of polymer/binder and conductive material in the conductive ink is between about 0.05 and about 0.5 g/mL. In preferred embodiments, it is between about 0.1 and about 0.40 g/mL. In more preferred embodiments, it is about 0.35 g/mL.

The solvents of the conductive ink can be the same as those for the piezoelectric ink as described in the section "Piezoelectric Ink". In preferred embodiments, the solvent is a mixture of DMF, acetone, and DMSO. In more preferred embodiments, the volume % of DMF is between about 10 and about 60, the volume % of acetone is between about 30 and about 80, and the volume % of DMSO is between about 0 (non-inclusive) and about 10. In even more preferred embodiments, the volume % of DMF is between about 30 and about 50, the volume % of acetone is between about 50 and about 70, and the volume % of DMSO is between about 2 and about 8. In a most preferred embodiment, the volume % of DMF is about 38, the volume % of acetone is about 57%, and the volume % of DMSO is about 5.

In preferred embodiments, the conductive ink and the piezoelectric ink contain the same solvent.

In a most preferred embodiment, the conductive ink is Silver Print™ (MG Chemicals) (CAT #842).

In preferred embodiments, the conductive ink and the piezoelectric ink have similar rheological properties. This allows simultaneously co-extruding the conductive ink and the piezoelectric ink from a same nozzle (e.g. of a 3D printer). Indeed, as the inks share similar rheological properties, they can be fed together to the nozzle without mixing and can thus be extruded simultaneously. The viscosities of the inks can be tailored by varying the ratio of conductive material and filler, as well as the concentration of composite in the ink. One example of how to achieve similar rheological properties is, if the conductive ink contains a polymer, to ensure the conductive ink and the piezoelectric ink contain the same polymer.

As mentioned above, the piezoelectric and conductive material is obtained by printing the above two inks. This can be done by co-extruding the two inks simultaneously (during the extruding step). This can also be achieved by using two different nozzles each dispensing one of the inks. This can also be achieved using an array of nozzles. Preferably, this can be done by dispensing both inks with a single nozzle. In embodiments, this is achieved by feeding one side of the nozzle with one of the inks and the other side with the other ink, or by feeding the sides of the nozzle with one of the inks and the middle of the nozzle with the other ink. This is easily achieved by providing the conductive ink side-by-side with the piezoelectric ink in a syringe barrel feeding the nozzle. The inks can also be placed concentrically or in any other configurations, including those shown in FIG. 15. As the inks share similar rheological properties, they do not mix and can be extruded simultaneously, and therefore part of the printed material is piezoelectric while the other part is conductive.

Advantages of the Invention and Other Applications

In one or more embodiments, the present invention may present one or more of the following advantages.
  a) Piezoelectric properties of the ball-milled nanocomposites with 10:90 $BaTiO_3$ nanoparticle filler:PVDF polymer weight ratio are around 18 pC/N, comparable to commercial PVDF based sensors fabricated by spin coating followed by stretching and poling.
  b) 3D sensors fabricated by solvent-cast 3D printing of the PVDF based nanocomposites generate more voltages upon deformation than their 2D counterparts.
  c) The process is highly flexible and thus, can be applied to any composite/copolymer formulation: any type of filler material, any concentration and any other polymer matrix.

Self-supporting structures, and custom shaped sensors and actuators, can be manufactured.

Further, in one or more embodiments, the present invention may present one or more of the following advantages:

Both the electrodes and piezoelectric structures are fabricated at the same time. A simple process to fabricate piezoelectric structures with electrodes in a single step is provided. In preferred embodiments, it does not require the use of complicated rolls/dies or dual dispenser nozzle systems, which conventionally complicate the printing processes. Also, this one-step fabrication reduces the chances of delamination between the two material interfaces as the two materials solidify together. The use of a single polymer in both inks allows the polymer to act as a binder, which can further reduce delamination or contact breaks.

In addition, when dealing with complicated shapes, an embodiment of the above process allows electrode deposition on previously non-reachable regions, as in the case of 3D electroactive scaffolds, where the deposition of electrodes is normally impossible in such regions. This simultaneous electrode formation also allows the connection of these piezoelectric structures to the electrical circuitry.

Further, one or more embodiments of this process may present the following advantages:
a) Multidimensional sensors can be fabricated in a single step
b) The process can be applied to any material system
c) High throughput, faster and customized fabrication
d) The process can be extended to any size scale
e) Piezoelectric structures can be fabricated with one single step
f) Electrodes can be formed on any surface of the structure
g) Electrode thicknesses can be controlled. Electrode locations can be varied from opposing external as seen in FIG. 7 to concentric
h) Electrodes can form the integral part of the structure and govern the boundary conditions of deformation
i) Various ink formulations with different filler/polymer systems can be used
j) Any type of conductive inks can be used if the viscosities can be tailored
k) Any kind of piezoelectric inks can be used if the viscosities can be tailored
l) Faster fabrication of the sensors
m) Poling apparatus can be easily attached in the system if higher piezoelectricity is desired in the fabricated structures.

In some embodiments, a piezoelectric material can be produced by fused deposition modeling (FDM) 3D printing technology without any additional required process, such as high electric field poling, mechanical stretching and annealing, which is economical and efficient. The ability of FDM 3D printing technology to pattern the piezoelectric nanocomposites filament into a desired shape should improve the electromechanical response and also increase its range of its applications. Also, in FDM 3D printing, no harsh solvent is required.

Definitions

The use of the terms "a" and "an" and "the" and similar referents in the context of describing the invention (especially in the context of the following claims) are to be construed to cover both the singular and the plural, unless otherwise indicated herein or clearly contradicted by context.

The terms "comprising", "having", "including", and "containing" are to be construed as open-ended terms (i.e., meaning "including, but not limited to") unless otherwise noted.

Recitation of ranges of values herein are merely intended to serve as a shorthand method of referring individually to each separate value falling within the range, unless otherwise indicated herein, and each separate value is incorporated into the specification as if it were individually recited herein. All subsets of values within the ranges are also incorporated into the specification as if they were individually recited herein.

All methods described herein can be performed in any suitable order unless otherwise indicated herein or otherwise clearly contradicted by context.

The use of any and all examples, or exemplary language (e.g., "such as") provided herein, is intended merely to better illuminate the invention and does not pose a limitation on the scope of the invention unless otherwise claimed.

No language in the specification should be construed as indicating any non-claimed element as essential to the practice of the invention.

Herein, the term "about" has its ordinary meaning. In embodiments, it may mean plus or minus 10% or plus or minus 5% of the numerical value qualified.

Unless otherwise defined, all technical and scientific terms used herein have the same meaning as commonly understood by one of ordinary skill in the art to which this invention belongs.

Other objects, advantages and features of the present invention will become more apparent upon reading of the following non-restrictive description of specific embodiments thereof, given by way of example only with reference to the accompanying drawings.

Description of Illustrative Embodiments

The present invention is illustrated in further details by the following non-limiting examples.

EXAMPLE 1

Piezoelectric Nanocomposite

1. Experimental Details

Piezoelectric nanocomposites were fabricated by mixing a filler with a polymer. Piezoelectric inks for 3D printing were then fabricated by mixing the piezoelectric nanocomposite in a mixture of solvents. 3D printed structures, including sensors, were then fabricated using the piezoelectric inks.

1.1 Fabrication of Piezoelectric Composites

A mixture of Barium titanate nanoparticles ($BaTiO_3$; 99.9% purity, 100 nm; Nanostructured & Amorphous materials Inc.; 0.2 g) and PVDF (Sigma Aldrich, 2 g) was sonicated with DMF (Alfa Aesar™) for 2 h. The solution was then mixed in a high energy shaker ball-mill (SPEX SamplePrep™ 8000 Series Mixer/Mill™) at a rate of 1080 cycles per minute for 20 minutes. The number of zirconia balls was chosen to match the weight of the solution. The solution was dried in a vacuum oven at 60° C. for 12 h to remove all the DMF. This resulted in a piezoelectric nanocomposite with a filler:polymer weight ratio of 10:90. In addition, this same process was used to make two additional piezoelectric nanocomposites, wherein the filler:polymer weight ratio was 5:95 and 15:85.

1.2 Fabrication of Piezoelectric Ink for 3D Printing

Piezoelectric Inks for 3D printing were prepared using the composites obtained in 1.1.

Each dried nanocomposite (2 g) was sonicated with DMF (4 mL), acetone (BDH; 6 mL) and DMSO (0.6 mL) until complete dissolution of the polymer in the solvents was achieved, thereby forming piezoelectric inks with nanocomposite concentrations of 0.2 g/mL. For apparent viscosity tests and printing 3D structures, 2.5 g and 3.0 g of the ball-milled nanocomposite with the 10:90 filler:polymer weight ratio were also dissolved to form 0.25 and 0.3 g/mL solutions, respectively.

1.3 Process for 3D Printing a Piezoelectric Structure

A process for 3D printing using the piezoelectric inks obtained in 1.2 above is as follows: the inks were poured into syringe barrels (3 mL) and placed into a pneumatically operated dispensing system (HP-7X, EFD) to apply precise pressure for printing. A robotic head (I&J2200-4, I&J Fisnar Inc.), controlled by a commercial software (JR Points™ for Dispensing, Janome™ Sewing Machine) further enabled the deposition of the inks on a movable stage. FIG. 1 shows the printing process of the 3D sensor.

Figure 2:
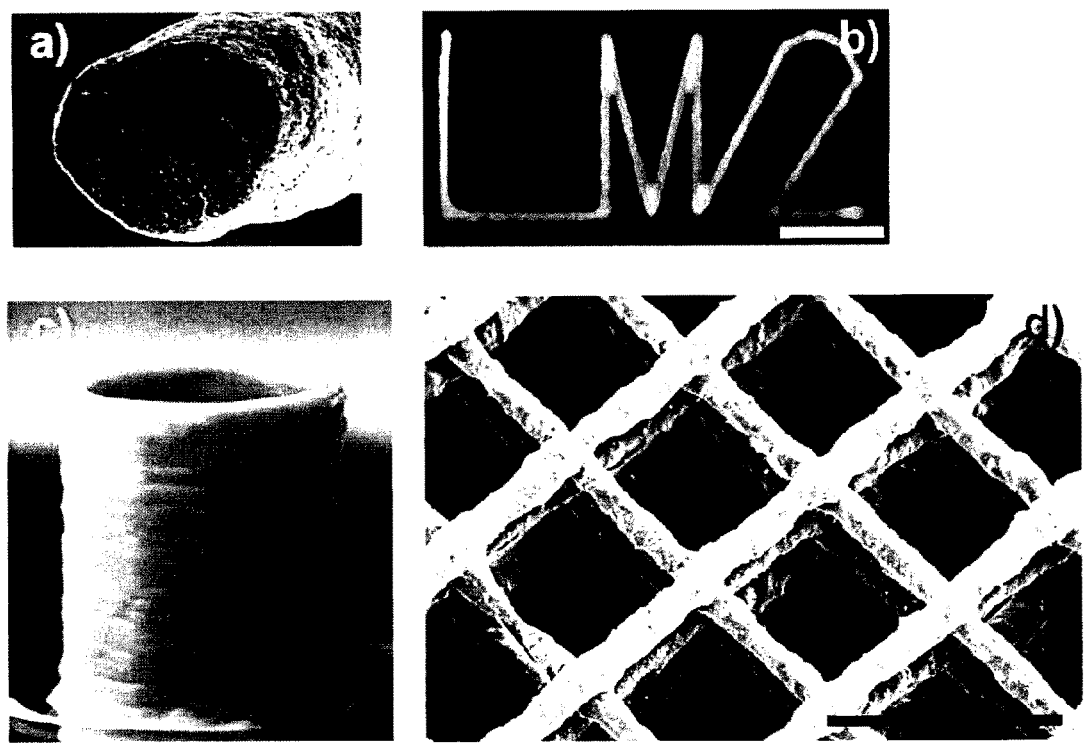
FIG. 2 shows structures fabricated using a ball-milled nanocomposite (10:90, BaTiO$_3$ nanoparticle filler:PVDF polymer weight ratio) solution.

To fabricate 1D filaments, 2D films, and 3D layer-by-layer and self-supporting structures, the different solution concentrations (0.2, 0.25, and 0.3 g/mL) of the 10:90 filler: polymer weight ratio nanocomposite were used with varying extrusion pressures, P (100 to 4000 kPa), robot speeds (0.1 to 30 mm s$^{-1}$) and nozzle sizes (i.e., inner diameter=100 µm) on a glass substrate. FIG. 2 shows various shapes and structures fabricated using the 10:90 filler:polymer weight ratio PVDF/BaTiO$_3$ nanocomposite ink with a concentration of 0.2, 0.25 and 0.3 g/mL.

1.4 Fabrication of a Touch Sensor

Three types of film sensors were fabricated using the piezoelectric inks with a concentration of 0.2 g/mL of piezoelectric nanocomposites with filler:polymer weight ratios of 5:95, 10:90, and 15:85.

Figure 6:
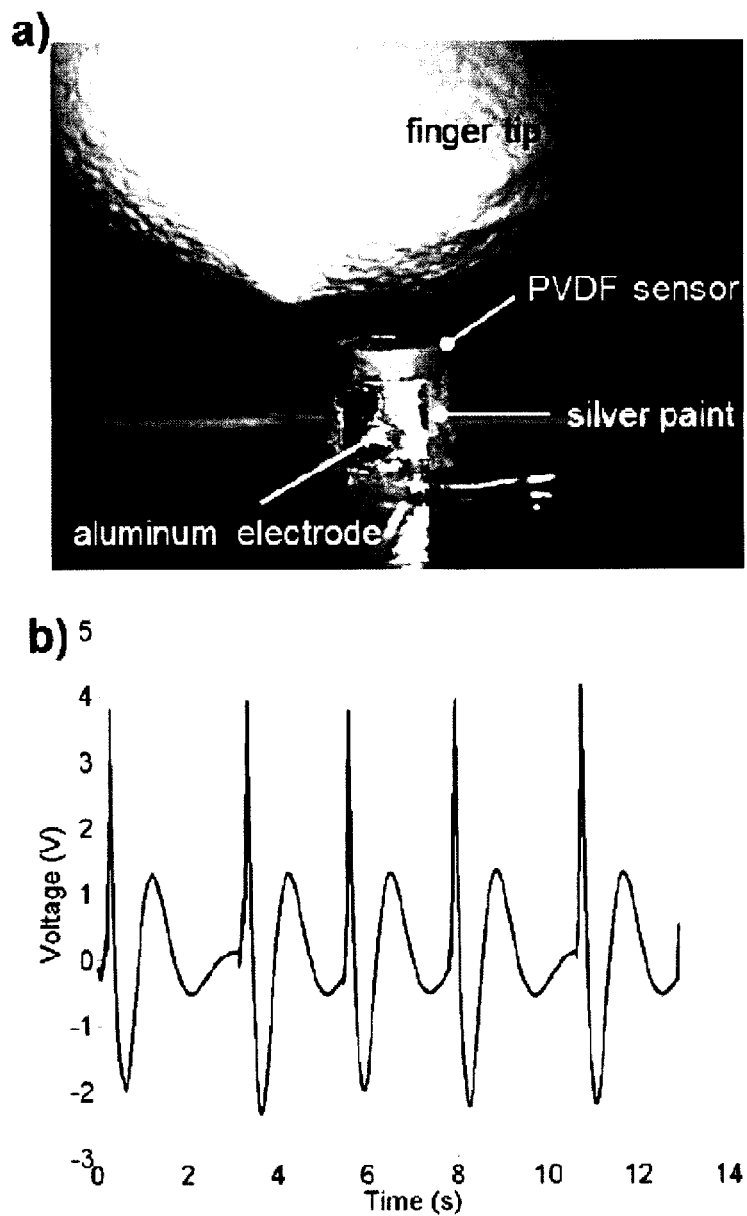
FIG. 6(a) shows a photograph of an electroded 3D cylindrical sensor shown along with a finger (top of the picture)
FIG. 6(b) shows peak-to-peak piezoelectric voltage output of the 3D cylindrical sensor upon five consecutive finger taps.

In addition, a touch sensor was fabricated in the form of a cylinder with the piezoelectric ink made using the 0.25 g/mL solution of the 10:90 filler:polymer weight ratio nanocomposite as shown in FIG. 6a. The cylinder has 70 layers and is about 3 mm in height and 3 mm in diameter. Commercial conductive silver paste (Sigma Aldrich) was painted on both sides of the cylinder to form the internal and external electrodes. Electrical connections were made using a conducting aluminum tape (3M).

1.5 Results 1.5.1 Piezoelectric Composites

Figure 3:
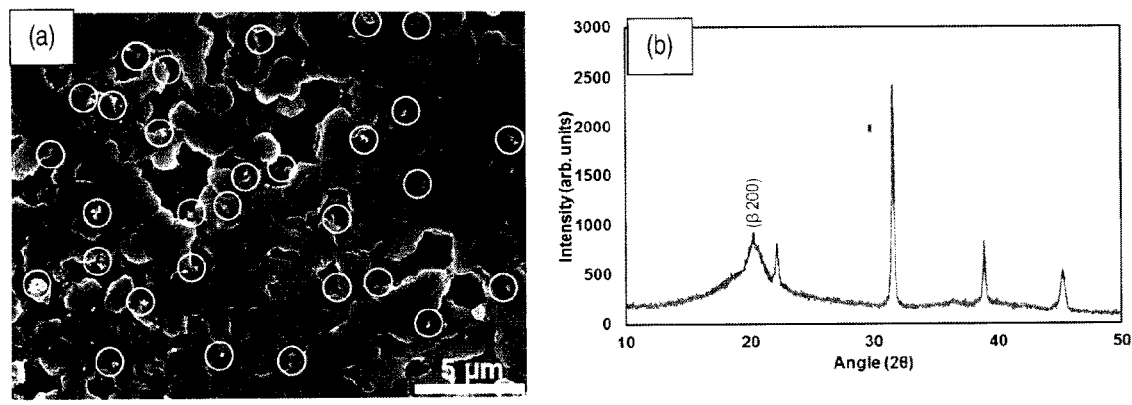
FIG. 3(a) shows a SEM image of the morphology of the nanocomposites.
FIG. 3(b) shows an X-ray diffractogram of the PVDF nanocomposite.

The SEM images in FIG. 3(a) show the morphology of the nanocomposite with a 10:90 filler:polymer weight ratio: large crystallites and pore sizes reveal high crystal growth in the case of the ball-milled nanocomposite film. A uniform dispersion of nanoparticle agglomerates (highlighted by circles) can be seen. It has been reported that dispersed agglomerates of nanoparticles lead to an increased space charge density which in turn leads to higher piezoelectric properties, which was also the case herein.

FIG. 3(b) shows an X-ray diffractogram of the piezoelectric nanocomposite film with a 10:90 filler:polymer weight ratio. The peaks at 18.7°, 20.04° and 26.5° belonging to α-phase of PVDF were absent. The presence of β-phase featured by a single broad peak at 2-theta value of 20.26° corresponding to the (200) and (110) planes led to an inference that nanocomposite films prepared by ball-milling approach crystallized only in β-phase. The absence of any phase other than the β-phase can be explained by the efficiency of the nanoparticle-agglomerates in case of the nanocomposites in preventing the reversion to α-phase during the crystallization process.

1.5.2 Touch Sensors

Figure 4:
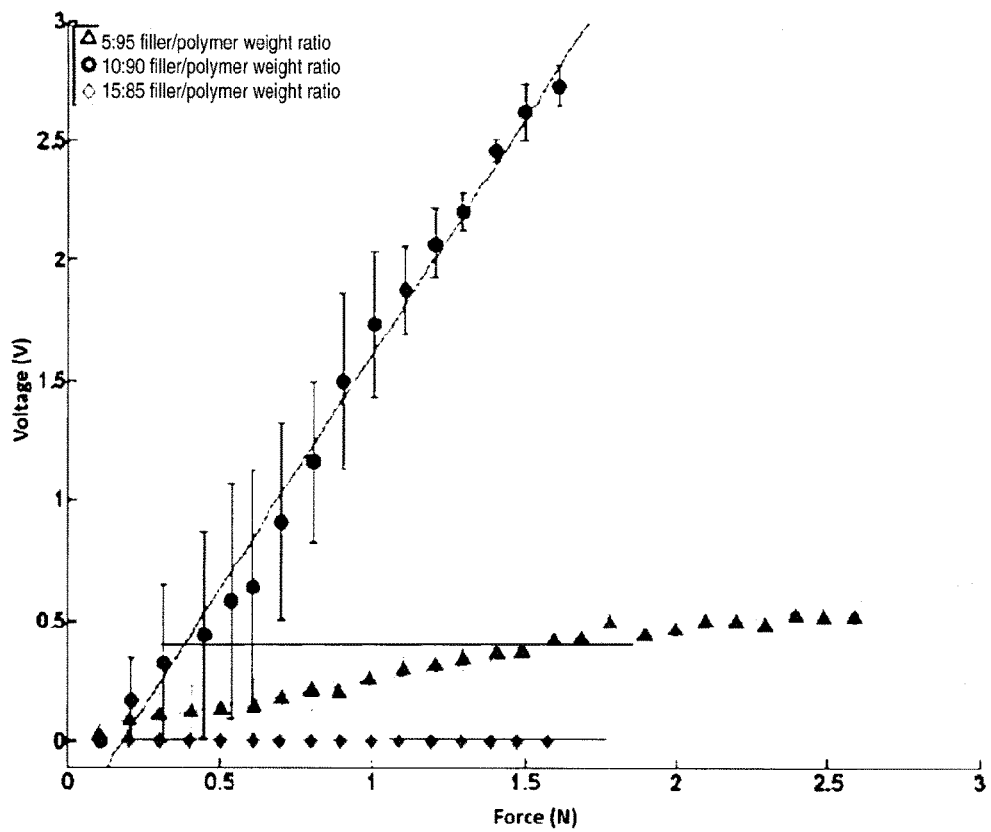
FIG. 4 shows peak-to-peak piezoelectric voltages as a function of force at an excitation frequency of 45 Hz for nanocomposites with BaTiO$_3$ nanoparticle filler:PVDF polymer weight ratios of about 5:95, about 10:90, and about 15:85.

Regarding the three types of sensors fabricated using the piezoelectric inks with a concentration of 0.2 g/mL of piezoelectric nanocomposites with filler:polymer weight ratios of about 5:95, about 10:90, and about 15:85, a dynamic mechanical analyzer (DMA, Q800; TA instruments) was used in tension mode for piezoelectric analyses to characterize the sensor materials. Piezoelectric charges obtained from the sensors were converted into voltages using a charge amplifier (MEAS specialties) and recorded with a data acquisition system. The three types of sensors (electrode area=10×5 mm on each side) were tested with a force ramp of 0.1 N and an excitation frequency of 45 Hz. FIG. 4 shows the voltage outputs of the sensors versus the force applied. All the sensors exhibited linear behavior inherent to piezoelectric materials. The value of $d_{31}$ of the nanocomposite sensor with the 5:95 filler:polymer weight ratio was 2.5 pC/N and for the 10:90 filler:polymer weight ratio was 18 pC/N.

Figure 5:
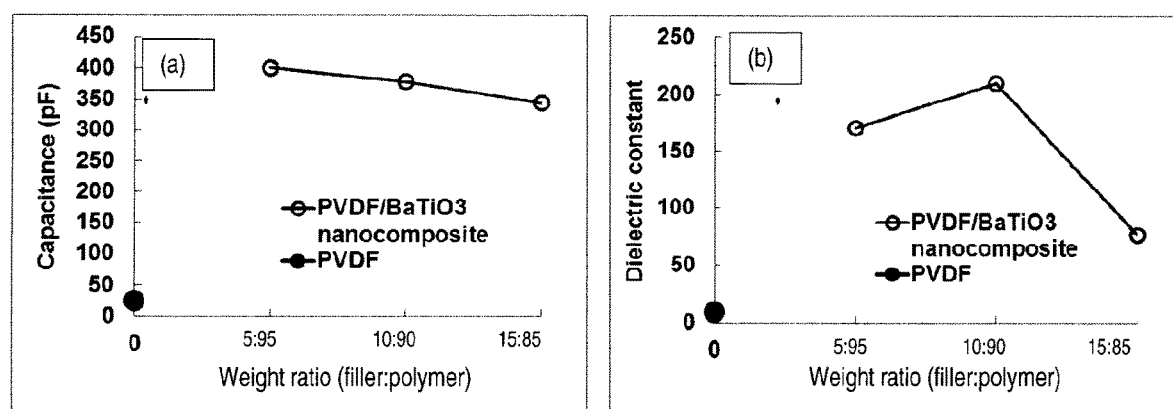
FIG. 5(a) shows capacitance as a function of nanoparticle loading in the PVDF/BaTiO$_3$ nanocomposite.
FIG. 5(b) shows dielectric constant as a function of nanoparticle loading in the PVDF/BaTiO$_3$ nanocomposite.

Ferroelectric properties of the sensors were determined by impedance tests (Agilent analyzer). The values of capacitance and dielectric constant of the sensors were compared with those obtained using a neat PVDF sensor, and are presented in FIGS. 5(a) and 5(b). FIG. 5(a) shows capacitance as a function of nanoparticle loading in the PVDF/BaTiO$_3$ nanocomposite; FIG. 5(b) shows dielectric constant as a function of nanoparticle loading in the PVDF/BaTiO$_3$ nanocomposite.

Regarding the sensor in FIG. 6(a), the sensor was tapped with a finger five times consecutively, the results of which are presented in FIG. 6b. The sensor produced a consistent voltage output around 4 V while touching and about −2 V while releasing. The voltage output generated by the sensor is a consequence of a coupling between various piezoelectric modes (longitudinal as well as shear) as opposed to just the single mode: $d_{31}$, $d_{32}$, $d_{11}$, $d_{15}$, $d_{22}$ or $d_{33}$. Also, as the 3D sensors deform more than their planar counterparts they are envisioned to be more sensitive. Hence, 3D printing opens up a new demographic of versatile, scalable, conformable and application oriented sensors. One can achieve complex 3D piezoelectric shapes with these processes.

EXAMPLE 2

Piezoelectric Sensors

2. Experimental Details 2.1 Printing Material Combination 1

A sensor was also fabricated using both a piezoelectric ink as well as a conductive ink for 3D printing.

Figure 8:
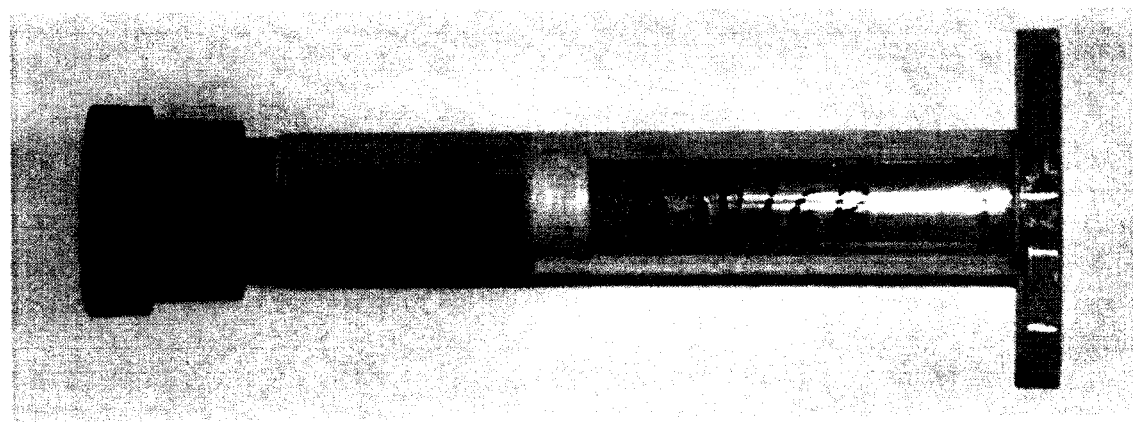
FIG. 8 shows inks after being poured into the syringe.

The conductive and piezoelectric inks were co-extruded from a single syringe. Thus, it was important to have similar rheological properties for the two inks. Three different concentrations: 1.5, 3 and 6 g of BaTiO$_3$ nanoparticles in 0.5 g of PVDF (for use in piezoelectric inks) and 0.1, 0.2 and 0.3 g of multi-walled carbon nanotubes (CNTs) in 0.5 g of PVDF (for use in conductive inks) were investigated. The mixtures were dissolved in 2 mL of DMF, 3 mL of acetone, and 0.3 mL DMSO to form printable inks. The inks were meticulously filled into a 3 mL syringe half/half longitudinally as can be seen in FIG. 8. Similarity in the viscosities help avoid intermixing between the fluids. Comparatively larger extrusion nozzle diameters were chosen in order to obtain a near laminar flow to avoid any turbulence in the fluid motion.

2.1.1 Ink Preparation (i) PVDF/CNT Ink:

0.1, 0.2 and 0.3 g of CNTs were added to 0.5 g of PVDF along with 3 mL acetone, 2 mL DMF and 0.3 mL DMSO. The inks were mixed in a ball-mill mixer for 15 minutes.

(ii) PVDF/BaTiO$_3$ Ink:

1.5, 3 and 6 g of BatiO$_3$ nanoparticles were added to 0.5 g of PVDF along with 3 mL acetone, 2 mL DMF and 0.3 mL DMSO. The inks were mixed in a ball-mill mixer for 15 minutes.

2.1.2 Sensor Fabrication

Figure 9:
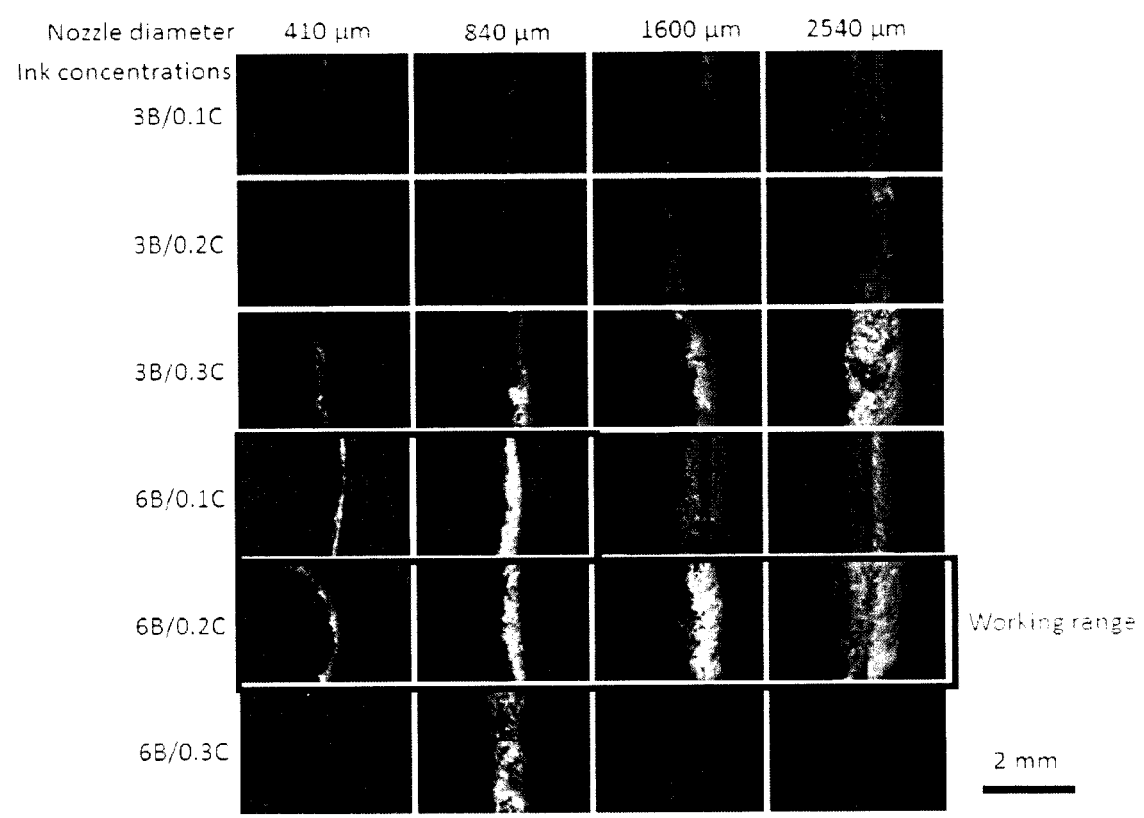
FIG. 9 shows various ink concentrations used to find the right combination of BaTiO$_3$ and CNT in the PVDF matrix for co-extrusion. 3B and 6B mean 3 and 6 g of BaTiO$_3$ nanoparticles, whereas 0.1C, 0.2C and 0.3C mean 0.1, 0.2 and 0.3 g of CNT per 0.5 g of PVDF, respectively.

These inks were then co-extruded using 410, 840, 1600 and 2540 µm nozzles. The fibers, using all the combinations of the above mentioned inks and extruded from the four kinds of nozzles, are presented in FIG. 9. The letter C stands for CNTs and B for BaTiO$_3$ nanoparticles. The number prefixing represents the amount of the respective nanoparticle with 0.5 g of PVDF. It was observed that whenever the rheological properties of the inks were far from each other, the ink with lower viscosity flowed out of the nozzle leaving behind the more viscous one. This is the reason why only one of the inks is visible in the microscopic images of such formulations. As seen in FIG. 9, the combination of various formulations is used to extrude fibers with different nozzle diameters.

Figure 10:
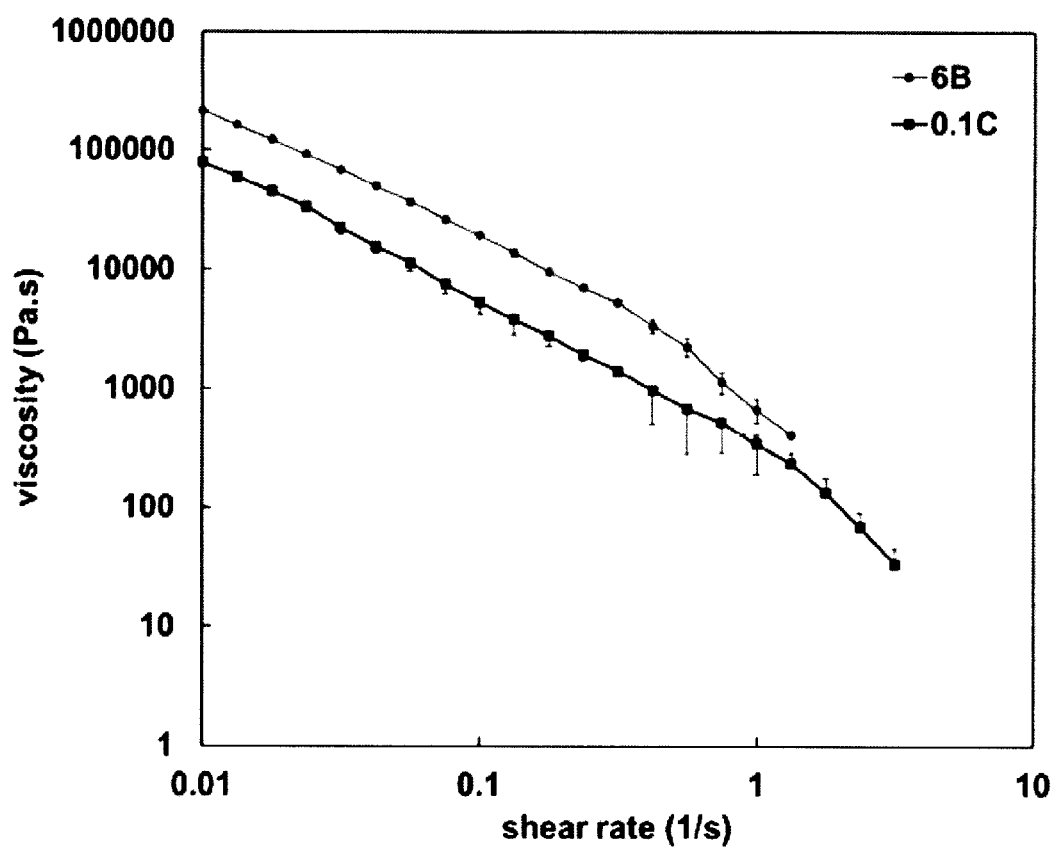
FIG. 10 shows viscosity versus shear-rate distribution of 6B (6 g of BaTiO$_3$ nanoparticles in 0.5 g of PVDF) and 0.1C (0.1 g of CNTs in 0.5 g of PVDF).

The combination of 6B/0.2C worked for all the larger nozzle sizes. But for smaller diameters, 6B/0.1C formulation looked to be more promising. Thus, it was chosen to form the sensors. Rheological characterization of the two inks was carried out using a rheometer (TA instruments). FIG. 10 shows the variation of the viscosities of the two fluids with increasing shear rates. The curves represent an average of 3 tests. As seen from FIG. 10, very high viscosities are required to co-extrude the inks to form the sensors.

Depending on the extrusion speed and the speed of the deposition stage, various electroded piezo features from straight fibers, coiled fibers, meandering fibers, can be formed with the inks and are presented in FIG. 11. Clear separations between the inks (white=BaTiO₃ ink and the black=CNT ink) can be seen for all three features.

Figure 12:
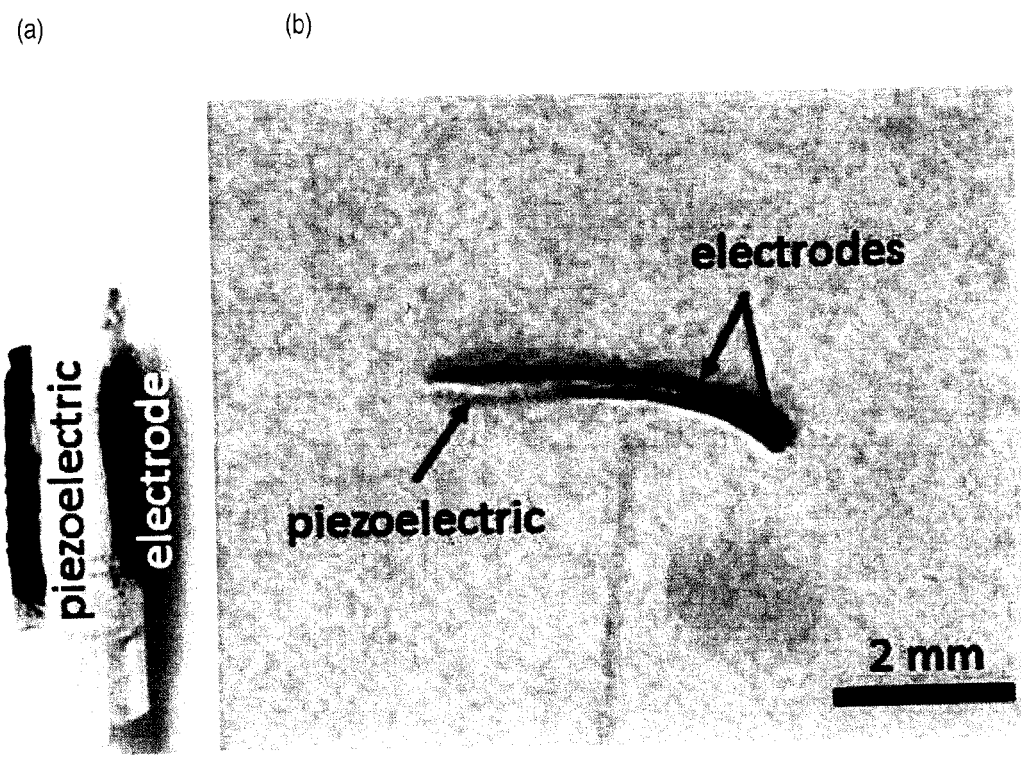
FIG. 12 shows a one-step sensor fabricated by laterally sandwiching piezoelectric BaTiO$_3$ (white) and conductive CNT electrodes (black).

Finally, a sensor is formed by printing, the piezoelectric ink laterally sandwiched between two electrode layers. FIG. 12 shows the sensor as fabricated.

2.2 Printing Material Combination 2
2.2.1 Ink Preparation:
(i) Conductive ink: Silver Print (MG Chemicals) (CAT #842); dilution in ethanol/thinner can help alter the rheological properties to match those of the piezo ink. (Supplier specified conductivity=15 Siemens/mil)
(ii) Piezoelectric ink: 0.32 g of BatiO₃ nanoparticles were added to 0.3 g of PVDF along with 6 mL acetone, 4 mL DMF and 0.6 mL DMSO. The inks were mixed in a ball-mill mixer for 20 minutes. In this ink, the concentration of the nanocomposites in the ink is about 0.35 g/mL.

Figure 13:
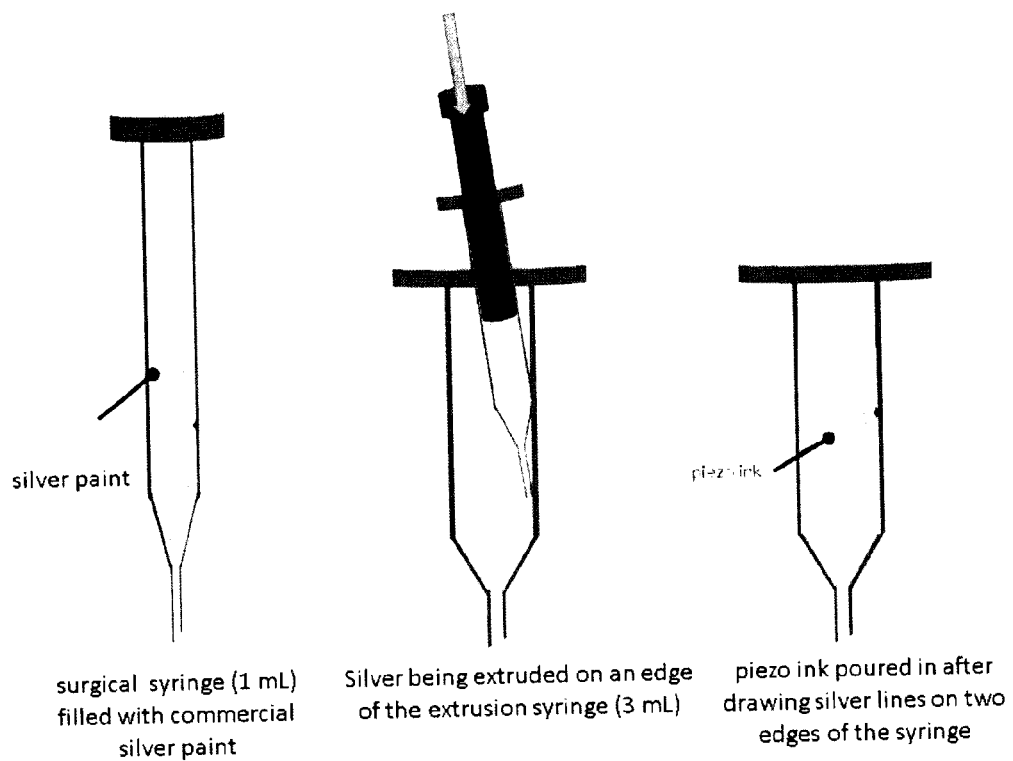
FIG. 13 shows an ink filling process for co-extrusion to print sensors.

2.2.2 Sensor Fabrication
The ink filling process can be explained with FIG. 13. Primarily, the commercial silver ink (as is or diluted so as to match the piezo ink rheological properties) is filled into a surgical syringe (medical syringe). Silver ink is then injected into the printing syringe (size=3 mL) as shown in FIG. 13 on two opposing edges to form the electrodes of the sensor to be printed. Then the piezo ink is filled into the syringe.

This syringe is then placed in the pneumatic dispenser and the sensor is co-extruded as shown in FIG. 7. A pressure of 161 kPa was used to extrude the sensor with a 410 μm nozzle. The microscopic image of the fiber obtained is shown in FIG. 14.

2.3 Conductivity Tests:
As seen in FIG. 9, the CNT inks with labels, 0.1C and 0.2C possessed matching viscosities for the 6B ink. Hence, we carried out the resistivity tests on these two inks using a 6517B electrometer. The following table accounts for the conductivity values as calculated from the resistance values obtained from the electrometer along with the average diameters of the fibers. The commercial silver ink was used as obtained from the supplier, and printed in the form of fibers on a glass slide.

TABLE 1

| Ink | Wt. ratio CNT:PVDF | Diameter (μm) | Conductivity (S/m) |
|---|---|---|---|
| 0.1C | 16.67:83.33 | 189 | 1033 |
| 0.1C | 16.67:83.33 | 91 | 385 |

TABLE 1-continued

| Ink | Wt. ratio CNT:PVDF | Diameter (μm) | Conductivity (S/m) |
|---|---|---|---|
| 0.2C | 28.5:71.5 | 89 | 833 |
| Commercial silver ink | Used as obtained | 80 * 585 (not circular) | 139347 |

Hence, the 0.2C has the highest conductivity in the case of PVDF/CNT nanocomposites. Given the low conductivity of the PVDF/CNT nanocomposites, the silver ink was chosen for the following experiments.

Conclusions

In summary, various piezoelectric nanocomposites were fabricated by mixing a filler with a polymer. Piezoelectric inks for 3D printing were then fabricated by mixing the piezoelectric nanocomposites in a solvent. A piezoelectric coefficient of about 18 pC/N was obtained for the nanocomposites with a filler:polymer weight ratio of about 10:90. Said piezoelectric nanocomposite can be used in the manufacture of a piezoelectric ink for 3D printing, which can be used in the manufacture of 3D printed piezoelectric material, including sensors, such as touch sensors. One can achieve complex 3D piezoelectric shapes with the above processes.

The scope of the claims should not be limited by the preferred embodiments set forth in the examples, but should be given the broadest interpretation consistent with the description as a whole.

EXAMPLE 3

Coextrusion Printing

Solvent-Cast 3D Coextrusion Printing

Various structures were printed by coextrusion printing of an ink containing 10 wt. % BaTiO₃ nanoparticles in a solution of PVDF (0.34 g/mL) in DMF and acetone solvents together with a silver ink. The silver ink and the coextrusion process were those described in Example 2. The printing parameters were:
nozzle diameter 840 μm,
extrusion pressure=0.04-0.2 MPa, and
speed=2-3 mm s$^{-1}$.

Figure 17:
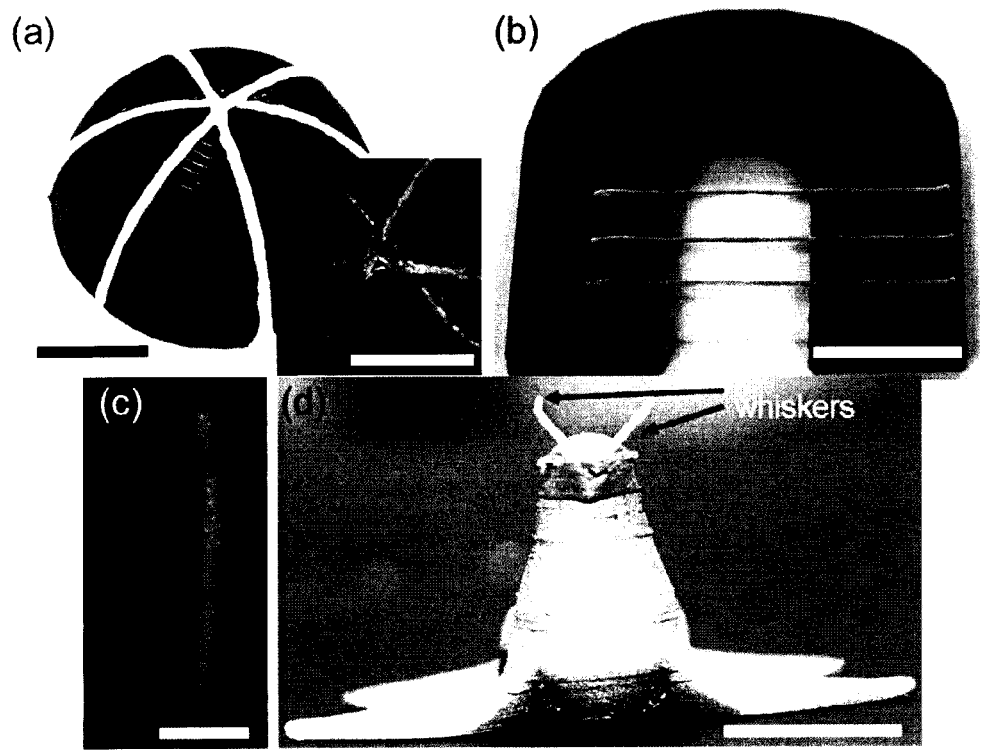
FIG. 17a) shows a photograph of coextruded conformal sensors printed on a hemisphere (scale bar=5 mm), inset is a microscopic image (top view) of the hemisphere (scale bar=5 mm); b) shows coextruded spanning filaments (scale bar=20 mm); c) is a microscopic image of coextruded vertical pillar (scale bar=2 mm); and d) is a photograph of whiskers printed on a FDM printed seal's head (scale bar=20 mm).

The structures printed: conformal sensors on a hemisphere, spanning filaments, vertical pillar and whiskers, are shown in FIG. 17.

Furthermore, piezoelectric filaments were printed in a similar manner except that no silver ink was used.

Mechanical Properties of the Coextruded Filaments

Figure 18:
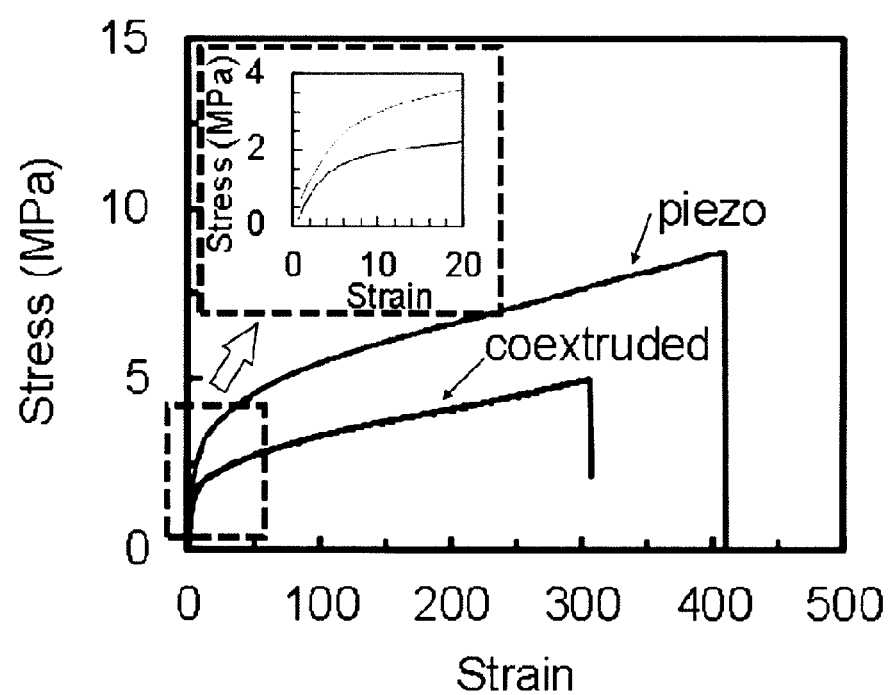
FIG. 18 shows representative tensile stress versus strain curves for the coextruded and piezoelectric filaments, inset: zoomed in view of the elastic region.

Uniaxial tensile tests (Insight electromechanical testing machine), evaluated the Young's moduli, strength and strain at break of the filaments of FIG. 17(b) as well as the above piezoelectric filaments. The tests were performed at a strain rate=48 mm min$^{-1}$ with a distance between the grips of 20 mm using a 5 N load cell according to ASTM D3822 standard. The values reported in FIG. 18 are an average of five successful samples (diameter ~500 μm) tested until failure.

Piezoelectric Properties of the Coextruded Filaments

Figure 19:
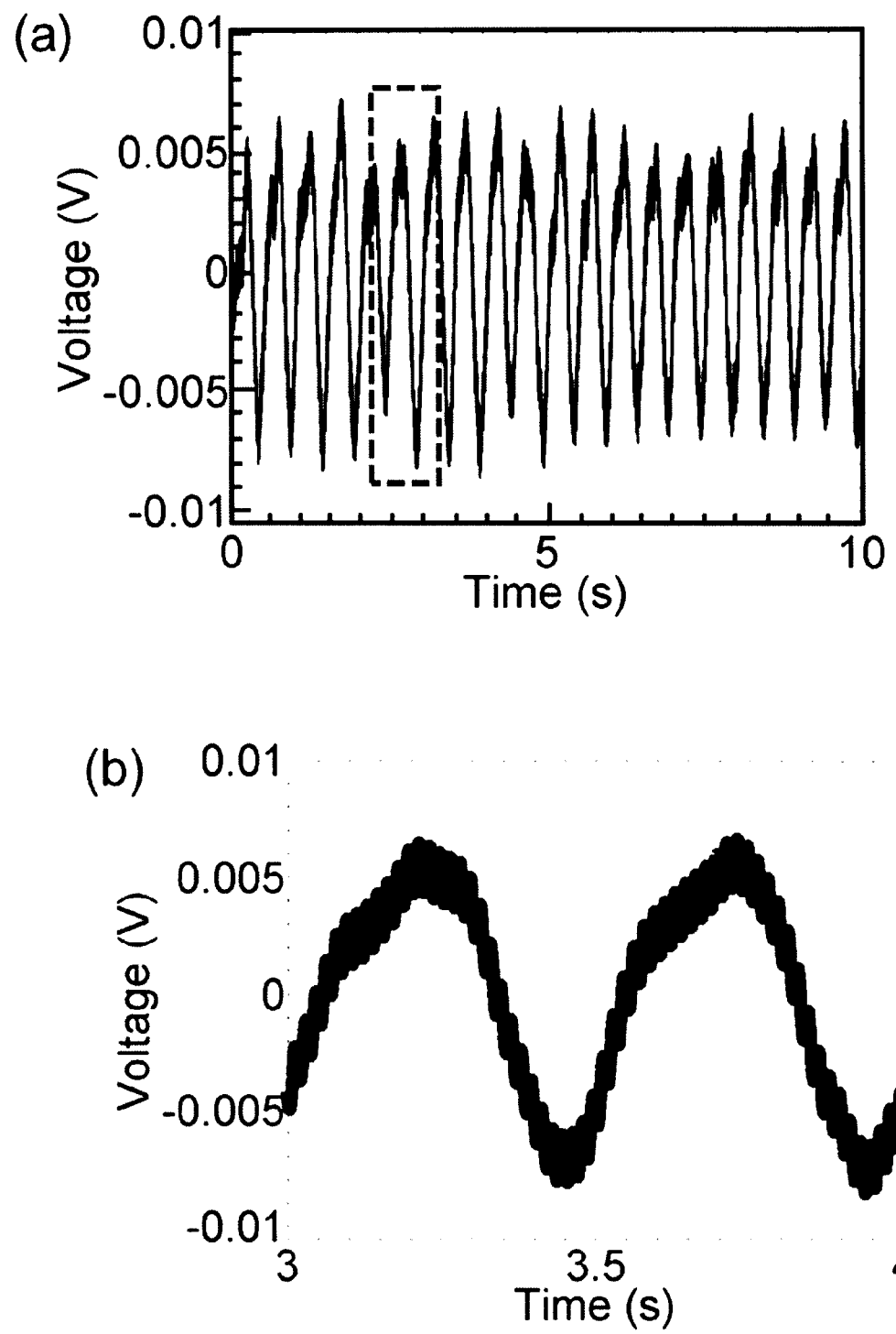
FIG. 19a) shows part of a representative response of one of the threads at 1% applied strain at 2 Hz; b) shows the single cycle voltage output as a function of time during the dynamic piezoelectric test of the thread (zoomed in view of the region in the box in FIG. 19a).

To determine the piezoelectric properties, we measured the piezoelectric response from the co-extruded filaments (distance between the grips=12-15 mm, 3 samples) using a dynamic mechanical analyzer in multi-strain mode (1% strain, 2 Hz; preload of 0.1 N) for 5 min each. The results are shows in FIG. 19.

Figure 20:
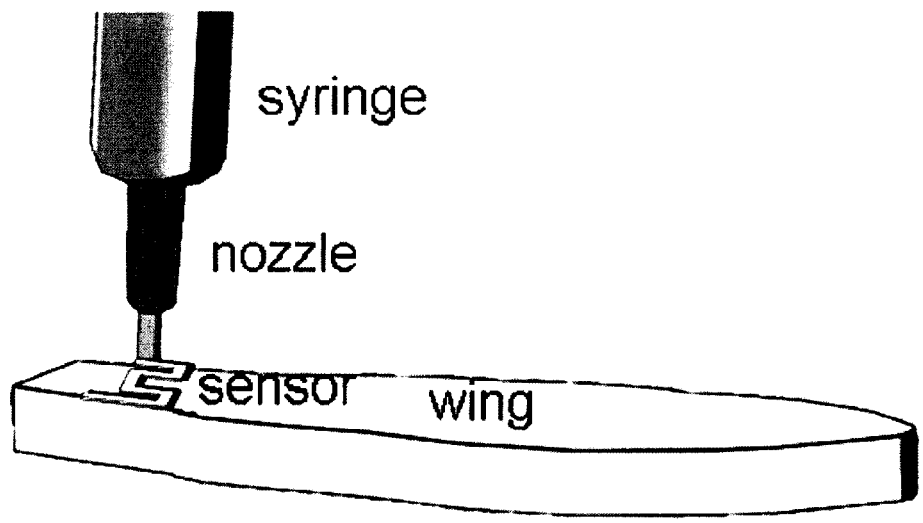
FIG. 20a) is a schematic of a one-step sensor being 3D printed on a FDM printed wing, which was attached to an electromagnetic shaker; b) shows the piezoelectric voltage (RMS) output from the sensor as a function of voltage input to the electromagnetic shaker, inset top: microscopic image of the sensor on the wing (frequency=4 Hz), inset bottom: enlarged view of the sensor showing the piezoelectric material (white) and two silver electrodes; c) shows the output voltage responses for 0.5, 1, 2, 4 and 8 Hz input frequencies to the wing with an input amplitude of 0.05 V to the shaker; and d) and e) show the variation in the response of the sensor when disturbed by d) a pen and e) air blower (shaker input frequency=1 Hz; amplitude=0.05 V).
Figure 20:
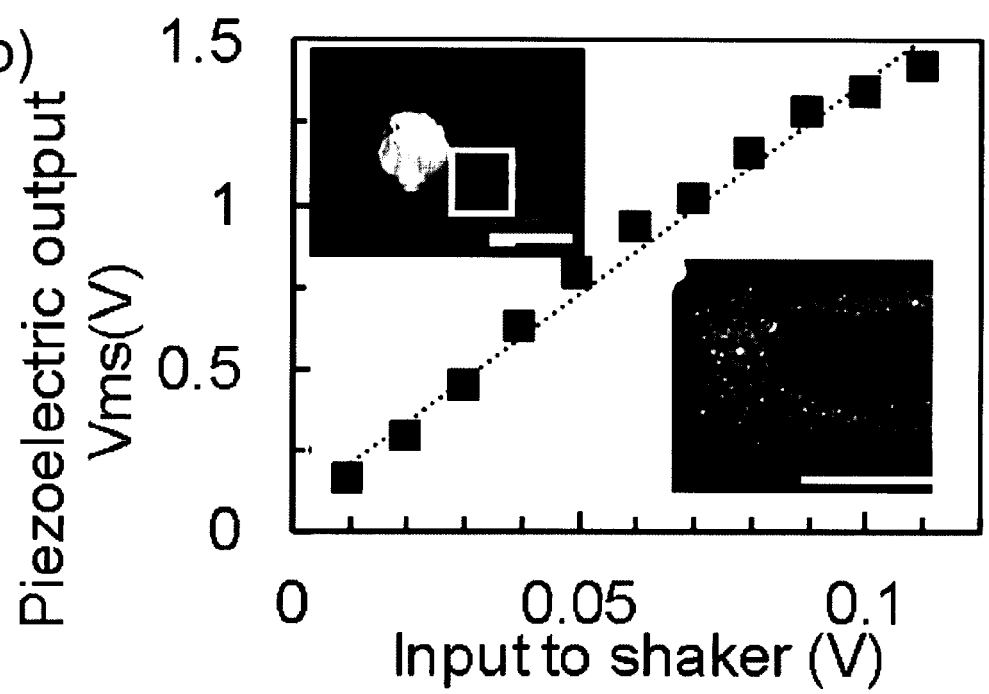
Figure 20:
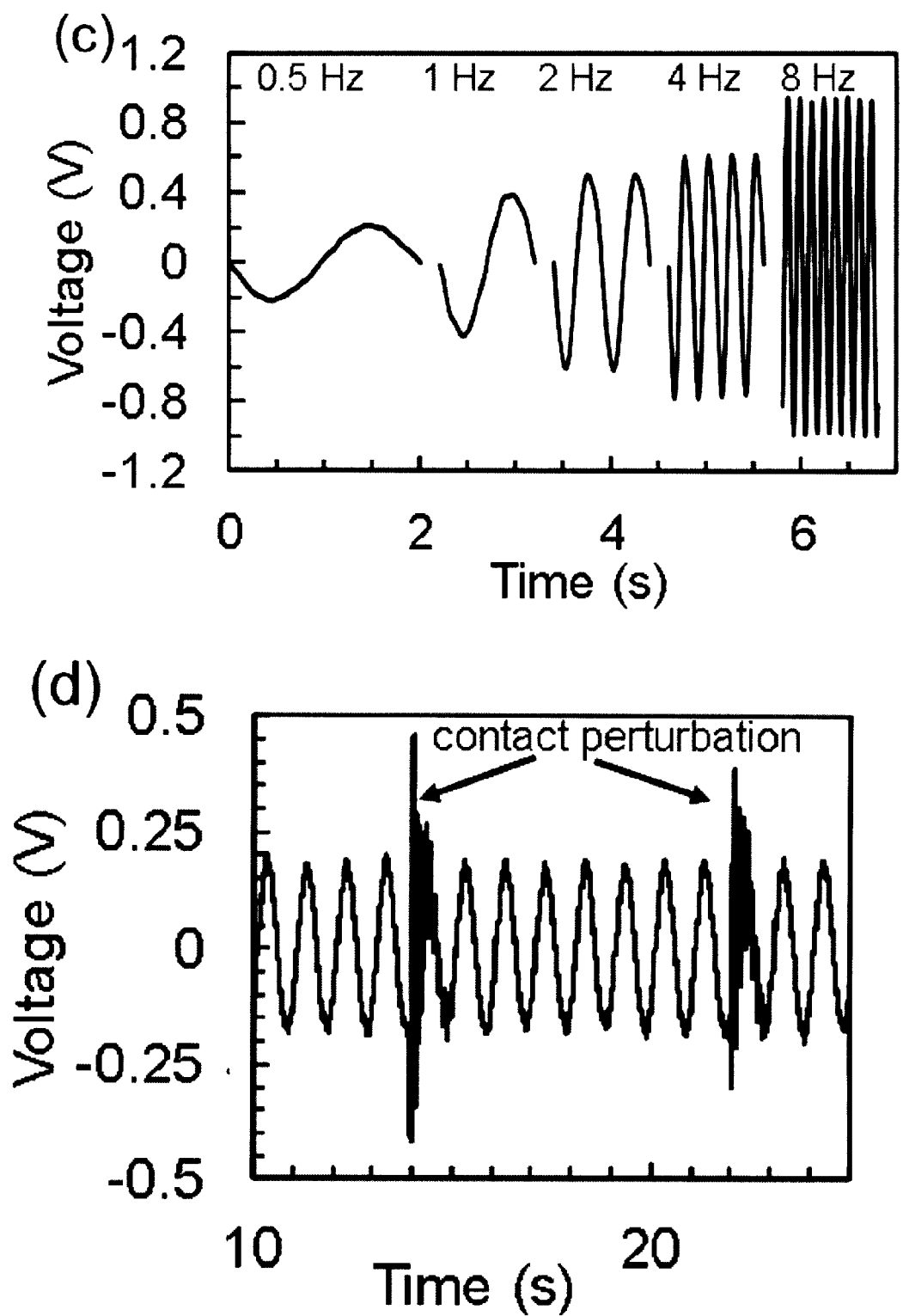
Figure 20:
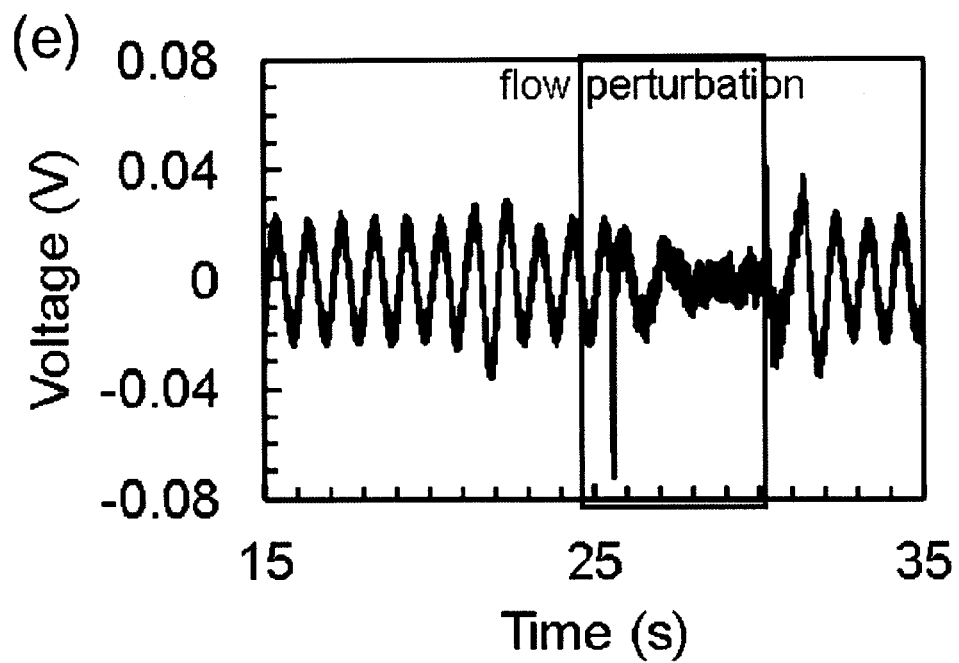

Application of Coextrusion 3D Printing in Aero-Elastic Monitoring of Flapping Wings Sensors were coextruded and 3D printed with electrodes on top of a fused deposition modelling printed insect wing in the shape of a strain gauge (FIG. 20a). The wing was then fixed on an electromagnetic shaker (The Mode Shop Inc. Model K2007E01). A waveform generator (TE GAM, Model 2720), excited the shaker with input voltage (0.02 to 0.12 V) in the selected frequency range (0.2 to 20 Hz). A copper mesh covered the entire test set up for electromagnetic shielding. Mechanical perturbations to the wing were made by hitting it with a slender object. Gust were simulated using a hair dryer (Revlon, Ionic ceramic), at its highest speed, held vertically above the wing.

The piezoelectric output was measured as a function of the voltage input to an electromagnetic shaker—see FIG. 20b). Output voltage responses for 0.5, 1, 2, 4 and 8 Hz input frequencies to the wing with an input amplitude was also measured—see FIG. 20c). Finally, the variation in the response of the sensor when disturbed by a pen and air blower was measured—see FIG. 20d) et e).

Application of Coextruded Filament in Wearable Sensors

The piezoelectric filaments were woven into a clinical elastic knee stabilizer (see FIG. 22a) (Formedica®). A commercial freeware, Kinovea (0.8.15), extracted motion data from the recorded videos (60 fps; Canon EOS Rebel T4i) for comparison with the response from our piezoelectric sensors during the static tests. In case of cycling, Image J was used to track the motion and determine the angular frequency. Cycling tests were performed on a clinical bike (Sport Excaliber, Lode BV Medical Technology) at a mechanical power of 80 W.

To monitor respiration, we wove the thread into a tight t-shirt on the left side of the thoracic cavity, parallel to the ribs (see FIG. 22d). Conducting threads embroidered into the t-shirt formed the electrical connections from the sensor to avoid any noise from moving wires. We tested for two breathing types at rest: quick/shallow and slow/deep.

Figure 21:
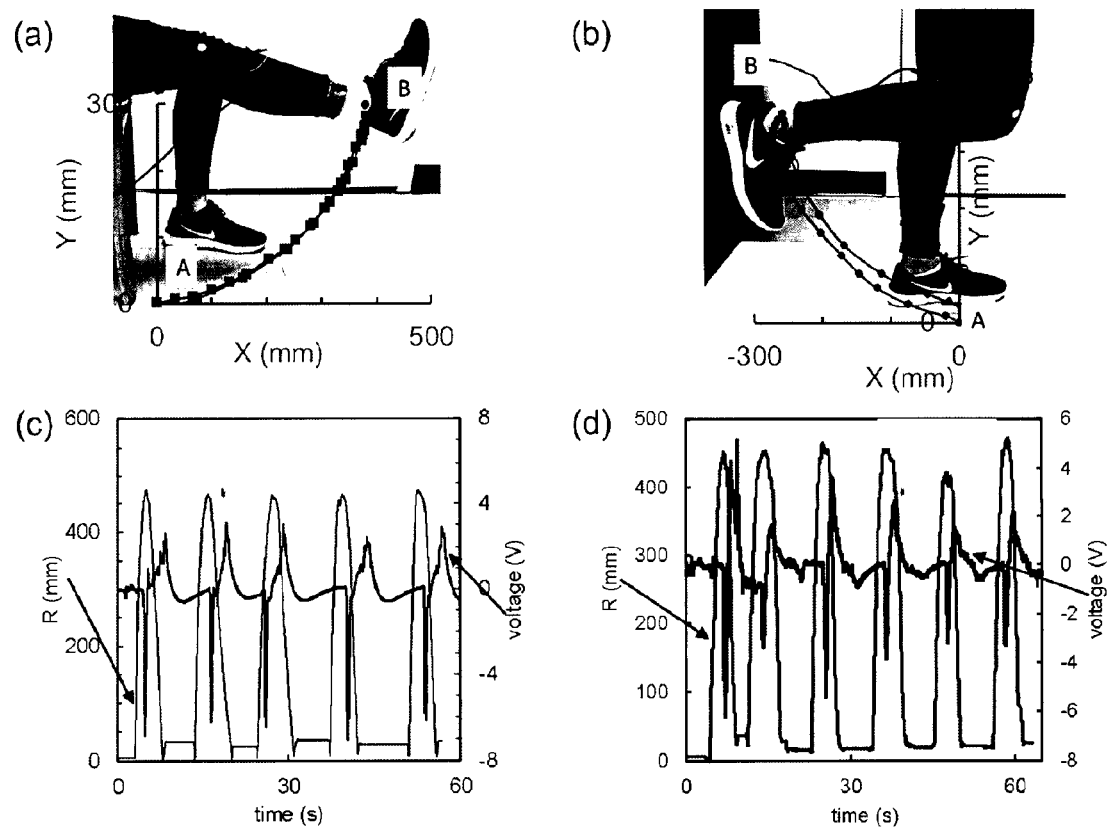
FIG. 21 shows simple leg raising tests a) sitting and b) standing and the correlation between the output voltage versus ankle displacement (R) for five consecutive cycles (c) sitting and d) standing.

FIG. 21 shows simple leg raising tests sitting and standing and the correlation observed between the output voltage versus ankle displacement. The curves labeled (Y) in FIGS. 20(a) and (b) show the movement of the ankle from its initial to final position. The correlation between the output voltage versus ankle displacement (R) for five consecutive cycles is shows in FIGS. 21(c) sitting and d) standing.

Figure 22:
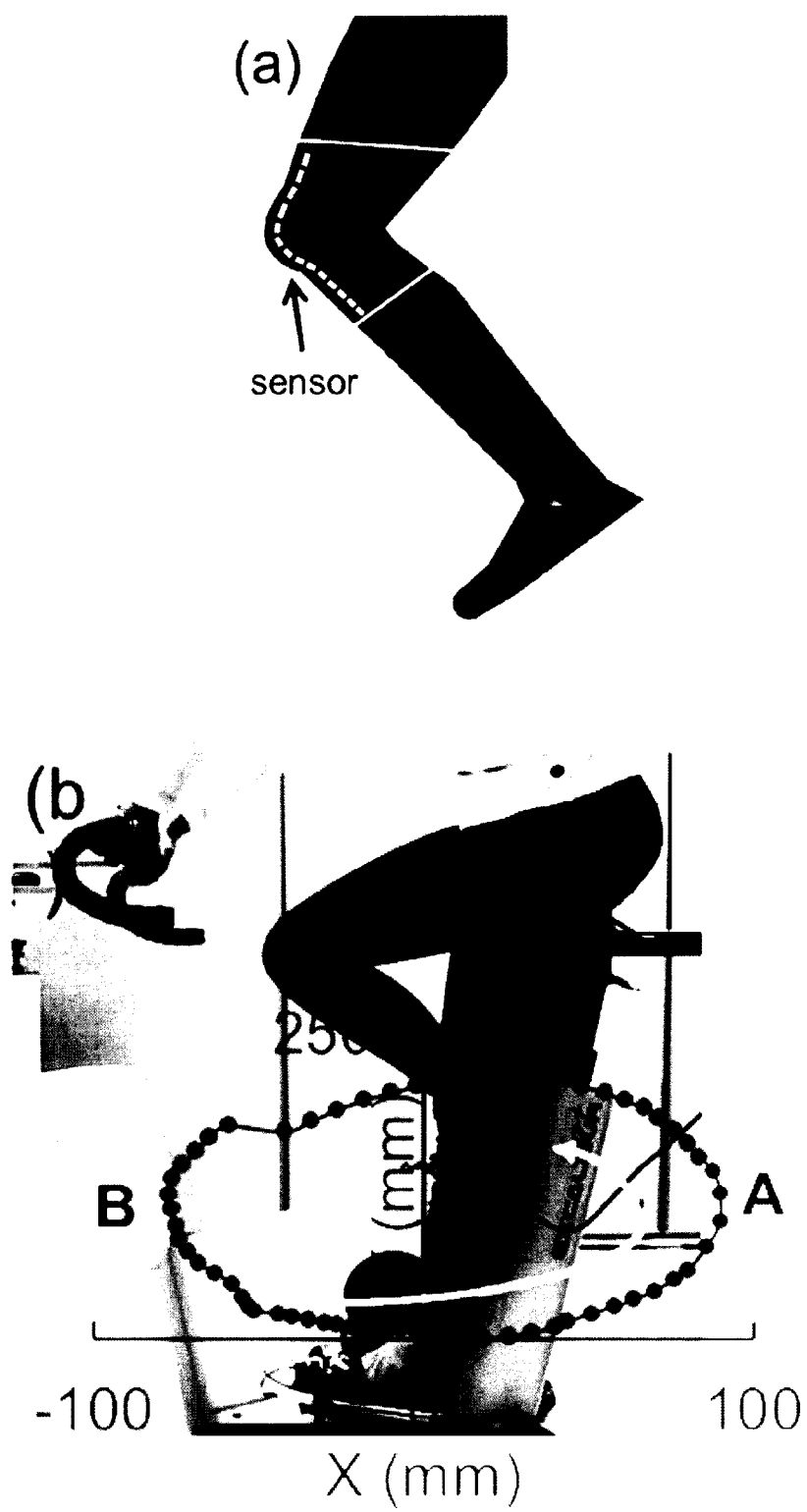
FIG. 22 a) is a schematic depicting the sensor sewn on a knee-stabilizer; b) is a photograph of the cycling test; c) is a plot of angular velocity obtained from the recorded video and voltage output of the sensor during cycling; d) is a schematic of the piezo thread woven into a T-shirt; and e) and f) show breathing sensor output during e) shallow/quick breathing and f) deep/slow breathing for 1 min.
Figure 22:
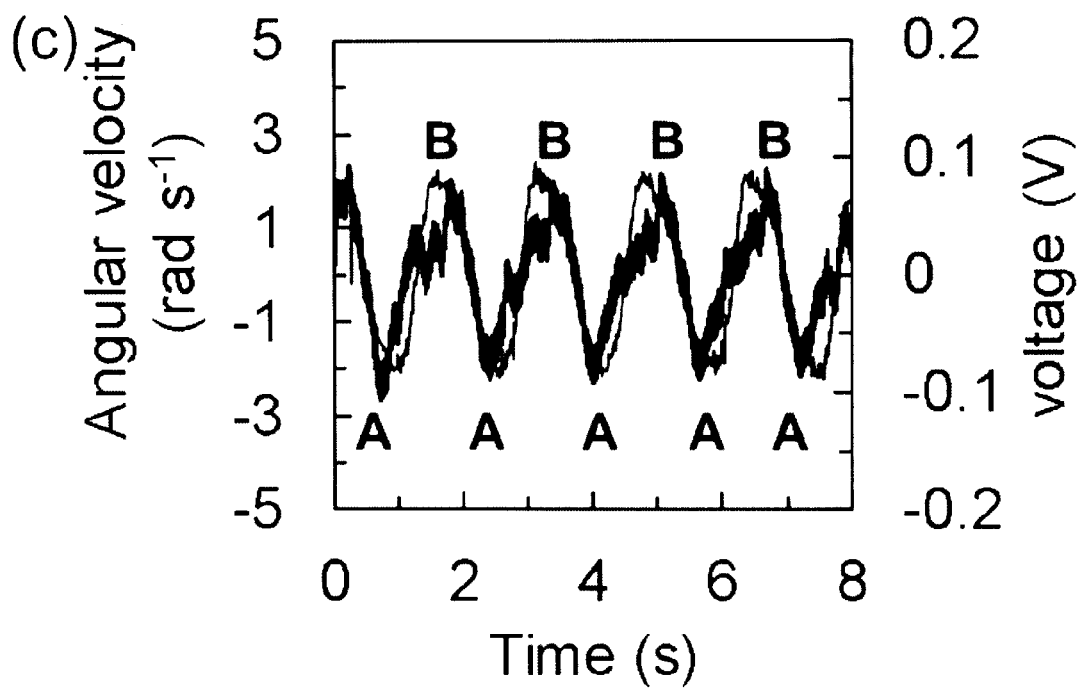
Figure 22:
Figure 22:
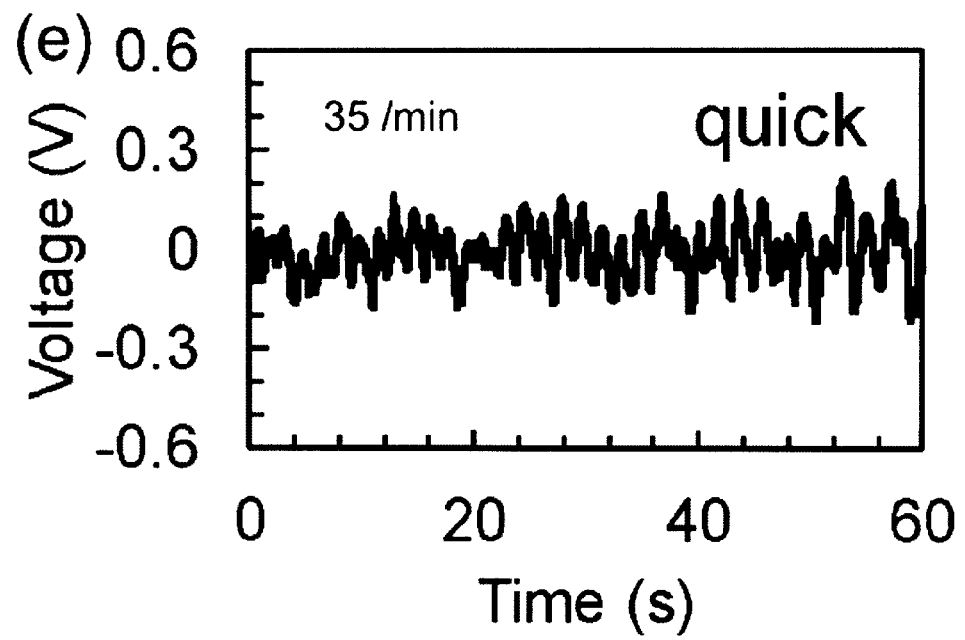
Figure 22:
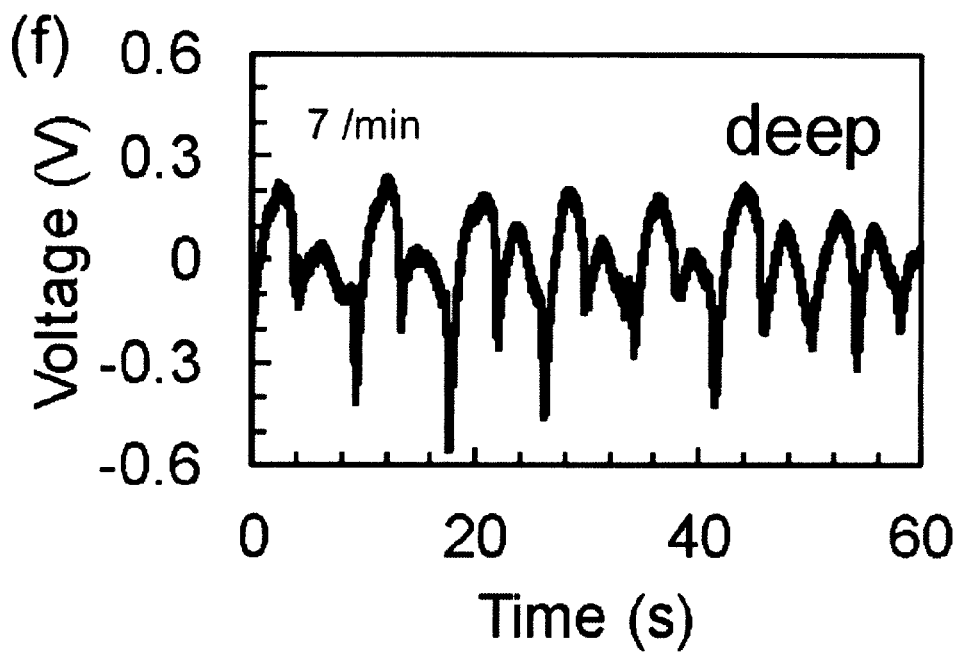

FIG. 22 shows the cyclic test and the breathing test. In FIG. 22(b), the curve labeled with the dots shows ankle movement during cycling as extracted from the video images and the white arrow shows the cycling direction.

EXAMPLE 4

In-situ Electric Field Poling-Assisted 3D Printing

Electric field poling-assisted 3D printing involved 3D printing under a strong electric field. In this process, the PVDF polymer is simultaneously mechanically stresses in-situ by the leading nozzle and electrically poled by applying an electric field between nozzle tip and printing bed (here a metallic tape).

Printing

Figure 23:
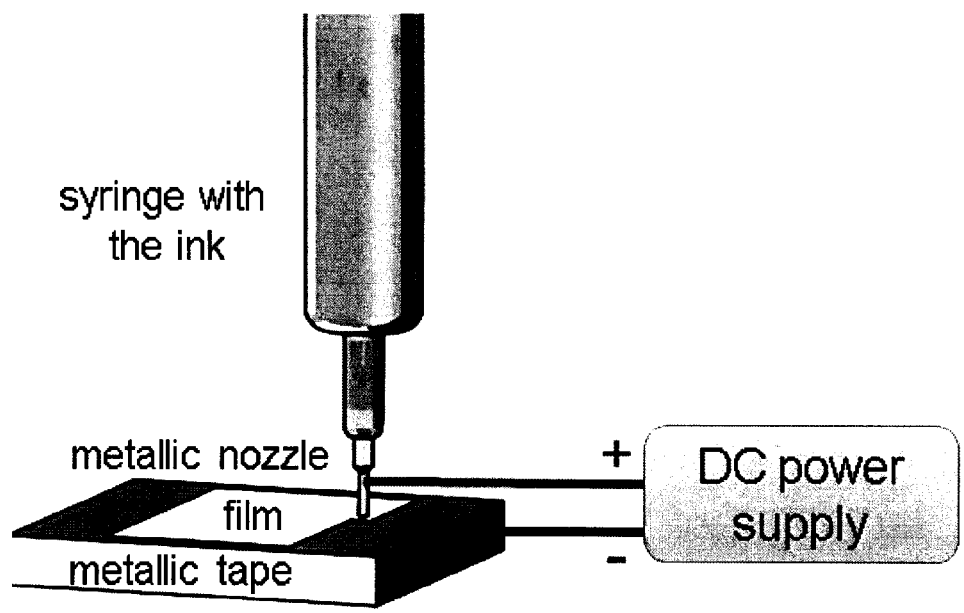
FIG. 23 is a schematic of the in-situ electric field poling set-up for solvent-evaporation assisted 3D printing (SEA-3DP) in Example 4.

The in-situ electric field poling set-up (see FIG. 23) consisted of laboratory DC (direct current) power sources to apply the required electric field between a metallic printing nozzle and a metallic tape (aluminum or copper, 3M Canada) attached to the substrate. Based on the electric field desired two DC power sources were employed: Gw Instek, GPS 3303 for electric field up to 0.3 MV m$^{-1}$ and the Fisher Scientific, FB 3000 for 1 MV m$^{-1}$. A total of 8 types of films with 4 different poling voltages: 0, 0.1, 0.3 and 1 MV m$^{-1}$ were fabricated. The nomenclature of the films consists of the poling voltage in MV m$^{-1}$ followed by a letter: P for neat PVDF and NC for the nanocomposite. For example 0.3P stands for a PVDF film fabricated with 0.3 of MV m$^{-1}$ poling voltage.

The nanocomposite contained 10 wt % BaTiO$_3$ in PVDF.

Piezoelectric Characterization

Figure 24:
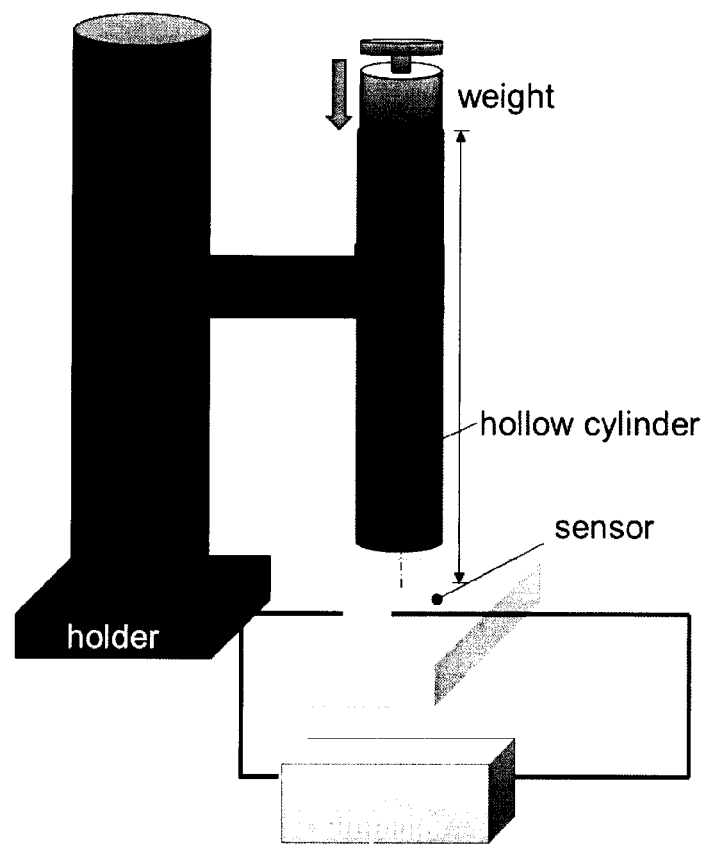
FIG. 24 is a schematic of drop-weight test setup for piezoelectric characterization of the sensors used in in Example 4.

To experimentally compare the extent of net dipole moment in the materials, we used a piezoelectric characterization test in which each sensor was impacted with a 10 g calibration weight from a height of 10 mm. The piezoelectric characterization test developed consisted of drop-weight test as shown in FIG. 24. A 10 g calibration weight was dropped on the sensors from a height of 10 cm through a hollow cylinder. The piezoelectric output from the sensors upon the impact was converted into voltage through a charge amplifier (MEAS specialties) and was recorded using LabVIEW 2014.

The voltage, V (V) obtained from the sensors was converted in to charge, q (C) and then polarization, P (C m$^{-2}$) by using the following equations:

$$q = CV \quad (2)$$

$$P = \frac{q}{A} \quad (3)$$

where, A is the electrode area in m$^2$, and C is the capacitance (F).

Figure 25:
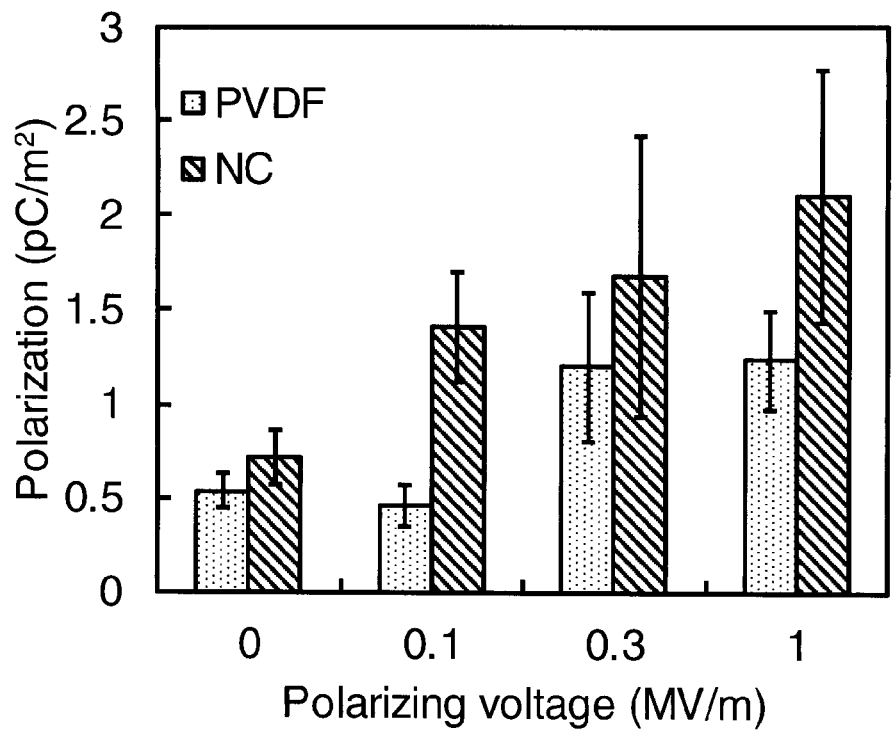
FIG. 25 shows the piezoelectric outputs of PVDF and NC sensors fabricated with an electric field of 0, 0.1, 0.3 and 1 MV m$^{-1}$.

FIG. 25 shows the piezoelectric outputs of all the sensors in terms of polarization. It can be seen that addition of BaTiO$_3$ NPs led to increased polarization in the sensors. Polarization significantly increased with increasing applied electric field. Filler addition and an electric field of 1 MV m$^{-1}$ lead to an increase of ~300% over printed unpoled PVDF.

Gait Monitoring Sensor

Figure 26:
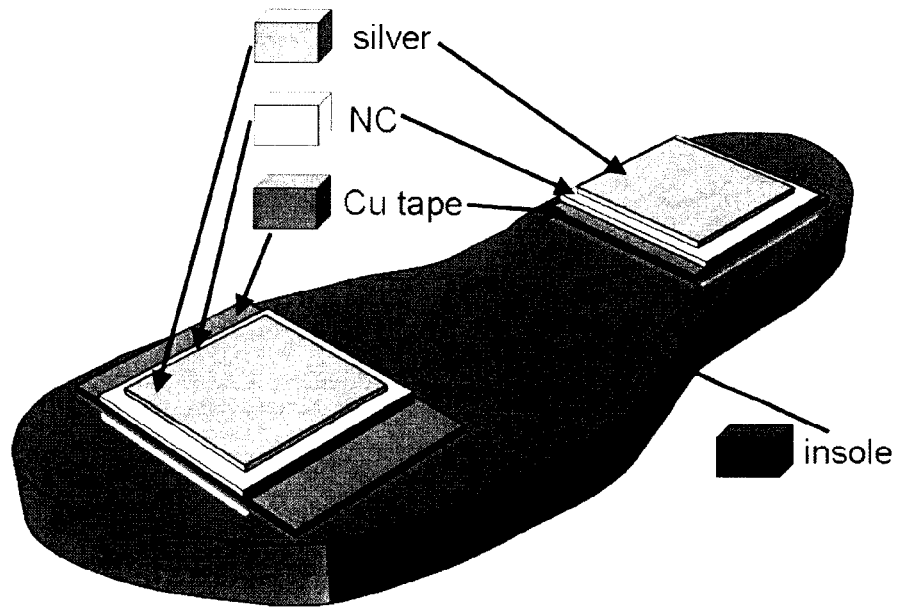
FIG. 26 is a schematic of the sensors printed on a shoe insole (thicknesses are exaggerated) in Example 4.
Figure 27:
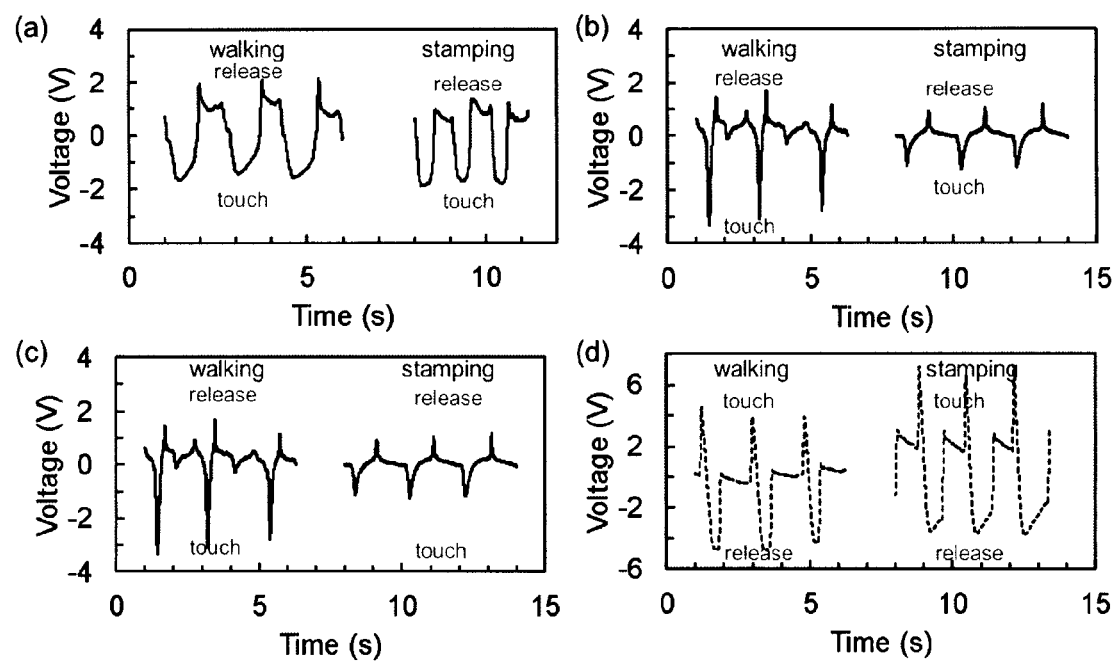
FIG. 27 show the piezoelectric voltage output from the sensor while walking and stamping: output from the sensor at the (a) hind foot and (b) fore foot when the insole is worn in the shoe and output from the sensor at the (c) hind foot and (d) fore foot when the insole is fixed to the ground.

To demonstrate the applicability of the fabrication process, piezoelectric sensors were printed on a shoe insole at the forefoot and hind foot locations seen in FIG. 26 using the NC ink at an electric field of 0.3 MV m$^{-1}$. FIGS. 27a) and b) show the output voltage response measure during walking and stamping for both the sensors when the insole was inserted into a shoe. During a normal walking motion the hind foot makes the initial contact with the floor, and then the forefoot lands on the floor—see Lim, D.-H., et al., *Development of realtime gait phase detection system for a lower extremity exoskeleton robot*. International Journal of Precision Engineering and Manufacturing, 2017. 18(5): p. 681-687. Thus, voltage response from the hind foot sensor shows a larger sharp peak while touching the ground and a smaller peak upon releasing. The larger negative peak occurs when the shoe hits the ground whereas the smaller positive peak is the response from the pressure between the foot and the shoe during the swing movement upon the foot's removal. On the other hand, the forefoot touches the floor and rests for a certain time to provide balance during locomotion, hence the broad dual peaks observed for the forefoot response. As opposed to walking, stamping involves the application of the force more at the fore foot location as compared to the hind foot as explained by the second set of curves in FIGS. 27a) and b), respectively.

Here, the response from the hind foot is much lower in magnitude to that from the fore foot.

FIGS. 27c) and d) show the voltage response from the sensors when the insole was fixed to the ground so as to compare its application as a floor based gait sensor—see Soames, R. W., Foot pressure patterns during gait. Medical Engineering and Physics. 7(2): p. 120-126. The voltage responses are much higher in magnitude in this case as compared with those when the insole was worn in the shoe. This could be because of the ground reaction forces acting on the foot. These reactions are much reduced when the insole is in the shoe due to the cushioning effect of the shoe padding. For the same reason, the response directions could be reversed in case of the hind foot sensor. Thus, depending on the type of the response and its magnitude, the sensors fabricated in this work can be applied for gait monitoring.

Conformal Printing with Poling

For conformal printing, copper (Cu) tape was stuck on a convex hemispherical surface as the bottom electrode and a NC filament (0.2 g mL-1 PVDF solution; 0.15 MPa; 2 mm s-1; 100 μm) was printed on the tape with an electric field of 0.3 MV m$^{-1}$. This is illustrated in FIG. 28a).

Figure 28:
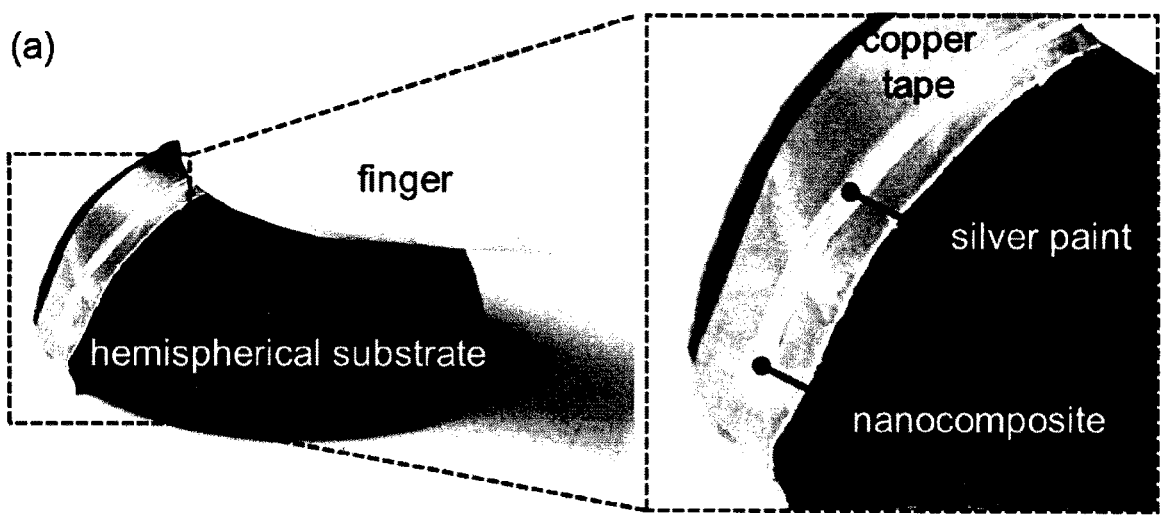
FIG. 28 shows (a) a conformal sensor fabricated with the nanocomposite when pressed by an index finger and (b) the voltage output of the sensor when pressed with the finger 3 times.
Figure 28:
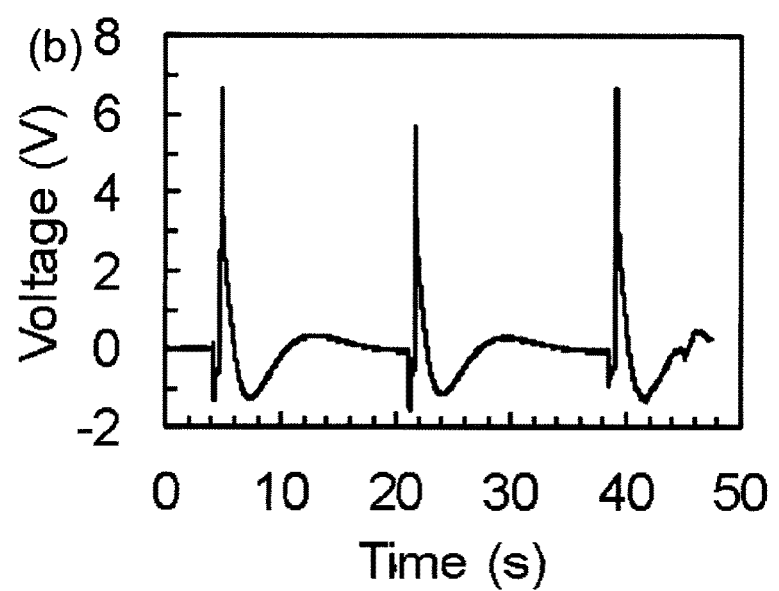

The voltage output of the sensor when pressed with the finger 3 times was measured—see FIG. 28b).

EXAMPLE 5

Fabrication of Piezoelectric Sensors by Fused Deposition Modeling (FDM) 3D Printing Summary We developed a novel method to fabricate piezoelectric sensors by fused deposition modeling (FDM) 3D printing technology without any additional required process. By adding ionic liquid-modified multiwalled carbon nanotubes (IL-MWCNTs) into polyvinylidene fluoride (PVDF) matrix, a filament with a diameter of approximately 1.75 mm is fabricated in high polar β-phase (71.29%, calculated from FTIR) without the requirement of high electric field poling, mechanical stretching and annealing. In addition, the ability of FDM 3D printing technology to pattern the piezoelectric nanocomposites filament into a desired shape will improve the electromechanical response and also increase the range of its applications. A FDM 3D printed film sensor can generate a maximum voltage output of ~6.48 V on gentle finger tapping.

Experimental

Figure 29:
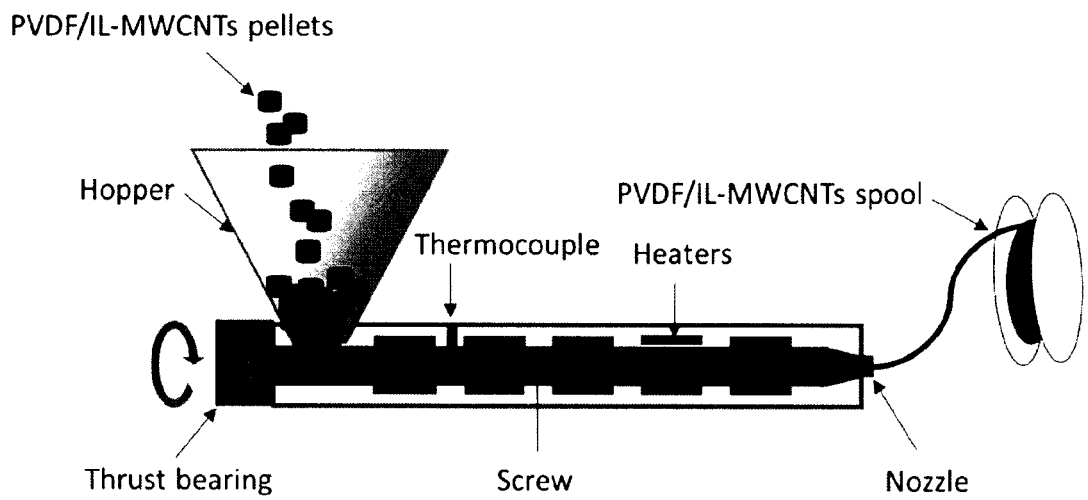
FIG. 29 is a) a schematic of melt-extrusion process of Example 5: PVDF/IL-MWCNTs pellets are fed into the hopper and melt extruded into filament spool and (b) a schematic of FDM 3D printing process of Example 5: the PVDF/IL-MWCNTs nanocomposites filament is melt-extruded through a micro nozzle and solidifies right after extrusion.
Figure 29:
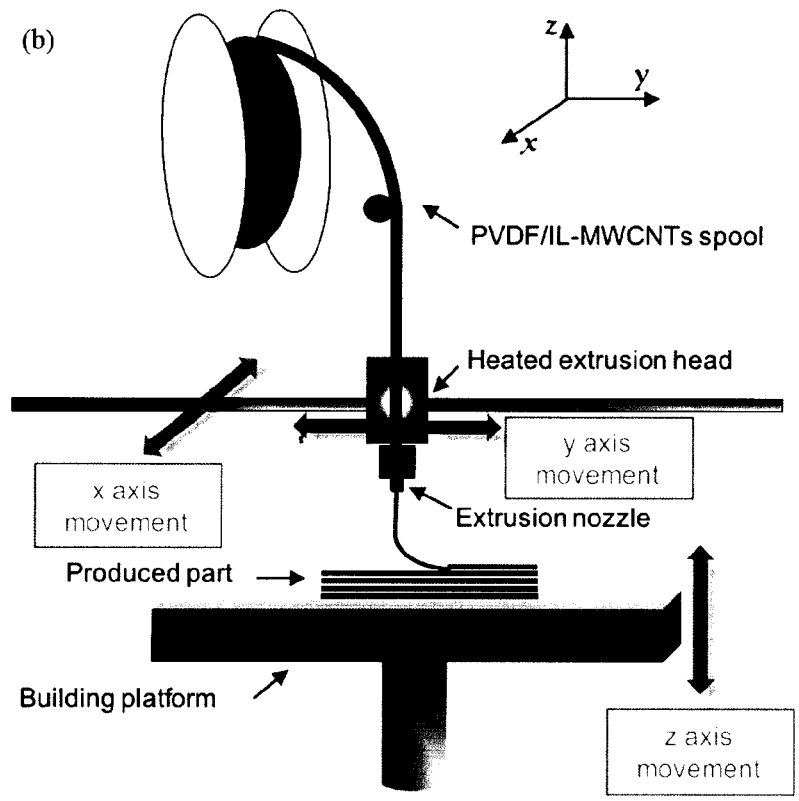

FDM 3D printing of PVDF/IL-MWCNTs nanocomposites filament was developed (see FIG. 29).

Multiwalled carbon nanotubes (MWCNTs) were first modified with ionic liquid (IL) by mechanical grinding method and followed by melt compounding with PVDF matrix. Here, IL serves as a binder linking the MWCNTs and PVDF molecular chains together. Without the use of IL, the piezoelectric property of PVDF/MWCNTs nanocomposites are destroyed at high temperature due to the poor compatibility between the MWCNTs and the PVDF matrix.

The mixture of PVDF and IL-MWCNTs obtained in the form of short filaments from a 5 mL twin screw micro extruder is further fabricated into nanocomposites filament spool by Filabot extruder (FIG. 29a)). In the filament fabrication process (FIG. 29a)), a Filabot extruder is employed to fabricate the PVDF/MWCNTs nanocomposites filament spool which is further used in FDM 3D printing process to fabricate piezoelectric sensors.

In the printing process (FIG. 29b)), a FDM 3D printer, which includes a heated extrusion head, a micro nozzle, and a build platform, is used. The PVDF/MWCNTs nanocomposites filament is forced extruded through a heated nozzle capable of 2-axis (x and y) movement. This movement allows the extruding nozzle to trace out the cross-sectional layers while depositing the nanocomposites. The build platform is then raised by the layer thickness and the process is repeated until the desired 3D model is obtained.

PVDF/IL-MWCNTs Nanocomposites Filament Fabrication 0.1 g of 1-Butyl-3-methylimidazolium hexafluorophosphate (Ionic liquid (IL), Sigma-Aldrich) and 0.1 g of multiwalled carbon nanotubes (MWCNTs, NC7000™, 90% purity, ~9.5 nm diameter and ~1.5 μm length) were mechanical grinded by an agate mortar for 15 minutes. The obtained IL-modified MWCNTs were then melt mixing with 5 g of polyvinylidene fluoride (PVDF, Sigma-Aldrich, $M_w$ 180, 000, melting point=230° C.) in a 5 mL twin screw micro extruder (Xplore®) at 190° C. The PVDF and IL-MWCNTs nanocomposites was fed into an extruder (Filabot) to fabricate filaments (~1.75 mm diameter), which can be further used in FDM 3D printing.

FDM 3D Printing

The STL files (a file format native to the stereolithography CAD software created by 3D Systems.) of these structures were imported into a 3D printing software (Simplify3D), which sliced the model for the building process. Then, the software was connected to a FDM 3D printer (Creatr 2014, Leapfrog™) with USB to completely control the print by applying customizable settings. After setting the parameters (printing speed: 2600 mm/min; extrusion temperature: 230° C.; bed temperature: 80° C.; angle: (±)45°), the PVDF/IL-MWCNTs nanocomposite filament was inserted into the heated extrusion nozzle (diameter=0.35 mm). When the temperature reached the set value, the structures were printed layer-by-layer until the desired shape obtained.

Optical Microscopy

A BX-61 Olympus microscope (Image-Pro plus V5, an image processing software from Media Cybernetics) was used to obtain the images of the PVDF/IL-MWCNTs nanocomposite filament and FDM 3D printed structures.

Field Emission Scanning Electron Microscopy (FE-SEM)

A field emission scanning electron microscope (JEOL JSM-7600TFE) was used to visualize the morphology and cross-sections of the nanocomposite filaments.

X-Ray Diffraction (XRD) Analysis

A Philips X'pert diffractometer was used in the 2θ range from 10°-50° to obtain the diffractogram patterns of the filaments and films. A scan rate of 0.4° min$^{-1}$ was used with a Cu target and $K_\alpha$ radiation at 50 kV and 40 mA.

Fourier Transform Infrared (FTIR) Spectroscopy Analysis

Photoacoustic spectroscopy (FTS 6000 spectrometer, Bio-rad) was used to obtain the absorption spectra of PVDF/IL-MWCNTs nanocomposite films in the range of 400-4000 cm$^{-1}$. 128 scans were conducted on each sample with a resolution value of 8 cm$^{-1}$.

Piezoelectric Test

A charge amplifier (Piezo lab amplifier, MEAS specialties) in charge mode was used to convert the piezoelectric charges obtained from piezoelectric structures and acquired with a data acquisition system (NI-9239) attached to a USB carrier (NI-9162, National Instruments) and recorded using a LabVIEW interface on computer.

Impedance Test

An impedance analyzer (Agilent 4294A Precision) in the frequency range of 40 Hz to 1 kHz was used to obtain the capacitance and dielectric constant of the PVDF/IL-MWCNTs nanocomposite.

Results

Figure 30:
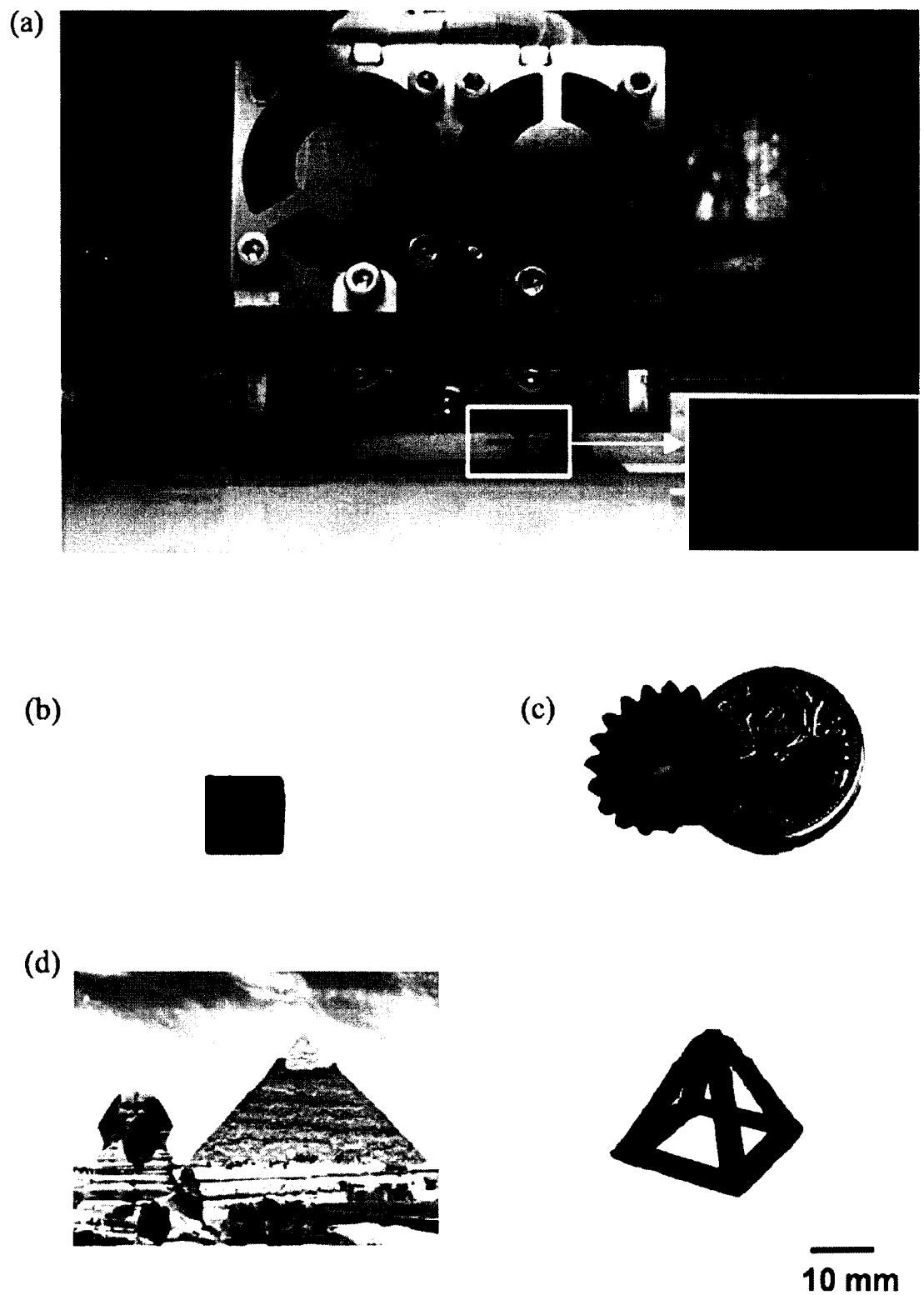
FIG. 30 shows optical images of (a) printing process of a film sample (inset: a film sample on the build platform after printing), (b) top view of a film, (c) a gear with a Canadian 25 cents coin, (d) left: the pyramid in Egypt (from google.ca) and right: an as-printed hollow replica of the pyramid.

FIG. 30b) to d) shows various 3D structures fabricated using FDM 3D printing technology with PVDF/IL-MWCNTs nanocomposites, including film, gear and hollow replica of the pyramid. The high flexibility of the technique enables the fabrication of customized structures, such as fully-filled (FIGS. 30b and c), and overhung structures (FIG. 30d).

FIG. 30a) shows the printing process of a film sample (designated as "film 1"). The filament is melt-extruded through the micro nozzle uniformly and continuously. Moreover, no significant warping phenomenon is observed with the use of glue and heated build platform (80° C.). The optimal printing parameters are shown in the following table. A film sample is shown on the build platform after printing (the inset of FIG. 30a). The fabrication time for the film, gear and hollow replica of the pyramid samples are around 1 minute, 2 minutes and 6 minutes, respectively. This result shows the efficiency of the FDM 3D printing technology. The side length of the film was 10 mm and the thickness was 0.5 mm (FIG. 30b). A gear consisting of 18 gear teeth was fabricated (FIG. 30c). The diameter of the gear was 20 mm and the thickness of the gear was 4 mm. There were four overhung structures in the hollow replica of the pyramid (FIG. 30e). The length of the bottom side was 20 mm and the height was 19.81 mm. All the parts of the replica were simultaneously printed and the printed structure requires no assembly. The overhang part was printed without any additional supporting structures, which is difficult to print even for non-composites materials. These structures show the potential of the FDM 3D printing technology to produce piezoelectric structures with conformal shape, high precision and high sensitivity.

TABLE 2

Printing parameters used for PVDF/IL-MWCNTs nanocomposites filament.

| | |
|---|---|
| Extrusion temperature | 230° C. |
| Bed temperature | 80° C. (glue needed) |
| Printing speed | 2600 mm/min |
| Infill percentage | 100% |
| Infill angle | (±) 45° |
| Number of shells | 2 |

Figure 31:
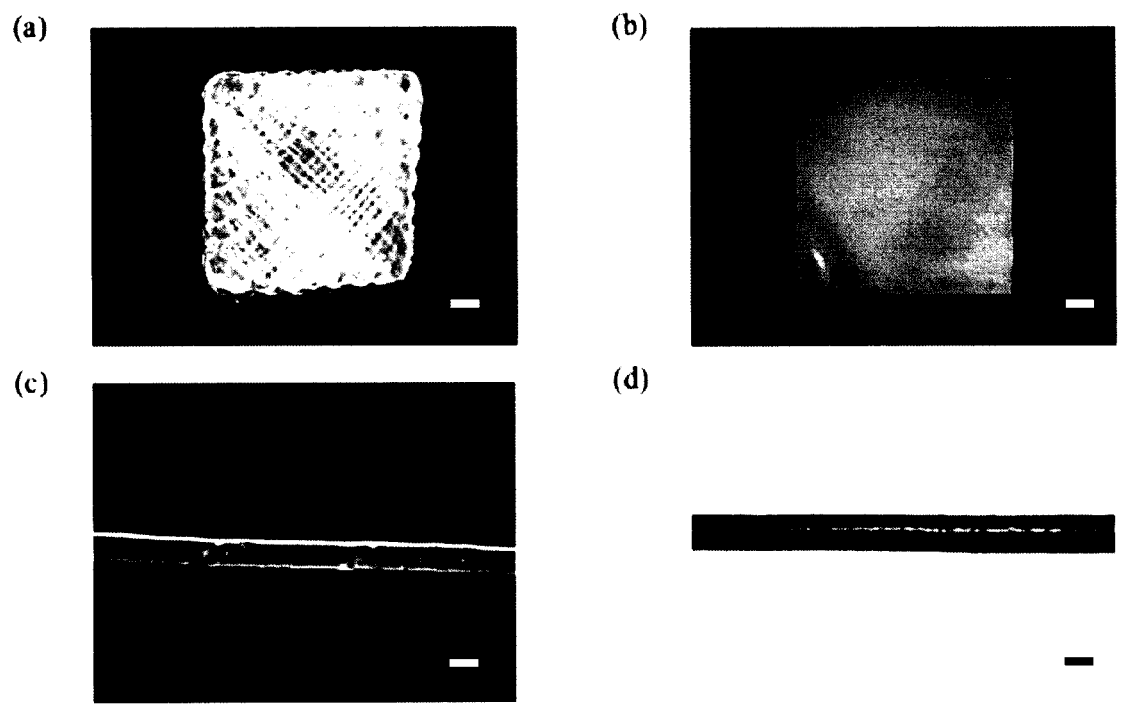
FIG. 31 shows microscopic images of (a) a FDM 3D printed film with commercially available PVDF filament, (b) a solvent-cast 3D printed film with PVDF/BaTiO$_3$ nanocomposites, (c) filament produced by Filabot extrusion machine with PVDF/BaTiO$_3$ nanocomposites, (d) filament produced by Filabot extrusion machine with PVDF/IL-MWCNTs nanocomposites. (Scale bars=1 mm).

Commercially available PVDF filament spool (without nanofillers, 3dogg) and PVDF ($M_w$ ~534,000, Sigma Aldrich)/BaTiO$_3$ (99.9% purity, 100 nm) nanocomposites (with different nanofillers) were used as comparative in this work. FIG. 31 shows four types of samples prepared for further characterization.

A film was fabricated with commercially available PVDF filament by a leapfrog FDM 3D printer (designated as "film 2") (FIG. 31a). The printing parameters were as follows: extrusion temperature=190° C.; bed temperature=80° C. (glue needed); Infill percentage: 100%; printing speed: 2600 mm/min; infill angle: (±)45°.

A solvent-cast 3D printed film with PVDF/BaTiO$_3$ nanocomposites were fabricated at room temperature (designated as "film 3") (FIG. 31b). 2 g PVDF and 0.2 g BaTiO$_3$ (10 wt %) were dissolved in a mixture solution of 4 mL acetone (BDH) and 6 mL dimethyl formamide (DMF, Sigma Aldrich) with a ratio of 40:60, which was mixed by ball-mill mixing method for 20 minutes. The obtained ink was poured into the syringe (3 mL) and put into a pneumatically operated dispensing system (HP-7X, EFD), which provided pressure for printing. This dispensing system was located on a robotic head (I&J2200-4, I&J Fisnar Inc.) and further controlled by a software (JR Points for Dispensing, Janome Sewing Machine). The film was printed with a metallic nozzle (inner diameter=100 μm) with a speed of 1200 mm/s under the pressure of 1 MPa. Both the side length of these two films were 10 mm.

The thickness of FDM 3D printed pure PVDF film is 0.5 mm, while the thickness of solvent-cast film is 0.1 mm.

For the filament, 2 g PVDF and 0.2 g BaTiO$_3$ (10 wt %) was dissolved in 8 mL DMF solvent by ball-mill mixing method for 20 minutes. Then the mixing process was repeated several times to obtain enough materials for further extrusion. The solution was then dried in a vacuum oven at 70° C. for 12 hours to remove all the DMF. These PVDF/BaTiO$_3$ nanocomposites pieces were cut into small pieces and fed into a Filabot extruder at 190° C. to fabricate into filament (designated as "filament 1") (FIG. 31c). The filament shown in FIG. 31d was fabricated by the method mentioned before (designated as "filament 2").

The phase characterization of these four types of samples was carried out using Fourier transform infra-red spectroscopy (FTIR) techniques. In this work, the fraction of β-phase ($F_β$) was calculated by the modified Beer-Lambert law, the equation is shown below:

$$F_\beta = \frac{A_\beta}{1.26 A_\alpha + A_\beta}$$

where, $A_α$ and $A_β$ are the absorptions fractions of α and β-phases at 763 cm$^{-1}$ and 840 cm$^{-1}$, respectively, and 1.26 is the ratio of absorption coefficients 7.7×104 and 6.1×104 cm2mol$^{-1}$ of β and α-phases, respectively.

The following table shows the fraction of β-phase in these four samples. The film 2 fabricated with commercially available pure PVDF filament has the lowest β-phase content. It needs further high electric field poling to align the dipole moment in PVDF. In conclusion, the PVDF filament spool which is available in the market cannot be made into piezoelectric structures directly so far. The filament 1 which is made with the same materials as film 3 shows low β-phase content as well. The reason for this phenomenon is that the connection between the BaTiO$_3$ nanoparticles and PVDF polymer chains is not ss at high temperature. Therefore, PVDF/BaTiO$_3$ nanocomposites can be only used in 3D printing technology at room temperature (e.g. solvent-cast 3D printing technology). Filament 2 shows the highest β-phase content (71.29%) amongst these four samples, which means that the IL-MWCNTs is an ideal nanofiller type in PVDF and the piezoelectric structures can be directly fabricated by FDM 3D printer at high temperature without the requirement of further physical treatment.

TABLE 3

The fraction of β-phase in these four samples.

| Type | Film 2 | Film 3 | Filament 1 | Filament 2 |
|---|---|---|---|---|
| F(β) % | 33.19 | 66.64 | 35.24 | 71.29 |

Figure 32:
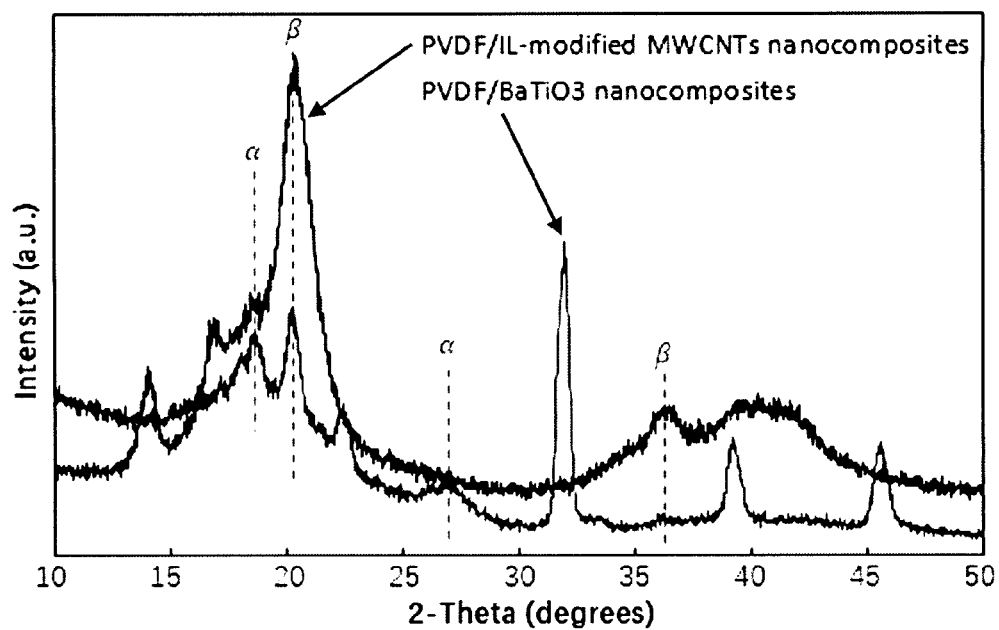
FIG. 32 shows (a) X-ray diffractograms and (b) FTIR spectra of PVDF/ IL-MWCNTs nanocomposites and PVDF/ BaTiO$_3$ nanocomposites. The characteristic peaks of the two phases of PVDF are labelled with their respective symbols 'α and β'.
Figure 32:
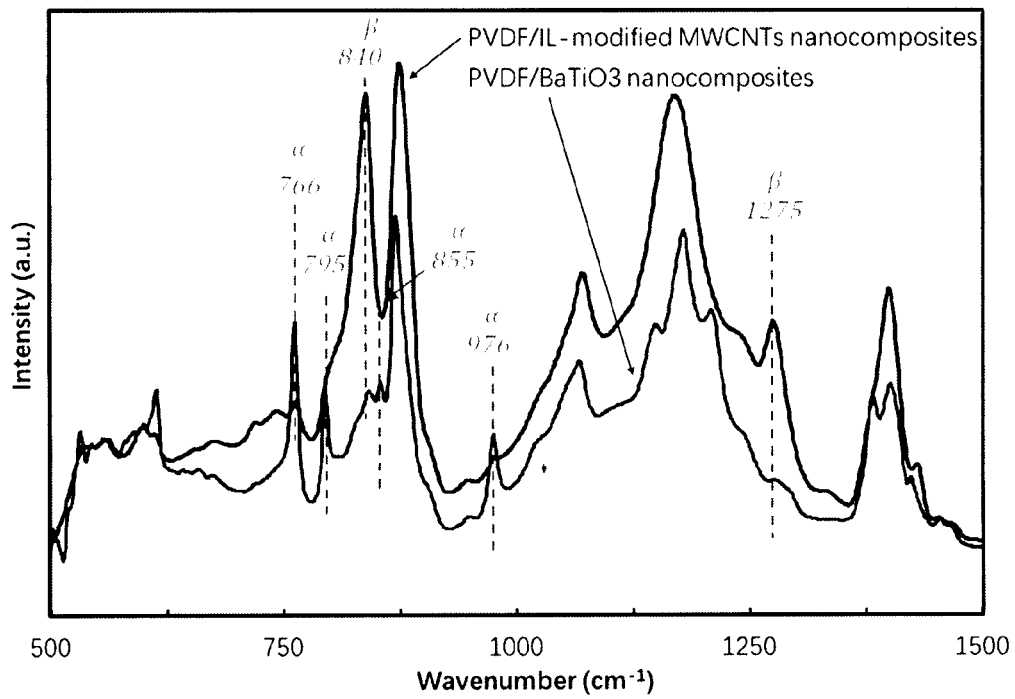

FIG. 32 shows a) the X-ray diffractograms and b) FTIR spectra of filament 1 and filament 2. Seen from FIG. 32a), the (0 2 0) and (1 2 0)/(0 2 1) crystal planes for the α-phase at 18.6° and 27.6°, respectively, are clearly visible in case of the filament fabricated with PVDF/BaTiO$_3$ nanocomposites. However, these two peaks of α-phases almost disappear for PVDF/IL-MWCNTs nanocomposites filament. In addition, PVDF/IL-MWCNTs nanocomposites filament shows obvious peaks of β-phase at 20.26° and 36.6° corresponding to the (1 1 0)/(2 0 0) and (0 2 0)/(1 0 1) planes. The XRD results show that BaTiO$_3$filler molecules cannot retain the β-chains at high temperature compared to IL-MWCNTs.

Combined with the FTIR results (FIG. 32b), the presence of spectral bands at 766, 795, 855, and 976 cm$^{-1}$ depicts that α-phases are predominant in PVDF/BaTiO$_3$ nanocomposites. There is a significant increase in the content of β-phase in the case of PVDF/IL-MWCNTs nanocomposites filament as signified by transmittance at 840 and 1275 cm$^{-1}$. Therefore, XRD and FTIR results are corresponding to each other. PVDF/BaTiO$_3$ nanocomposites filament are predominantly in α-phase, while the PVDF/IL-MWCNTs nanocomposites filament most in β-phase.

Figure 33:
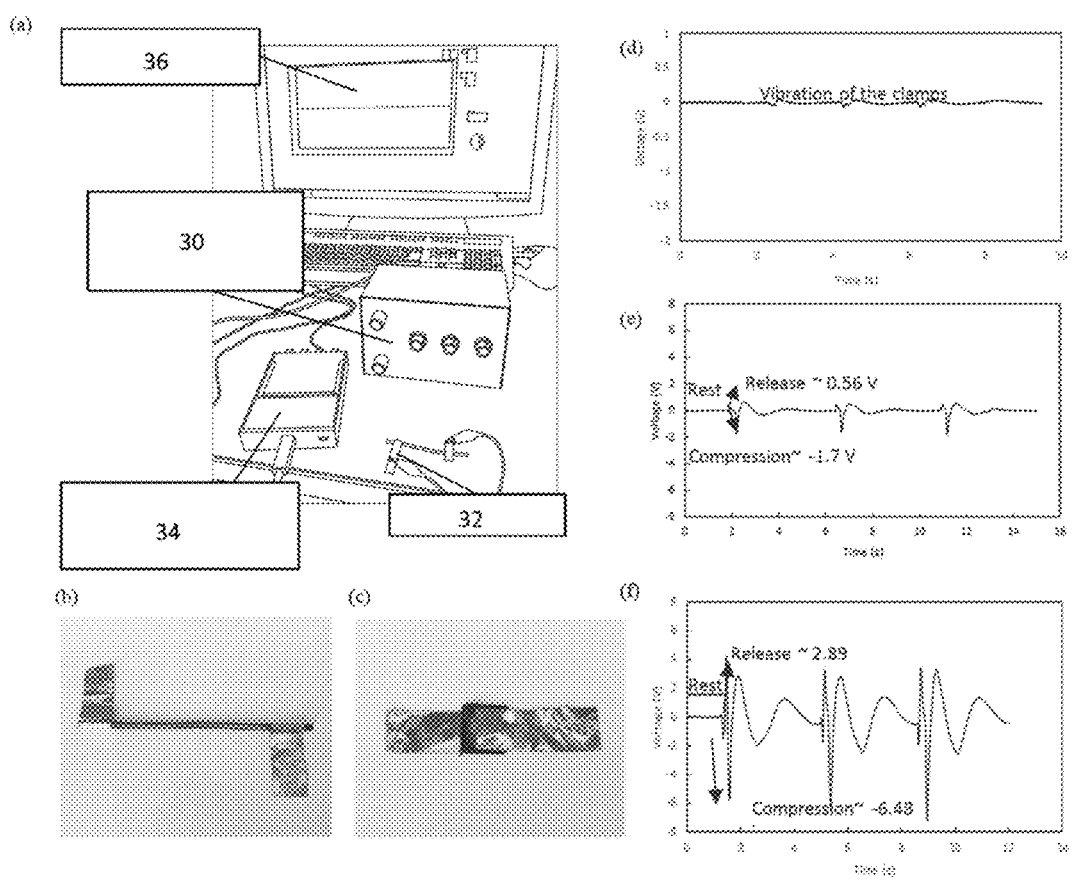
FIG. 33 shows (a) the setup of the piezoelectric test, (b) pictures of film sensor, (c) pictures of filament sensor, and sensor output voltages upon 3 consecutive finger taps: (d) PVDF/BaTiO$_3$ nanocomposites filament, (e) PVDF/IL-MWCNTs nanocomposites filament, and (f) PVDF/IL-MWCNTs nanocomposites film.

Samples for piezoelectric tests were prepared by painting commercially available conductive silver paste (Sigma Aldrich) as electrodes. The film 1 are painted over a square are of 5 mm side length. The filament 1 and filament 2 are painted on both sides of the filament. A conductive copper tape was used as connecter to link the sensor to the test clamp. The experimental setup of the piezoelectric test is shown in FIG. 33a). A charge amplifier (30) (Piezo lab amplifier, MEAS specialties) in charge mode was used to convert the piezoelectric charges obtained from piezoelectric structures (i.e., tested sample (32)) and acquired with a data acquisition system (NI-9239) attached to a USB carrier (34) (NI-9162, National Instruments) and recorded using a LabVIEW interface (36) on computer. FIGS. 33b) and c) show the filament 2 and film 1 samples prepared for tests. For the PVDF/BaTiO$_3$ nanocomposites filament, there was no obvious voltage output upon 3 consecutive finger taps. The small peaks are due to the vibration of the clamps during the finger tapping process. The filament sensor (FIG. 33e) generated a maximum voltage output of around −1.7 V on gentle finger tapping (0.56 V on releasing), while a FDM 3D printed film sensor (FIG. 33f) generated a maximum voltage output of around −6.48 V (2.89 V on releasing).

Mechanical Test

Figure 34:
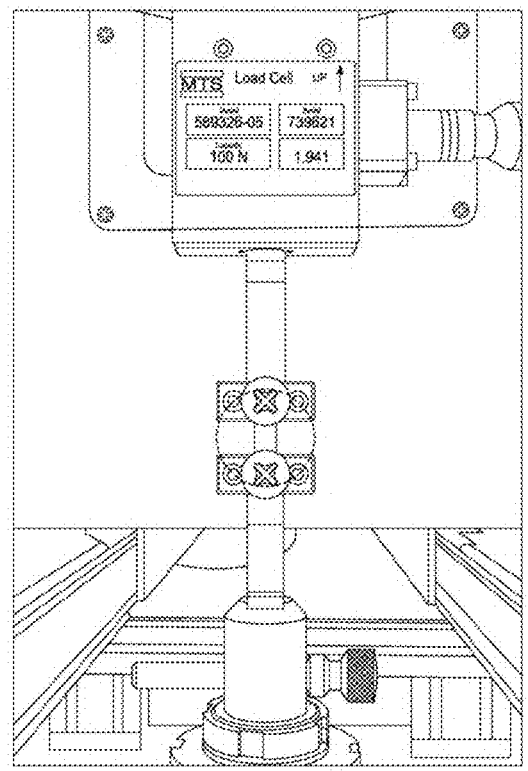
FIG. 34 shows (a) the insight machine with the film test specimen (in the circle) and (*b*) an averaged stress-strain curve of the film test specimen.
Figure 34:
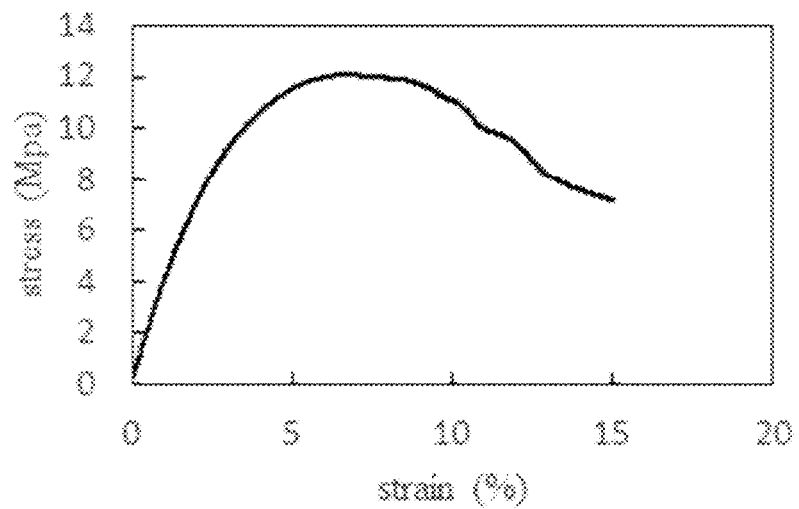

The displacement of the film sensor to be used in the dynamic piezoelectric test was obtained by the quasi-static tensile tests (Insight electromechanical testing machine) with a ramp force of 0.5 N min-1 under a 100 N load. Five film samples (25 mm×6 mm×0.3-0.5 mm) were 3D printed with PVDF/IL-MWCNTs filament using a leapfrog 3D printer. FIG. 34 shows the averaged stress-strain curve for the five PVDF/IL-MWCNTs nanocomposites films. The strength (12 MPa) and Young's modulus (507 MPa) were obtained. And 50 μm was chosen as the displacement in dynamic piezoelectric test.

Film sensors (same as the film specimen used in mechanical tests) were prepared by painting with the commercially available silver paste (Sigma Aldrich) on the center of both sides of the film. The thickness of the silver paste is ~15 μm. The copper tape (3M, Canada) was used to ensure the good connection between the silver paste electrodes and the wires, which were connected to the data acquisition system. A dynamic mechanical analyzer (DMA, Q800; TA instruments) was used to carry out the dynamic piezoelectric tests in both multi-frequency and multi-stress test mode.

Figure 35:
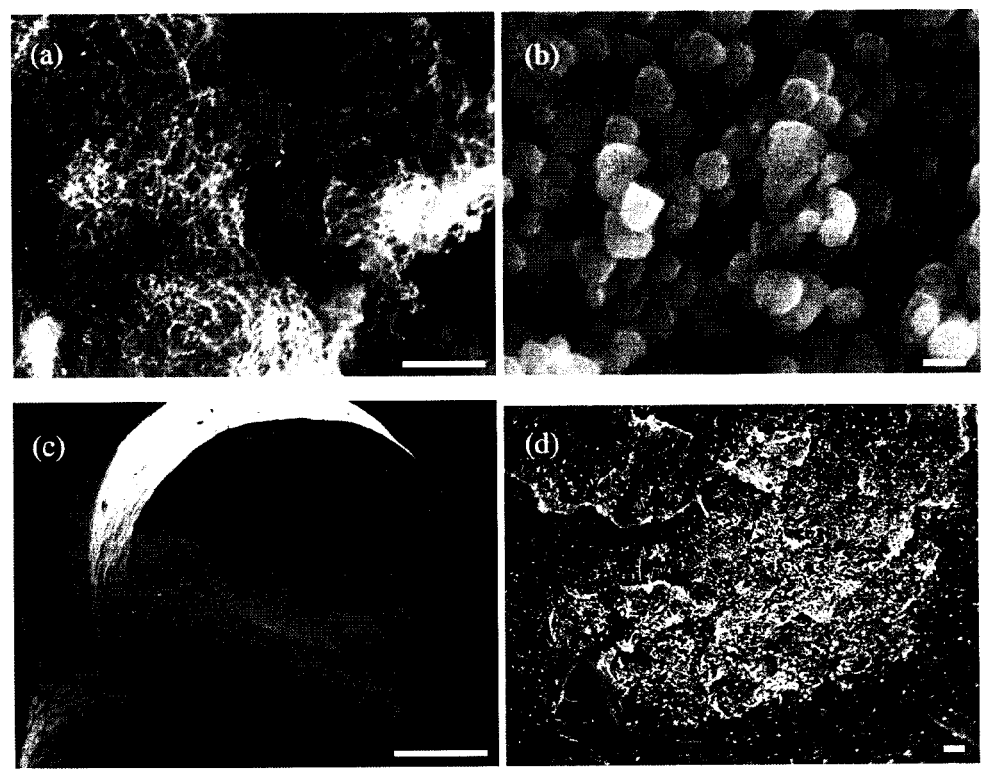
FIG. 35 shows SEM images of (a) IL-MWCNTs powder (Scale bar=500 nm), (b) BaTiO$_3$ nanoparticles (Scale bar=100 nm), (c) a cross-sectional view of the PVDF/IL-MWCNTs nanocomposites filament extruded by a filabot machine (scale bar=500 μm), and (d) a magnified cross-sectional view of the PVDF/IL-MWCNTs nanocomposites filament (scale bar=1 μm).

FIG. 35 show SEM images of (a) the IL-MWCNTs powder mechanically mixed by the agate mortar and (b) the BaTiO$_3$ nanoparticles. These two nanopowders were attached on a slide with a conductive carbon tape. The MWCNTs are twined together to form a network due to the mechanical grinding. The size of the BaTiO$_3$ nanoparticles are ~100 nm. The diameter of a PVDF/IL-MWCNTs nanocomposites filament fabricated by a filabot machine shown in FIG. 3(c) is ~1.75 mm. The cross-section of the filament was obtained by fracturing it in liquid nitrogen. The magnified SEM image of the above mentioned cross section is shown in FIG. 3(d). The IL-MWCNTs is well-dispersed in the PVDF matrix, which ensured good mechanical and piezoelectric properties in the nanocomposites filament.

The scope of the claims should not be limited by the preferred embodiments set forth in the examples, but should be given the broadest interpretation consistent with the description as a whole.

REFERENCES

The present description refers to a number of documents, the content of which is herein incorporated by reference in their entirety. These documents include, but are not limited to, the following:

Andrew, et al. Enhanced Ferroelectric Phase Content of Polyvinylidene Difluoride Fibers with the Addition of Magnetic Nanoparticles. *Langmuir,* 2008, 24(16), 8435-8438.

Benz, M. et al. The Role of Solution Phase Water on the Deposition of Thin Films of Poly(vinylidene fluoride). *Macromolecules,* 2002, 35(7), 2682-2688.

Bodkhe, S., F. P. Gosselin, and D. Therriault. Three-dimensional printing of polyvinylidene fluoride nanocomposites. in 20$^{th}$ International Conference on Composite Materials. 2015. Copenhagen, Denmark: International committee on composite materials.

Correia, D. M., et al., Strategies for the development of three dimensional scaffolds from piezoelectric poly (vinylidene fluoride). Materials & Design, 2016. 92: p. 674-681.

Dillon, D. R., et al., On the structure and morphology of polyvinylidene fluoride-nanoclay nanocomposites. Polymer, 2006. 47(5): p. 1678-1688.

Dudek, P. et al. FDM 3D Printing Technology in Manufacturing Composite Elements. Archives of Metallurgy and Materials, 2013, 58(4), 1415-1418.

Ferreira A. et al. Extrusion of Poly(vinylidene fluoride) Filaments: Effect of the Processing Conditions and Conductive Inner Core on the Electroactive Phase Content and Mechanical Properties. *J Polym Res,* 2011, 18, 1653-1658.

Frenot, A. and I. S. Chronakis, Polymer nanofibers assembled by electrospinning. Current Opinion in Colloid & Interface Science, 2003. 8(1): p. 64-75.

Guo, S.-z., et al., 3D printing of a multifunctional nanocomposite helical liquid sensor. Nanoscale, 2015. 7(15): p. 6451-6456.

Guo, S. Z., et al., Solvent-cast three-dimensional printing of multifunctional microsystems. Small, 2013. 9(24): p. 4118-22.

Guo, S.-Z., M.-C. Heuzey, and D. Therriault, Properties of Polylactide Inks for Solvent-Cast Printing of Three-Dimensional Freeform Microstructures. Langmuir, 2014. 30(4): p. 1142-1150.

Hartono, A. et al. Electric Field Poling 2 GV/m to Improve Piezoelectricity of PVDF Thin Film. *The 4th International Conference on Theoretical and Applied Physics (ICTAP),* 2014, 1719, 030021-1-030021-4.

Huang, F., et al., Effect of temperature on structure, morphology and crystallinity of PVDF nanofibers via electrospinning, in e-Polymers. 2008. p. 1758.

Huang, W. W. et al. Nanocomposites of Poly(vinylidene fluoride) with Multiwalled Carbon Nanotubes. *Journal of Applied Polymer Science,* 2010, 115, 3238-3248.

Huang, X. Y. et al. Influence of Aspect Ratio of Carbon Nanotubes on Crystalline Phases and Dielectric Properties of Poly(vinylidene fluoride). *European Polymer Journal,* 2009, 45, 377-386.

Hutmacher, D. W. et al. Mechanical Properties and Cell Cultural Response of Polycaprolactone Scaffolds Designed and Fabricated via Fused Deposition Modeling. *J Biomed Mater Res.,* 2001, 55(2), 203-16.

Issa, A. A. et al. Investigation of the Physico-mechanical Properties of Electrospun PVDF/Cellulose (Nano)fibers. *J. APPL. POLYM. SCI.,* 2016, 43594.

Janiczek, T., Analysis of PVDF transducer signals stimulated by mechanical tension. Journal of Electrostatics, 2001. 51-52: p. 167-172.

Jing, X. et al. Magnetic and Dielectric Properties of Barium Ferrite Fibers/Poly(Vinylidene Fluoride) Composite Films. *J. Polym. Res.,* 2011, 18(6), 2017-2021.

Johansson, F. Optimizing Fused Filament Fabrication 3D printing for Durability. 2016.

Jr, R. G. Determination of the α, β, and γ Crystalline Phases of Poly(vinylidene fluoride) Films Prepared at Different Conditions. *Journal of Applied Polymer Science,* 2006, 100(4), 3272-3279.

Kang, S. J. et al. *Spin Cast Ferroelectric Beta Poly (vinylidene fluoride) Thin Films via Rapid Thermal Annealing.* Applied Physics Letters, 2008, 92(1), 012921(1-3).

Kannan, S. et al. Development of Composite Materials by Rapid Prototyping Technology using FDM Method. *International Conference on Current Trends in Engineering and Technology, ICCTET'13,* 2013, 281-283.

Koga, K. et al. Piezoelectricity and Related Properties of Vinylidene Fluoride and Trifluoroethylene Copolymers. *Journal of Applied Physics,* 1998, 59(6), 2142-2150.

Lee, C. et al. Electric field poling-assisted Additive Manufacturing Process for PVDF Polymerbased Piezoelectric Device Applications. *Smart Materials and Structures,* 2014, 23, 1-7.

Liu, Z. H., et al., A flexible sensing device based on a PVDF/MWCNT composite nanofiber array with an interdigital electrode. Sensors and Actuators A: Physical, 2014. 211: p. 78-88.

Lund, A., et al., Piezoelectric polymeric bicomponent fibers produced by melt spinning. Journal of Applied Polymer Science, 2012. 126(2): p. 490-500.

Luo, G., et al., Direct-Write, Self-Aligned Electrospinning on Paper for Controllable Fabrication of Three-Dimensional Structures. ACS Applied Materials & Interfaces, 2015. 7(50): p. 27765-27770.

Ma, C. C. et al. Polyvinylidene Fluoride Film Sensors in Collocated Feedback Structural Control: Application for Suppressing Impact-Induced Disturbances. *IEEE TransacTIons on UlTrasonIcs, FErroElEcTrIcs, anD FrEqUEncy control,* 2011, 58(12), 2539-2554.

Magalhães, R., et al., The Role of Solvent Evaporation in the Microstructure of Electroactive β-Poly(Vinylidene Fluoride) Membranes Obtained by Isothermal Crystallization. Soft Materials, 2010. 9(1): p. 1-14.

Martins, P. et al. Electroactive Phases of Poly(Vinylidene Fluoride): Determination, Processing and Applications. *Prog. Polym. Sci.,* 2014, 39(4), 683-706.

Martins, P., A. C. Lopes, and S. Lanceros-Mendez, Electroactive phases of poly(vinylidene fluoride): Determination, processing and applications. Progress in Polymer Science, (0).

Martins, R. S., et al., Piezoelectric coaxial filaments produced by coextrusion of poly(vinylidene fluoride) and electrically conductive inner and outer layers. Journal of Applied Polymer Science, 2014. 131(17): p. n/a-n/a.

Mohammadi B. et al. Effect of Tensile Strain Rate and Elongation on Crystalline Structure and Piezoelectric Properties of PVDF Thin Films. *Polymer Testing,* 2007, 26, 42-50.

Nilsson, E. et al. Poling and Characterization of Piezoelectric Polymer Fibers for Use in Textile Sensors. *Sens. Actuators A,* 2013, 201, 477-486.

Nishiyama, T. et al. Crystalline Structure Control of Poly(vinylidene fluoride) Films with the Anti solvent Addition Method. *Polymer Journal,* 2016, 48, 1035-1038.

Niu, Y., et al., Enhanced dielectric performance of $BaTiO_3$/PVDF composites prepared by modified process for energy storage applications. Ultrasonics, Ferroelectrics, and Frequency Control, IEEE Transactions on, 2015. 62(1): p. 108-115.

Nunes-Pereira, J., et al., Energy harvesting performance of $BaTiO_3$/poly(vinylidene fluoride-trifluoroethylene) spin coated nanocomposites. Composites Part B: Engineering, 2015. 72: p. 130-136.

Omar, A. M. et al. Optimization of Fused Deposition Modeling Process Parameters: A Review of Current Research and Future Prospects. *Adv. Manuf.,* 2015, 3, 42-53.

Omar, A., Processing, morphology and product parameters of PVDF filaments for biomedical applications in Fakultät für Maschinenwesen. 2008, Rheinisch-Westfälische Technische Hochschule Aachen. p. 59.

Park, J. W. et al. Crystalline Structure of Poly(Vinylidene Fluoride) Film PVDF/Poly (Methacrylate) Blend, and PVDF/PMMA/Silica Hybrid Composite Prepared at Room Temperature by Solid-State F MAS NMR Analysis. *New Research on Solid State Chemistry,* 2007, 183-203.

Passieux, R., et al., Instability-Assisted Direct Writing of Microstructured Fibers Featuring Sacrificial Bonds. Advanced Materials, 2015. 27(24): p. s3676-3680.

Peng, Q. Y. et al. The Preparation of PVDF/clay Nanocomposites and the Investigation of Their Tribological Properties. *Wear,* 2009, 266, 713-720.

Pu, J., et al., Piezoelectric actuation of direct-write electrospun fibers. Sensors and Actuators A: Physical, 2010. 164(1-2): p.131-136.

Rajesh, P. S. M. et al. Enhancing Beta-Phase in PVDF through Physicochemical Modification of Cellulose. *Electron. Mater. Lett.,* 2014, 10(1), 315-319.

Sajkiewicz, P. et al. Phase Transitions During Stretching of Poly(Vinylidene Fluoride). *Eur. Polym. J.,* 1999, 35(3), 423-429.

Salimi A. et al. Analysis method: FTIR Studies of β-phase Crystal Formation in Stretched PVDF Films. *Polymer Testing,* 2003, 22(6), 699-704.

Sencadas, V. et al. A to B Phase Transformation and Microstructural Changes of Pvdf Films Induced by Uniaxial Stretch. *Journal of Macromolecular Science, Part B,* 2009, 48(3), 514-525.

Seok Ju, K. et al. Spin Cast Ferroelectric Beta Poly (vinylidene fluoride) Thin Films via Rapid Thermal Annealing. *Applied Physics Letters,* 2008, 92(1), 012921-012921-3.

Seoul, C. et al. Electrospinning of Poly(vinylidene fluoride)/dimethylformamide Solutions with Carbon Nanotubes. *Journal of Polymer Science Part B: Polymer Physics,* 2003, 41(13), 1572-1577.

Serra, T. et al. High-Resolution PLA-Based Composite Scaffolds via 3-D Printing Technology. *Acta Biomaterialia,* 2013, 8, 5521-5530.

Soames, R. W., Foot pressure patterns during gait. Medical Engineering and Physics. 7(2): p. 120-126.

Suaste-Gómez, E. et al. Developing an Ear Prosthesis Fabricated in Polyvinylidene Fluoride by a 3D Printer with Sensory Intrinsic Properties of Pressure and Temperature. *Sensors,* 2016, 16(3), 1-11.

Ting, Y. et al. A New Approach of Polyvinylidene Fluoride (PVDF) Poling Method for Higher Electric Response. *Ferroelectrics,* 2013, 446, 28-38.

Tymrak, B. M. et al. Mechanical Properties of Components Fabricated with Open-source 3-D Printers under Realistic Environmental Conditions. *Materials and Design,* 2014, 58, 242-246.

Xing, C. Y. et al. Impact of Ionic Liquid-Modified Multiwalled Carbon Nanotubes on the Crystallization Behavior of Poly(vinylidene fluoride). *The Journal of Physical Chemistry B,* 2012, 116, 8312-8320.

Yu, W., et al., Structural characteristics of poly(vinylidene fluoride)/clay nanocomposites. Materials Letters, 2008. 62(4-5): p.747-750.

Zein, I. et al. Fused Deposition Modeling of Novel Scaffold Architectures for Tissue Engineering Applications. *Biomaterials,* 2002, 23, 1169-1185.

Zeina, I. et al. Fused Deposition Modeling of Novel Scaffold Architectures for Tissue Engineering Applications. *Biomaterials,* 2002, 23, 1169-1185.

Zhang, Y. Y. et al. Phase Transformation Mechanisms and Piezoelectric Properties of Poly(Vinylidene Fluoride)/Montmorillonite Composite. *J. Appl. Polym. Sci.,* 2012, 123(5), 2595-2600.

The invention claimed is:

1. A method of manufacture of a piezoelectric solvent-cast 3D printed material comprising a piezoelectric composite shaped into a 3D shape,
   wherein the piezoelectric composite comprises a piezoelectric polymer and particles of a filler dispersed in the polymer, wherein the filler is in micro or nanoparticle form, and wherein the filler is present in a filler:polymer weight ratio between about 1:99 and about 95:5,
   the method comprising:
   i. manufacturing the piezoelectric composite by:
      a) providing the piezoelectric polymer and particles of the filler,
      b) sonicating said filler and polymer together in the presence of a solvent, followed by mixing by ball milling, thereby forming a suspension of the filler particles in a solution of the polymer, and
      c) drying the suspension until the solvent is removed,
   ii. manufacturing a piezoelectric ink for 3D printing, wherein the ink comprises a volatile solvent, particles of a filler, and the piezoelectric composite mixed with the volatile solvent, such that the polymer is dissolved in the solvent thus forming a polymer solution and the particles of a filler are dispersed in the polymer solution, and wherein the piezoelectric ink comprises between about 0.1 and about 0.4 g of the piezoelectric composite per mL of piezoelectric ink, by:
      d) providing the volatile solvent and the particles of the filler, and
      e) sonicating the piezoelectric composite with the volatile solvent to form a suspension of the filler in a solution of the polymer, and
   iii. manufacturing said 3D printed material by:
      f) feeding the piezoelectric ink to a nozzle of a 3D printer,
      g) extruding the ink through the nozzle into a pattern; and
      h) allowing evaporation of the solvent, thereby providing the piezoelectric 3D printed material,
   wherein at step g), a conductive ink is extruded through a same or different nozzle of the 3D printer to form a bifunctional material comprising the piezoelectric composite with one or more conductive electrodes adjacent to the piezoelectric composite, and
   wherein the conductive ink and the piezoelectric ink have similar viscosities and are extruded simultaneously from a same nozzle of the 3D printer and the feeding step f) comprises
      feeding one side of the nozzle with one of the inks and the other side with the other ink, or
      feeding opposing sides of the nozzle with the conductive ink and the middle of the nozzle with the piezoelectric ink.

2. The method of claim 1, wherein the filler:polymer weight ratio is between about 5:95 and about 15:85.

3. The method of claim 1, wherein the filler is barium titanate ($BaTiO_3$), carbon nanotubes (single-walled, double-walled, multi-walled), carbon nanotubes modified with ionic liquid, boron nitride nanotubes, cellulose, clay (intercalated, exfoliated), $CoFe_2O_4$, graphene, graphene oxide, $CuCl_2$, iron oxide, ferrite, lead zirconium titanate, magnetic ferrite, $MnCl_2$, $NiFe_2O_4$, polyethyleneimine, $PbMg_{1/3}Nb_{2/3}O_3$ (PMN)—$PbTiO_3$(PT), quantum dots, silver, $TiO_2$, vanadium pentoxide, zinc oxide, or combinations thereof.

4. The method of claim 3, wherein the filler is $BaTiO_3$ nanoparticles or multi-walled carbon nanotubes modified with 1-butyl-3-methylimidazolium hexafluorophosphate.

5. The method of claim 1, wherein the polymer is polyvinylidene fluoride (PVDF), polylactide (PLA), acrylonitrile butadiene styrene (ABS), epoxy, PDMS (polydimethylsiloxane), diacrylate photocurable resin, polyethylene glycol diacrylate, PMMA (polymethyl methacrylate), PVDF-HFP (poly(vinylidene fluoride-co-hexafluoropropylene)), P(VDF-TrFE-CFE) (vinylidene fluoride-trifluoroethylene-chlorofluoroethylene terpolymer), or P(VDF-TrFE) (poly [(vinylidenefluoride-co-trifluoroethylene]).

6. The method of claim 5, wherein the polymer is polyvinylidene fluoride (PVDF).

7. The method of claim 1, wherein the piezoelectric composite further comprises one or more additives, wherein the additives are:
   pigments,
   short carbon fibers, fiberglass, and/or boron nitride, and/or carbon black spheres, graphene, silver nanotubes, copper, and/or nickel nanotubes.

8. The method of claim 1, wherein the solvent in the piezoelectric ink is DMF (dimethyl formamide), DMSO (dimethyl sulfoxide), NMP (N-methyl-2-pyrrolidone), DMAc (dimethyl acetamide), acetone, butanone, tetrahydrofuran, cyclohexanone, methyl ethyl ketone, or mixtures thereof.

9. The method of claim 8, wherein the volume % of DMF is between about 30 and about 50, the volume % of acetone is between about 50 and about 70, and the volume % of DMSO is between about 2 and about 8.

10. The method of claim 1, wherein the mixing in step b) is performed in a high energy shaker ball-mill at a rate of 1080 cycles per minute.

11. The method of claim 1, wherein the 3D printing is not assisted by electric field poling.

12. The method of claim 1, wherein the ratio of piezoelectric composite to conductive electrode by weight is between about 80:20 and about 99:1.

13. The method of claim 1, wherein the conductive ink comprises:
   a volatile solvent, and
   a conductive composite comprising a polymer or a binder, and particles of a conductive material dispersed in the polymer or binder,
      wherein the conductive material is mixed with the solvent such that the particles of the conductive material are dispersed in a solution of the polymer/binder,
      wherein the conductive material is present in a conductive material:polymer/binder weight ratio between about 1:99 and about 95:5.

14. The method of claim 13, wherein the conductive composite is a carbon nanotube based composite; a graphene based composite; a carbon fiber based composite; a silver based composite; a silver nanoparticle based composite; a PEDOT:PSS(poly (3,4-ethylenedioxythiophene) and poly (styrene sulfonate)) based composite; a copper/copper oxide nanoparticle based composite; a gold based composite, a polyaniline based composite; a conductive hydrogel, or an ITO dispersion.

15. The method of claim 13, wherein the total concentration of polymer/binder and conductive material in the conductive ink is between about 0.05 and about 0.5 g/mL.

16. The method of claim 13, wherein the solvent of the conductive ink is a mixture of DMF, acetone, and DMSO, wherein the volume % of DMF is between about 30 and about 50, the volume % of acetone is between about 50 and about 70, and the volume % of DMSO is between about 2 and about 8.

17. A method of manufacture of a piezoelectric solvent-cast 3D printed material comprising a piezoelectric composite shaped into a 3D shape,
   wherein the piezoelectric composite comprises a piezoelectric polymer and particles of a filler dispersed in the polymer, wherein the filler is in micro or nanoparticle form, and wherein the filler is present in a filler:polymer weight ratio between about 1:99 and about 95.5,
   the method comprising:
   i. manufacturing the piezoelectric composite by:
      i) providing the piezoelectric polymer and particles of the filler,
      j) sonicating said filler and polymer together in the presence of a solvent, followed by mixing by ball milling, thereby forming a suspension of the filler particles in a solution of the polymer, and
      k) drying the suspension until the solvent is removed,
   ii. manufacturing a piezoelectric ink for 3D printing, wherein the ink comprises a volatile solvent, particles of a filler, and the piezoelectric composite mixed with the volatile solvent, such that the polymer is dissolved in the solvent thus forming a polymer solution and the particles of a filler are dispersed in the polymer solution, and wherein the piezoelectric ink comprises between about 0.1 and about 0.4 g of the piezoelectric composite per mL of piezoelectric ink, by:
      l) providing the volatile solvent and the particles of the filler, and
      m) sonicating the piezoelectric composite with the volatile solvent to form a suspension of the filler in a solution of the polymer, and
   iii. manufacturing said 3D printed material by:
      n) feeding the piezoelectric ink to a nozzle of a 3D printer,
      o) extruding the ink through the nozzle into a pattern; and
      p) allowing evaporation of the solvent, thereby providing the piezoelectric 3D printed material,
   wherein at step g), a conductive ink is extruded through a same or different nozzle of the 3D printer to form a bifunctional material comprising the piezoelectric composite with one or more conductive electrodes adjacent to the piezoelectric composite, and
   wherein the bifunctional material is in the form of a wire and wherein the piezoelectric composite and the electrode(s) are in the form of elongated thin cylinders that extend along the wire length, and each occupy part of the cross-section of the wire.

18. The method of claim 17, wherein the filler:polymer weight ratio is between about 5:95 and about 15:85.

19. The method of claim 17, wherein the 3D printing is not assisted by electric field poling.

20. The method of claim 17, wherein the conductive ink comprises: a volatile solvent, and a conductive composite comprising a polymer or a binder, and particles of a conductive material dispersed in the polymer or binder, wherein the conductive material is mixed with the solvent such that the particles of the conductive material are dispersed in a solution of the polymer/binder, wherein the conductive material is present in a conductive material:polymer/binder weight ratio between about 1:99 and about 95:5.

* * * * *